(12) United States Patent
Motoyama

(10) Patent No.: US 7,583,207 B2
(45) Date of Patent: Sep. 1, 2009

(54) LOGIC CIRCUIT

(75) Inventor: Masahiko Motoyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/872,387

(22) Filed: Oct. 15, 2007

(65) Prior Publication Data

US 2008/0094260 A1 Apr. 24, 2008

(51) Int. Cl.
*H03M 7/00* (2006.01)
(52) U.S. Cl. .......................................... 341/50; 341/51
(58) Field of Classification Search .................. 341/50, 341/51
See application file for complete search history.

(56) References Cited

U.S. PATENT DOCUMENTS

| | | | |
|---|---|---|---|
| 6,066,965 A | 5/2000 | Blomgren et al. | |
| 6,288,447 B1 | 9/2001 | Amishiro et al. | |
| 6,510,518 B1 | 1/2003 | Jaffe et al. | |
| 6,654,884 B2 | 11/2003 | Jaffe et al. | |
| 7,071,725 B2 | 7/2006 | Fujisaki | |
| 2007/0055868 A1 | 3/2007 | Brier et al. | |
| 2008/0212776 A1 | 9/2008 | Motoyama | |

FOREIGN PATENT DOCUMENTS

JP 2000-216264 8/2000

OTHER PUBLICATIONS

S. Moore et al., "Improving smart card security using self-timed circuits," Eighth International Symposium on Asynchronous Circuits and Systems, Apr. 8-11, 2002, pp. 211-218.

*Primary Examiner*—Jean B Jeanglaude
(74) *Attorney, Agent, or Firm*—Foley & Lardner LLP

(57) ABSTRACT

A logic circuit that executes a prescribed arithmetic processing includes a decoder that converts one or more binary input data into a first plurality of bit data of a constant hamming weight regardless of a hamming weight of the input data, an interconnect network that is connected to the decoder, changes a bit pattern of the first plurality of bit data and generates a second plurality of bit data, according to receiving the first plurality of bit data converted according to the decoder, and substituting a bit position of the received first plurality of bit data for the purpose of the prescribed arithmetic operation, and an encoder connected to the interconnect network and converts the second plurality of bit data generated in the interconnect network into one or more binary output data.

20 Claims, 31 Drawing Sheets

FIG.3

| INPUT(B2 TO B0) | DECODER OUTPUT(D7 TO D0) | INTERCONNECT NETWORK OUTPUT(N7 TO N0) | ENCODER OUTPUT (Z2 TO Z0) |
|---|---|---|---|
| 000 | 00000001 | 10000000 | 111 |
| 001 | 00000010 | 01000000 | 110 |
| 010 | 00000100 | 00100000 | 101 |
| 011 | 00001000 | 00010000 | 100 |
| 100 | 00010000 | 00001000 | 011 |
| 101 | 00100000 | 00000100 | 010 |
| 110 | 01000000 | 00000010 | 001 |
| 111 | 10000000 | 00000001 | 000 |

FIG.6

| INPUT B | OUTPUT |
|---|---|
| 0 | 0 |
| 1 | 1 |
| 2 | 2 |
| 3 | 3 |

FIG.7

| INPUT B | OUTPUT |
|---|---|
| 0 | 1 |
| 1 | 0 |
| 2 | 3 |
| 3 | 2 |

FIG.8

| INPUT B | OUTPUT |
|---|---|
| 0 | 2 |
| 1 | 3 |
| 2 | 0 |
| 3 | 1 |

FIG.9

| INPUT B | OUTPUT |
|---|---|
| 0 | 3 |
| 1 | 2 |
| 2 | 1 |
| 3 | 0 |

FIG.11

| INPUT A | INPUT B | OUTPUT |
|---------|---------|--------|
| 00(0)   | 00(0)   | 00(0)  |
| 00(0)   | 01(1)   | 01(1)  |
| 00(0)   | 10(2)   | 10(2)  |
| 00(0)   | 11(3)   | 11(3)  |
| 01(1)   | 00(0)   | 01(1)  |
| 01(1)   | 01(1)   | 10(2)  |
| 01(1)   | 10(2)   | 11(3)  |
| 01(1)   | 11(3)   | 00(0)  |
| 10(2)   | 00(0)   | 10(2)  |
| 10(2)   | 01(1)   | 11(3)  |
| 10(2)   | 10(2)   | 00(0)  |
| 10(2)   | 11(3)   | 01(1)  |
| 11(3)   | 00(0)   | 11(3)  |
| 11(3)   | 01(1)   | 00(0)  |
| 11(3)   | 10(2)   | 01(1)  |
| 11(3)   | 11(3)   | 10(2)  |

FIG.18

| INPUT | 1 BIT SHIFT | 2 BIT SHIFT |
|---|---|---|
| 0000(0) | 0000(0) | 0000(0) |
| 0001(1) | 1000(8) | 0100(4) |
| 0010(2) | 0001(1) | 1000(8) |
| 0011(3) | 1001(9) | 1100(12) |
| 0100(4) | 0010(2) | 0001(1) |
| 0101(5) | 1010(10) | 0101(5) |
| 0110(6) | 0011(3) | 1001(9) |
| 0111(7) | 1011(11) | 1101(13) |
| 1000(8) | 0100(4) | 0010(2) |
| 1001(9) | 1100(12) | 0110(6) |
| 1010(10) | 0101(5) | 1010(10) |
| 1011(11) | 1101(13) | 1110(14) |
| 1100(12) | 0110(6) | 0011(3) |
| 1101(13) | 1110(14) | 0111(7) |
| 1110(14) | 0111(7) | 1011(11) |
| 1111(15) | 1111(15) | 1111(15) |

FIG.24

| INPUT | OUTPUT |
|---|---|
| 000 | 00 |
| 001 | 00 |
| 010 | 01 |
| 011 | 01 |
| 100 | 10 |
| 101 | 10 |
| 110 | 11 |
| 111 | 11 |

FIG.29

| A | 0→0 | 0→1 | 1→0 | 1→1 |
|---|---|---|---|---|
| 00(0) | 00(0) | 10(2) | | |
| 01(1) | 01(1) | 11(3) | | |
| 10(2) | | | 00(0) | 10(2) |
| 11(3) | | | 01(1) | 11(3) |

LOGIC CIRCUIT

CROSS-REFERENCE TO RELATED APPLICATION

This application is a based upon and claims the benefit of priority from the prior Japanese Patent Application No. 2006-281826 filed on Oct. 16, 2006; the entire contents of which are incorporated herein by reference.

BACKGROUND OF THE INVENTION

1. Field of the Invention

The present invention relates to logic circuits, and particularly to logic circuits able to suppress fluctuation of electrical power consumption.

2. Description of the Related Art

Due to recent advancements in LSI technology, a great quantity and variety of semiconductor devices have come to be widely used not only for application in information systems, but also in industrial equipment, and consumer home-electronics.

Also, due to the shift to high-performance semiconductors, the electrical power consumption thereof is growing. The increase in electrical power consumption leads not only to problems of heat generation in semiconductor devices, but also to a decrease in the continuous operation time of batteries for battery-operated products, which makes lengthy continuous use of these semiconductor device-employing products impossible.

A great quantity of logic circuits for realizing various functions are contained within semiconductor devices. There are various kinds of logic circuits such as general AND circuits, exclusive OR circuits, adders, and the like.

However, since in recent years the basic unit of data processing has grown to large bit counts including 32 bit and 64 bit, there are cases in which the electrical power consumption fluctuates greatly in response to changes in simultaneously processed data. In Japanese Patent Laid-Open No. 2000-216264 for instance, there is a proposal relating to technology of low electrical power consumption in semiconductor circuits.

For this reason, there has been a problem of it being necessary to perform power circuit design in consideration of a maximum value and a minimum value that occur in electrical power consumption fluctuation that corresponds to the above mentioned changes in data.

SUMMARY OF THE INVENTION

According to an embodiment of the present invention, it is possible to provide a logic circuit that executes a prescribed arithmetic operation and comprises: a decoder that converts one or more binary input data into a first plurality of bit data of a constant hamming weight regardless of a hamming weight of the input data; an interconnect network that is connected to the decoder, changes a bit pattern of the first plurality of bit data and generates a second plurality of bit data, by receiving the first plurality of bit data converted by the decoder, and substituting a bit position of received the first plurality of bit data for the purpose of the prescribed arithmetic operation; and an encoder connected to the interconnect network and converts the second plurality of bit data generated in the interconnect network into one or more binary output data.

BRIEF DESCRIPTION OF THE DRAWINGS

FIG. 3 is a table showing the output of each portion of the logic circuit that is the bit inverter circuit of FIG. 2;

FIG. 6 is a table for explaining the relationship between the input data, and the output data of the encoder;

FIG. 7 is a table for explaining the relationship between the input data, and the output data of the encoder;

FIG. 8 is a table for explaining the relationship between the input data, and the output data of the encoder;

FIG. 9 is a table for explaining the relationship between the input data, and the output data of the encoder;

FIG. 11 is a diagram showing the relationship between the input and the output of the adder of FIG. 10;

FIG. 18 is a table showing the input and result of when the binary input data has been shifted;

FIG. 24 is a table showing the relationship between input and output in the circuit of FIG. 23;

FIG. 29 is a table for explaining a case in which a higher-order bit changes in the circuit of FIG. 28;

DETAILED DESCRIPTION OF THE PREFERRED EMBODIMENTS

Figure 1:
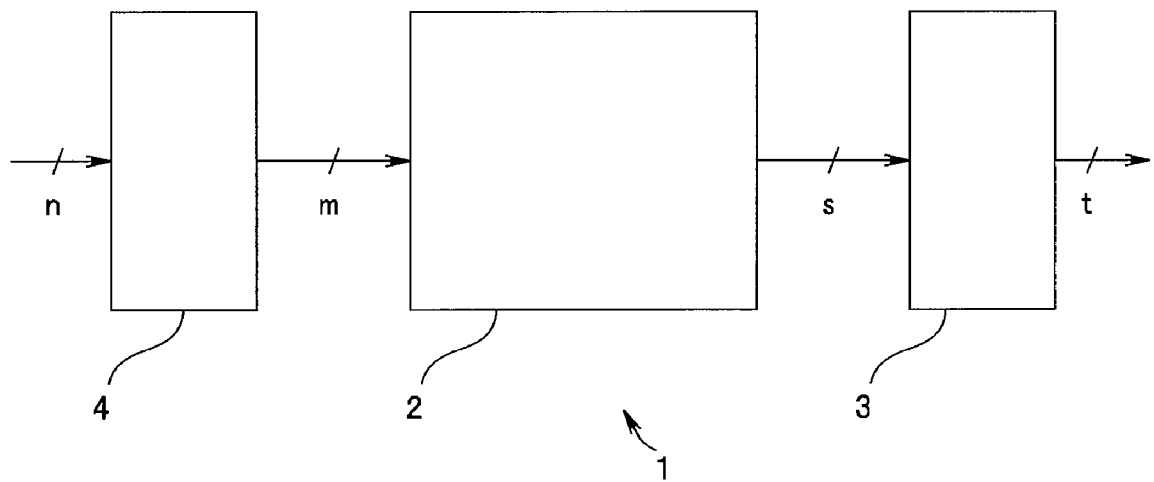
FIG. 1 is a block diagram showing the configuration of an inverter circuit configured to execute bit inversion of a logic circuit according to a first embodiment of the present invention.

Herein below will be described embodiments of the present invention while referring to the drawings.

First Embodiment

First, based on FIG. 1, description will be given for the entire configuration of a logic circuit according to a first embodiment of the present invention. FIG. 1 is a block diagram showing the configuration of an inverter circuit configured to execute bit inversion of the logic circuit according to the first embodiment of the present invention.

FIG. 1 shows a basic configuration applicable to various kinds of logic circuit, and shows a logic circuit 1 including an interconnect network portion (hereinafter referred to as 'interconnect network') 2, an encode portion (hereinafter referred to as 'encoder') 3, and a decode portion (hereinafter referred to as 'decoder') 4. The decoder 4 is a decoder configured to convert n-bit binary data into an m-bit (m>n) bit string. The interconnect network 2 is an interconnect network circuit configured to execute a prescribed operation according to substituting the decoded data. The encoder 3 is an encoder configured to convert s-bit data that has been output from the interconnect network 2 into t-bit data (s>t).

Here, though the input data is n-bit, when decoded it will become m-bit, which is larger than n-bit, and redundancy is increased. Moreover, after decoding, the decoded data is of a hamming weight unrelated to the hamming weight of the input n-bit binary data, and is processed afterward. For example, if m is 2 to the power of n, the input data is converted into such data that only one signal of the m-bit data is HIGH (hereinafter also referred to as 'H'). If conversion is executed in this manner, after decoding, since the interconnect for the signal which will always be H is just one in quantity, the hamming weight of the decoded data will always be constant. Therefore, since the electrical power consumption of the logic circuit 1 is not dependant on the data that has been input, it is possible to realize a logic circuit that suppresses fluctuations in electrical power consumption.

The interconnect network 2 is connected to the decoder 4, and receives through a plurality of input terminals a first plurality of bit data, which is the decoded data obtained through the conversion by the decoder 4. For the purpose of arithmetic processing, the interconnect network 2 substitutes the bit position of the first plurality of bit data and generates a second plurality of bit data. The interconnect network performs such processing by changing the connection or signal pathway of a plurality of interconnects corresponding to each bit data of the received decode data. The second plurality of bit data is output to the encoder 3 from a plurality of output terminals of the interconnect network 2. In other words, the interconnect network 2 performs the conversion of the bit pattern (the alignment order of the plurality of bit data) of the decode data with a constant hamming weight which was output from the decoder 4 and outputs it as output data.

Moreover, the circuit configuration shown in FIG. 1 is not solely applied to the present embodiment, but is a configuration that is applied in other logic circuits described from the second embodiment on.

Herein below, description will be given in regard to a concrete example of the present embodiment with reference to the drawings.

Figure 2:
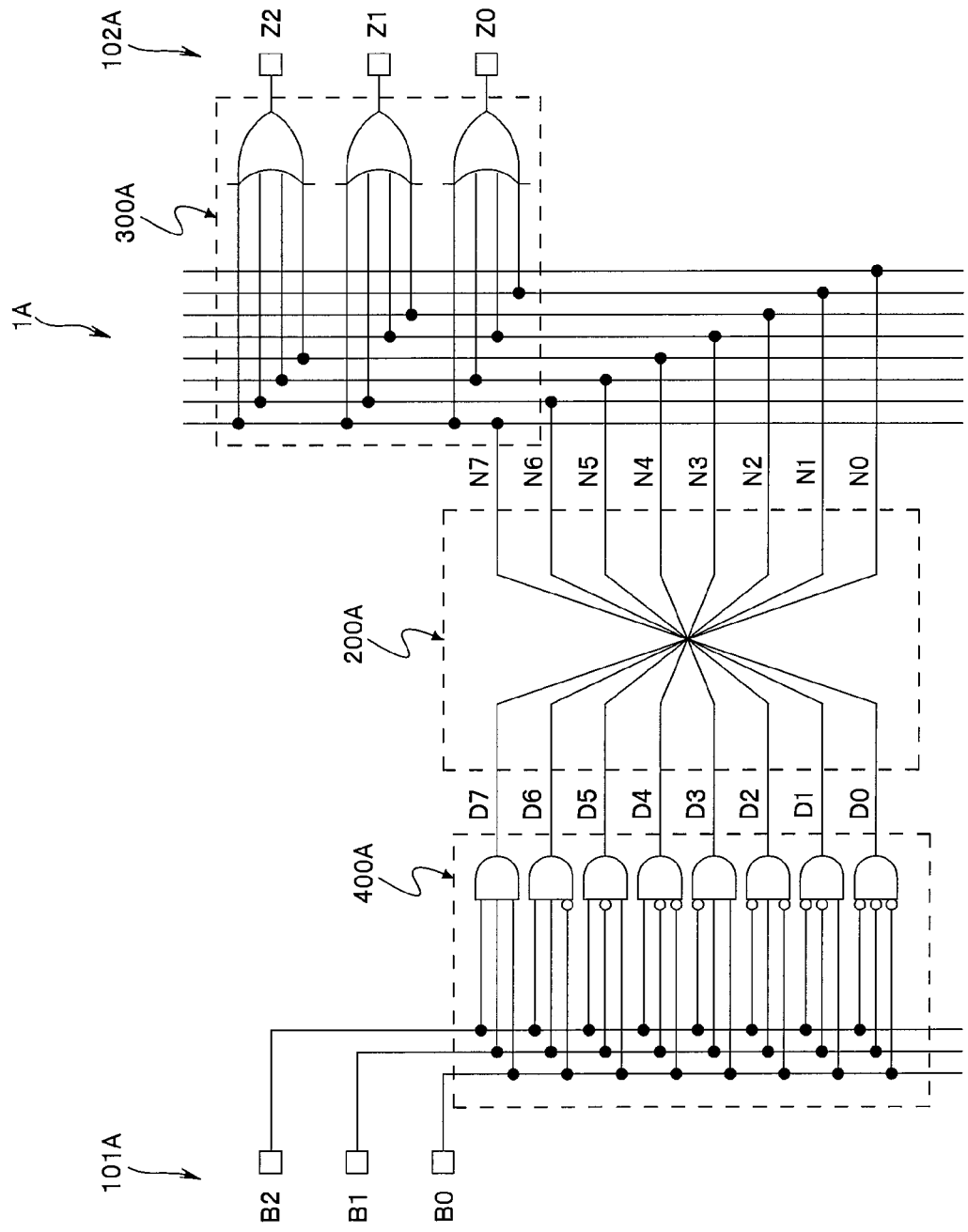
FIG. 2 is a block diagram showing an example of the configuration of the inverter circuit according to the first embodiment of the present invention.

FIG. 2 is a block diagram showing an example of the configuration of the inverter circuit according to the present embodiment. An inverter circuit 1A of FIG. 2 is an example of a logic circuit that realizes bit inversion.

The inverter circuit 1A includes an input portion 101A including three input terminals (B2 to B0) for inputting 3-bit input data, a decoder 400A configured to convert 3-bit data into 8-bit data, an interconnect network 200A configured to execute conversion substituting the 8-bit data (or interconnect), an encoder 300A configured to convert 8-bit data into 3-bit data, and an output portion 102A including three output terminals (Z2 to Z0) configured to output 3-bit data of the encoder 300A. 3-bit binary data is input into the inverter circuit 1A, and the inverter circuit 1A is configured to output 3-bit binary data that has underwent bit inversion.

Here, the decoder 400A includes eight AND circuits, and an inverter circuit is provided on the input terminals of the eight AND circuits so that for each of eight values (0 to 7) expressed as 3-bits, only one AND circuit shall put out an output. The decoder 400A generates an output that is 8-bit decode data from a 3-bit input. The output of each AND circuit of the decoder 400A is connected to a corresponding input terminal of the interconnect network 200A. Each of the outputs of the interconnect network 200A is connected to a respective input terminal of the encoder 300A.

In FIG. 2 for example, a first AND circuit with three inverter circuits established on each of its three input terminals is provided, so that when the 3-bit input data is (0,0,0), only an output terminal D0 of the decoder 400A shall put out an output. Also, a second AND circuit with two inverter circuits established respectively on two of its input terminals is provided, so that when the 3-bit input data is (0,0,1), only an output terminal D1 of the decoder 400A shall put out an output. In the same manner, a third AND circuit with no inverter circuit established on any input terminal is provided, so that when the 3-bit input data is (1,1,1), only an output terminal D7 of the decoder 400A shall put out an output. In other words, only one of the interconnects (i.e., output)

becomes active (or in this example, becomes 'H', which is the logic value '1') for the output of the decoder 400A.

The interconnect network 200A that realizes bit inversion is configured in a manner such that the order of data or interconnects is reversed. As shown in FIG. 2, an interconnect pattern between a plurality of input terminals and a plurality of output terminals is formed so that the alignment order of the decode data, which is a plurality of bit data on a plurality of input terminals of the interconnect network 200A, shall become reversed on the plurality of output terminals on the interconnect network 200A. As a result, substitution of the bit position of the decode data is performed on the interconnect network 200A.

The encoder 300A includes three OR circuits, and the connections of the plurality of input terminals of the three OR circuits to the plurality of output terminals of the interconnect network 200A differ from one another in such a manner that a 3-bit data is output corresponding to eight values expressed as 8-bit. The encoder 300A is configured to generate a 3-bit output from an 8-bit input.

More specifically, as shown in FIG. 2, data from the N7 to N4 outputs of the interconnect network 200A, from amongst 8-bit data, is input to a first OR circuit and the circuit puts out an output to an output terminal Z2. Data from the N7, N6, N3, N2 outputs of the interconnect network 200A, from amongst 8-bit data, is input to a second OR circuit and the circuit puts out an output to an output terminal Z1. Data from the N7, N5, N3, N1 outputs of the interconnect network 200A, from amongst 8-bit data, is input to a third OR circuit and the circuit puts out an output to an output terminal Z0.

Next, description will be given in regard to operation of the logic circuit shown in FIG. 2 using FIG. 3 as a reference.

FIG. 3 is a table showing the output of each portion of the logic circuit 1 that is the bit inverter circuit of FIG. 2. Description will take place using a case in which (B2, B1, B0)=110 are input as input data. This binary 110 is 6 when expressed as decimal. In the output of the decoder 400A, only an output D6 of a seventh AND circuit becomes H, while the remaining outputs are L. Therefore, the output of the decoder 400A becomes (D7, D6, . . . , D0)=01000000. The interconnect network 200A is a network in which data or the interconnect order is substituted in the manner of, N7 is substituted for D0, N6 is substituted for D1, and N5 is substituted for D2. When 01000000 is input, the interconnect network 200A will output (N7, N6, . . . , N0)=00000010. This output corresponds to the decimal 1, and 001 is output by the encoder 300A. In other words, 001, which is the bit inverse data of the input data 110, is output.

In the above manner, it is possible to realize a bit inversion circuit using the decoder 400A, the interconnect network 200A, and the encoder 300A as shown in FIG. 2. At this time, in the output of the decoder 400A the number of signals that are H is always the same, that is, one, and even on the interconnect network 200A the number of signals that are H will be one regardless of the kind of input. In particular, the electrical power consumption of a CMOS logic circuit is dependant upon data being processed. Therefore, the fluctuation of the electrical power consumption in the bit inversion processing is suppressed regardless of the value of the input data.

Second Embodiment

Figure 4:
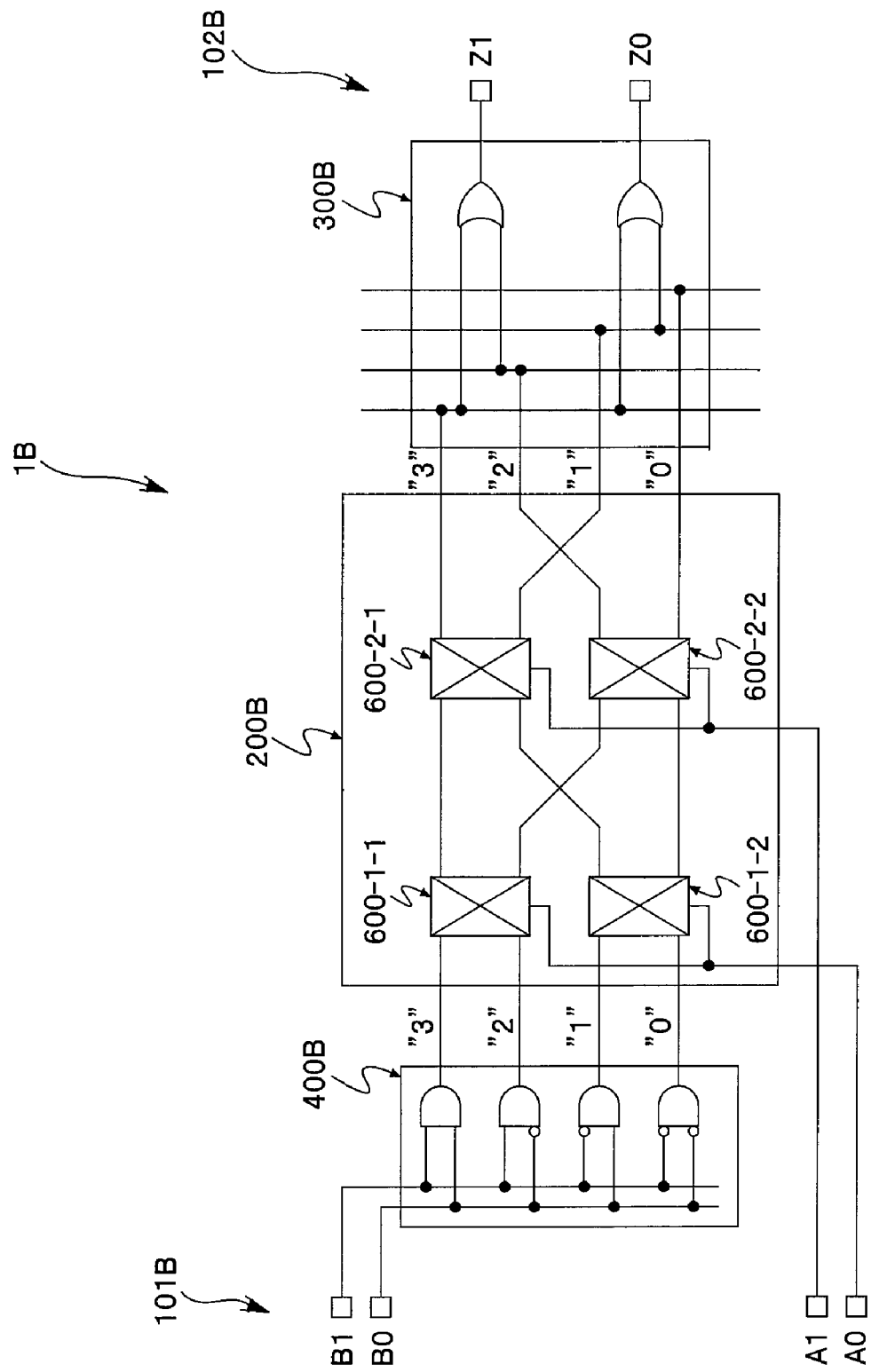
FIG. 4 is a block diagram showing the configuration of an exclusive OR circuit according to a second embodiment of the present invention.

Next, description, based on FIG. 4, will be given in regard to the entire configuration of a logic circuit according to a second embodiment of the present invention. FIG. 4 is a block diagram showing the configuration of an exclusive OR circuit according to the second embodiment.

The basic configuration of the exclusive OR circuit shown in FIG. 4 includes a decoder, an interconnect network, and an encoder, as is similar to the basic configuration shown in FIG. 1.

An exclusive OR circuit 1B of FIG. 4 is an example of a circuit that takes the exclusive disjunction of two two-digit binary numbers.

The exclusive OR circuit 1B includes an input portion 101B, a decoder 400B, an interconnect network 200B, an encoder 300B, and an output portion 102B. The input portion 101B includes two input portions that each include a pair of input terminals (A1, A0) and (B1, B0) respectively, for 2-bit input data. The decoder 400B is configured to convert the 2-bit data of one pair of input terminals, (B1, B0), into 4-bit data. The interconnect network 200B is configured to receive an input of 4-bit decode data from the decoder 400B and yet another 2-bit data of the other pair of input terminals (A1, A0), and substitute the 4-bit data from (or four interconnects of) the decoder 400B. The encoder 300B is configured to convert input 4-bit data into 2-bit data. The output portion 102B includes a pair of output terminals (Z1, Z0) for outputting the 2-bit data of the encoder 300B. Two input data A and B, which are each 2-bit binaries, are input to the exclusive OR circuit 1B, and the exclusive OR circuit 1B takes the exclusive disjunction of the two input data A and B, and outputs 2-bit binary output data.

The decoder 400B here includes four AND circuits, and there is provided an inverter circuit at the input terminals of the four AND circuits so that for each of four values (0 to 3) expressed as 2-bits, only one AND circuit shall put out an output. The decoder 400B is configured to generate a 4-bit output from a 2-bit input. Outputs "0", "1", "2", "3" of AND circuit of the decoder 400B are each connected to a corresponding input terminal of the interconnect network 200B. Outputs "0", "1", "2", "3" of the interconnect network 200B are each connected to a respective input terminal of the encoder 300B.

In FIG. 4, for example, a first AND circuit with two inverter circuits established on each of its two input terminals is provided so that when the 2-bit input data is (0, 0), only an output "0" of the decoder 400B shall put out an output. Also, a second AND circuit with one inverter circuit established on one of its input terminals is provided, so that when the 2-bit input data is (0, 1), only an output "1" of the decoder 400B shall put out an output. In the same manner, an AND circuit with no inverter circuit established on any input terminal is provided, so that when the 2-bit input data is (1, 1), only an output "3" of the decoder 400B shall put out an output. In other words, only one of the interconnects (i.e., output) becomes active (or in this example, becomes 'H', which is the logic value '1') for the output of the decoder 400B.

The encoder 300B here includes two OR circuits, and the connections of the plurality of input terminals of the two OR circuits to the plurality of output terminals of the interconnect network 200B differ from one another in such a manner that a 2-bit data is output corresponding to four values expressed as 4-bit. The encoder 300B is configured to generate a 2-bit output from a 4-bit input.

As shown in FIG. 4, data from the "3" and "2" outputs of the interconnect network 200B, from amongst 4-bit data, is input to a first OR circuit. Data from the "3" and "1" outputs of the interconnect network 200B, from amongst 4-bit data, is input to a second OR circuit inputs.

The interconnect network 200B includes a plurality (four in this example) of selector circuits 600-1-1, 600-1-2, 600-2-1, and 600-2-2. The selector circuits 600-1-1 and 600-1-2 constitute a first stage selector. The selector circuits 600-2-1 and 600-2-2 constitute a second stage selector. Each selector includes two input data (input 1 and input 2), one control input, and two output data (output 1 and output 2). Each selector passes and outputs the input 1 and the input 2 to either of the outputs, output 1 and output 2, in response to the control input, which is a control signal. In the case of FIG. 4, a case in which the control input is 0, the two input data proceed straightly, and as a result of this, the input 1 is output from the output 1, and the input 2 is output from the output 2. In a case in which the control input is 1, the two input data will cross, and as a result of this, the input 1 is output from the output 2, and the input 2 is output from the output 1. In other words, each of the selector circuits 600 are circuits configured to change the state at which the two signals input to the two input terminals appear on the two output terminals, in response to the control input that is input to the control input terminal.

Then, the two first stage selector circuits 600-1-1 and 600-1-2 receive four data "0", "1", "2", and "3" from the first to fourth AND circuits of the decoder 400B. The selector circuit 600-1-1 receives the "2" and "3" output from the decoder 400B. The selector circuit 600-1-2 receives the "0" and "1" output from the decoder 400B. An input data A0 is input to each of the two first stage selector circuits 600-1-1 and 600-1-2, respectively, as the control input. The input A is a different input data than an input B. The two second stage selector circuits 600-2-1 and 600-2-2 receive four data from the two selector circuits 600-1-1 and 600-1-2. The two selector circuits 600-2-1 and 600-2-2 each receive, respectively, the output of the two first selector circuits 600-1-1 and 600-1-2. An input data A1 is input to each of the two selector circuits 600-2-1 and 600-2-2, respectively, as the control input.

For example, when an output "3", "2", "1", "0" of the decoder 400B is input at a time when A0 is 1, the two first stage selector circuits 600-1-1 and 600-1-2 put out output data in an order of "2", "3", "0", "1". The connections of interconnect between the first and second stage selector circuits are formed in a manner such that data in an order of "2", "0", "3", "1" is input from the two first stage selector circuits 600-1-1 and 600-1-2 to the two second stage selector circuits 600-2-1 and 600-2-2. In other words, the output "2", "3", "0", "1" of the two first stage selector circuits 600-1-1 and 600-1-2, become the input "2", "0", "3", "1" because of the connection as shown n FIG. 4, and are input into the two second stage selector circuits 600-2-1 and 600-2-2.

Next, at a time when A1 is 0, this input data is output as-is, or in other words, the output "2", "0", "3", "1" is put out from the two second stage selector circuits 600-2-1 and 600-2-2. The two second stage selector circuits 600-2-1 and 600-2-2 output data in that order of "2", "0", "3", "1". The connections of interconnect between the two second stage selector circuits 600-2-1 and 600-2-2 and the encoder 300B are formed in a manner such that output data in the order of "2", "3", "0", "1" is input to the encoder 300B.

In the above described case, the output of the interconnect network 200B becomes "2", "3", "0", "1" and is passed to the encoder 300B. The output "2", "3", "0", "1" will be "10", "11", "00", "01" when expressed in decimal, and the second bit of each binary is inversed. In other words, the exclusive disjunction processing of the two inputs A and B is realized.

In the above manner, the decode data of input B is input to the plurality of selector circuits 600 of the above described interconnect network 200B. The plurality of selector circuits 600 execute substitution of the bit position of the bit data of the decode data of the input B by inputting input data A, which is separate from input data B, into each control input terminal of the plurality of selector circuits 600 as the control input.

Therefore, by using the decoder 400B, the interconnect network 200B, and the encoder 300B as shown in FIG. 4, it is possible to realize an exclusive OR circuit. At this time, in the output of the decoder 400B the number of signals that are H is always the same, in other words one, and even on the interconnect network 200B the number of signals that are H will be one regardless of the kind of input. Therefore, the fluctuation of the electrical power consumption in the exclusive disjunction processing is suppressed regardless of the value of the input data.

Third Embodiment

Figure 5:
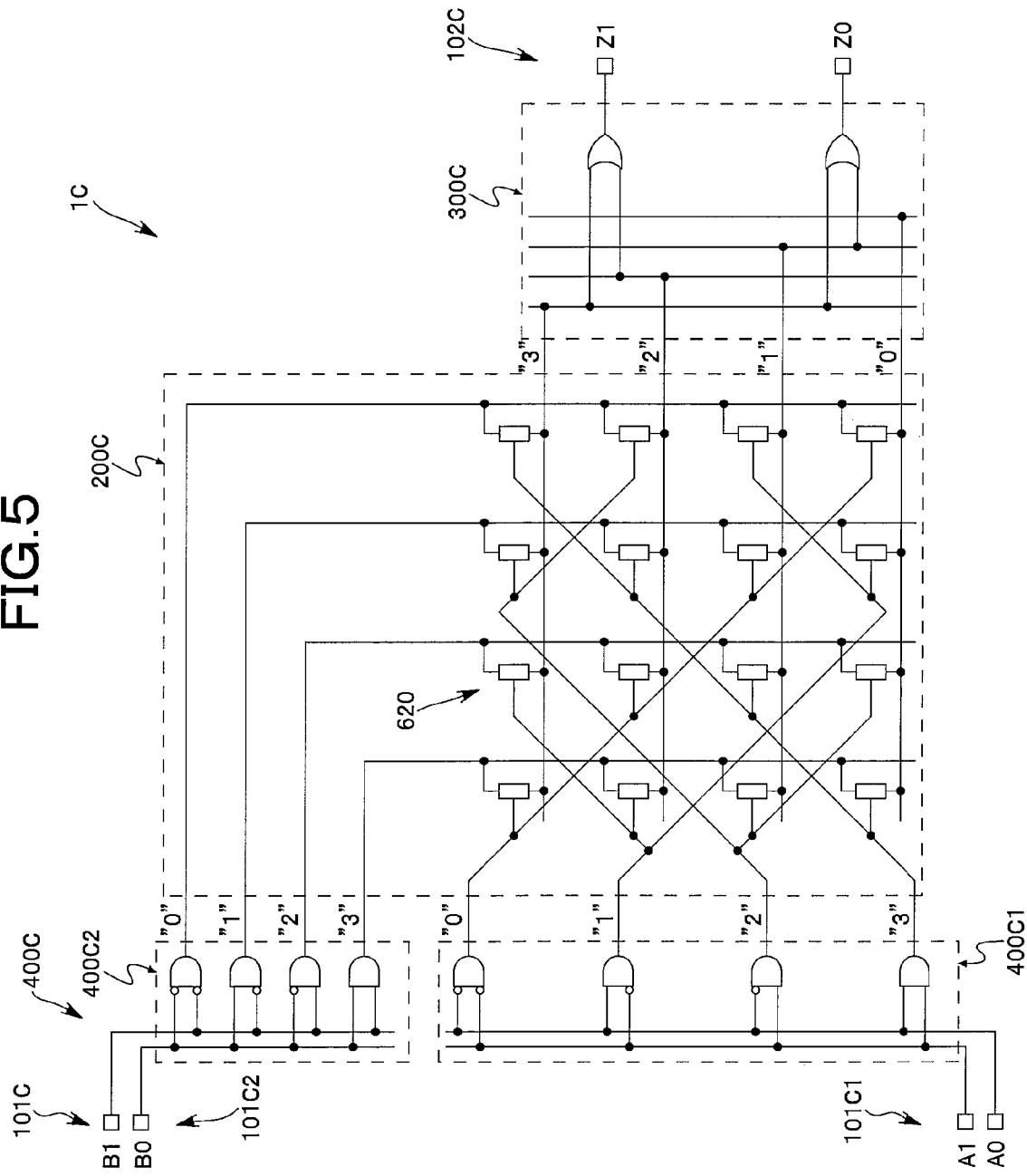
FIG. 5 is a block diagram showing the configuration of an exclusive OR circuit according to a third embodiment of the present invention.

Next, description, based on FIG. 5, will be given in regard to the entire configuration of a logic circuit according to a third embodiment of the present invention. FIG. 5 is a block diagram showing the configuration of an exclusive OR circuit according to the third embodiment of the present invention.

The basic configuration of the exclusive OR circuit shown in FIG. 5 includes a decoder, an interconnect network, and an encoder, as is similar to the basic configuration shown in FIG. 1.

An exclusive OR circuit 1C shown in FIG. 5 is circuit configured to take the exclusive disjunction of two two-digit binaries, in a similar manner as the circuit of FIG. 4. In the circuit of FIG. 5, two inputs are decoded together, and this point differs from the circuit of FIG. 4.

The exclusive OR circuit 1C includes an input portion 101C, a decoder 400C, an interconnect network 200C, an encoder 300C, and an output portion 102C. The input portion 101C includes two input portions 101C1 and 101C2 that include a plurality (here, a pair) of input terminals (A1, A0) and (B1, B0) respectively, for 2-bit input data. The decoder 400C includes a decoder 400C-1 configured to convert the 2-bit data of the input terminal pair (A1, A0) of the input portion 101C1 into 4-bit data, and a decoder 400C-2 configured to convert the 2-bit data of the input terminal pair (B1, B0) of the input portion 101C2 into 4-bit data. Into the interconnect network 200C, 4-bit decode data from the decoder 400C-1 and 4-bit decode data from the decoder 400C-2 is input, and the interconnect network 200C substitutes the two 4-bit data (or four interconnects), and outputs 4-bit data. The encoder 300C is configured to convert input 4-bit data into 2-bit data. The output portion 102C includes an output portion including a pair of output terminals (Z1, Z0) for outputting the 2-bit data of the encoder 300C. Two input data A and B, which are each 2-bit binaries, are input to the exclusive OR circuit 1C, and the exclusive OR circuit 1C takes the exclusive disjunction of the two input data A and B, and outputs 2-bit binary output data.

Here, the decoder 400C-1 and the decoder 400C-2 of the decoder 400C each include four AND circuits, and there is provided an inverter circuit on each input terminal of the four AND circuits so that for each of four values (0 to 3) expressed as 2-bits, only one AND circuit shall put out an output. The two decoders 400C-1 and 400C-2 each are configured to generate a 4-bit output from a 2-bit input. Outputs "0", "1", "2", "3" of each AND circuit of the decoder 400C are each connected to a corresponding input terminal of the interconnect network 200C. Outputs "0", "1", "2", "3" of the interconnect network 200C are each connected to a respective input terminal of the encoder 300C.

Since operation of the two decoders decoder 400C-1 and decoder 400C-2 of FIG. 5 is analogous to the decoder 400B explained in FIG. 4, description will be omitted.

Two 4-bit data that have each been decoded are input to the interconnect network 200C. As shown in FIG. 5, four signal lines input with 4-bit data from the decoder 400C-2 and four output lines by which 4-bit data is output to the encoder 300C are arranged in a matrix. A connection element 620 is provided at each intersection point of the matrix and is configured to set into connection or disconnection the signal lines from the decoder 400C-2 and the output lines to the encoder 300C. Each connection element 620 includes two data terminals and one control input terminal configured to control connection and disconnection of the two data terminals. Connected to the control input terminal is a signal line from the decoder 400C-1. That is, decoded data of the input data that was input to the input terminals (A1, A0) of the input portion 101C1 is input to each control input terminal as a control input. In other words, each connection element is an element configured to change states of connection and disconnection between two terminals in response to a control input that is input to the control input terminal.

As shown in FIG. 5, when there exists a matrix of the four signal lines from the decoder 400C-2 and the four output lines from the interconnect network 200C to the encoder 300C, the four signal lines from the decoder 400C-1 are connected, respectively, to four control input terminals of the four connection elements 620 situated on the respective output lines. Moreover, the four signal lines from the decoder 400C-1, when viewed at each output line, are each separately connected to one of the four control input terminals of the four connection elements 620 connected to each output line. Also, the four signal lines from the decoder 400C-1, when viewed at each signal line, are each separately connected to one of the four control input terminals of the four connection elements 620 connected to each signal line. Thus, the signal lines of the decoder 400C-1 and the control input terminal of each connection element 620 are connected via interconnect in a manner such that the output of the exclusive disjunction of the two input data is output from the encoder 300C.

Moreover, the connection element 620 is an element such as a three-state buffer or a transfer gate that possesses a function in which the two data terminals are connected or disconnected according to the control input, which is a control signal.

In the exclusive OR circuit 1C, when the input data A to the input terminals (A1, A0) is 0 (a binary of 00), the relationship between the input data B input to the input terminal (B1, B0), and the output of the encoder 300C is as is shown in FIG. 6.

FIGS. 6 to 9 are tables for the purpose of showing the relationship of the input data B and the output of the encoder.

Moreover, when the input data A to the input terminals (A1, A0) is 1 (a binary of 01), the relationship between the input data B input to the input terminal (B1, B0), and the output of the encoder 300C is as is shown in FIG. 7.

Moreover, when the input data A to the input terminals (A1, A0) is 2 (a binary of 10), the relationship between the input data B input to the input terminal (B1, B0), and the output of the encoder 300C is as is shown in FIG. 8.

Moreover, when the input data A to the input terminals (A1, A0) is 3 (a binary of 11), the relationship between the input data B input to the input terminal (B1, B0), and the output of the encoder 300C is as is shown in FIG. 9.

In the above described manner, the decode data of the input B is input into a terminal of one end of the plurality of connection elements 620 of the above described interconnect network 200C, and the plurality of output lines of the encoder 300C are connected to the terminal of the other end the plurality of connection elements 620. Moreover, by inputting decode data of input A into each control input terminal of the plurality of connection elements 620 as the control input, substitution of the bit position of the decode data of the input B on the interconnect network 200C is executed.

Therefore, with using the decoder 400C, the interconnect network 200C, and the encoder 300C, as shown in FIG. 5, it is possible to realize an exclusive OR circuit. At this time, the number of signals of the outputs of the decoder 400C-1 and the decoder 400C-2 that are H are always the same, that is, one, and even on the interconnect network 200C the number of output signals that are H will be one regardless of the kind of input. Therefore, the fluctuation of the electrical power consumption in the exclusive OR processing is suppressed regardless of the value of the input data.

Fourth Embodiment

Figure 10:
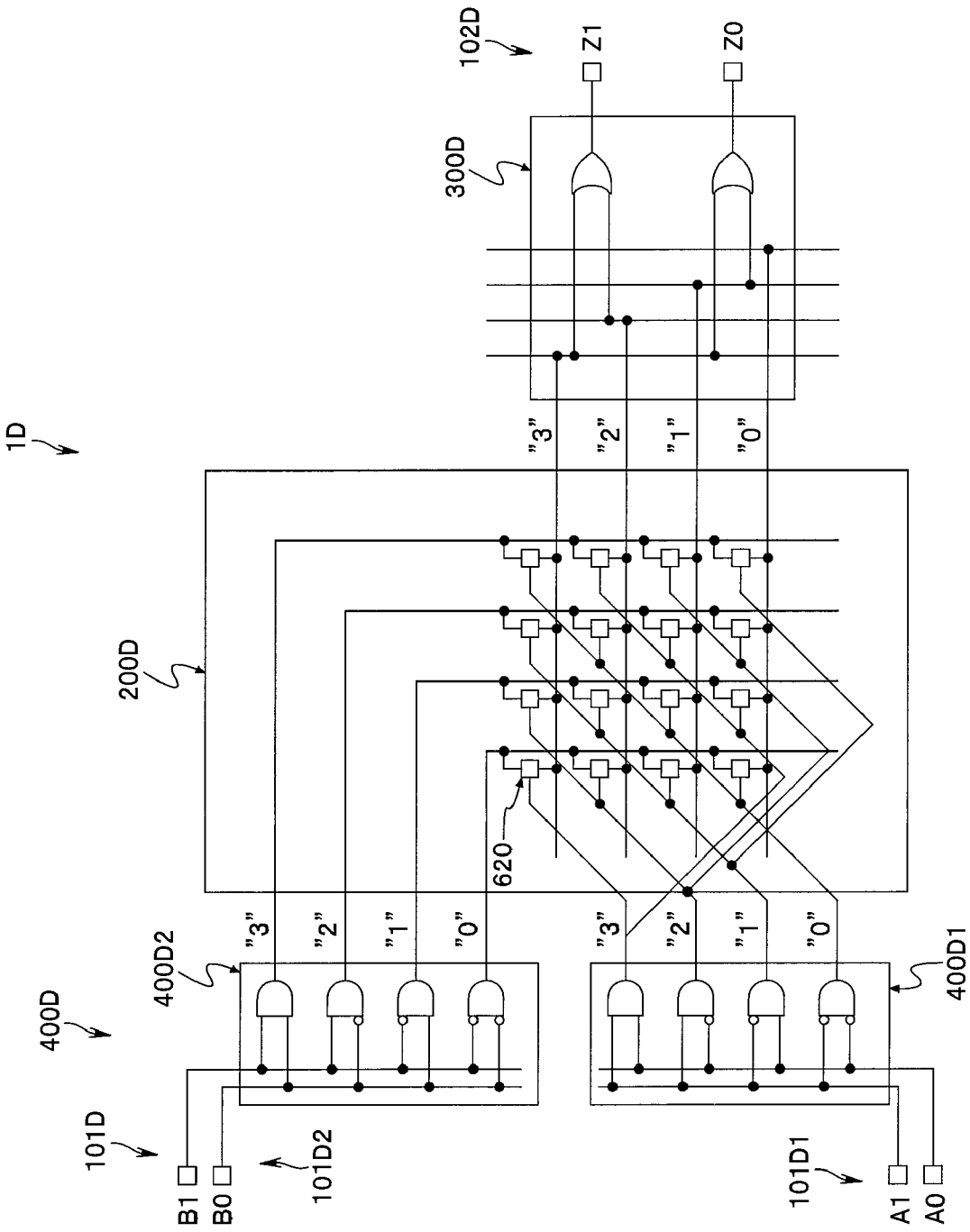
FIG. 10 is a block diagram showing the configuration of an adder according to a fourth embodiment of the present invention.

Next, description, based on FIG. 10, will be given in regard to the entire configuration of a logic circuit according to a fourth embodiment of the present invention. FIG. 10 is a block diagram showing the configuration of an adder according to the fourth embodiment. The adder of the present embodiment is a no-carry adder.

The basic configuration of the adder of FIG. 10 includes a decoder, an interconnect network, and an encoder, as is similar to the basic configuration shown in FIG. 1.

An adder 1D of FIG. 10 includes an input portion 101D, a decoder 400D, an interconnect network 200D, an encoder 300D, and an output portion 102D. The input portion 101D includes two input portions 101D1 and 101D2 that each include a pair of input terminals (A1, A0) and (B1, B0) respectively, for 2-bit input data. The decoder 400D includes a decoder 400D-1 configured to convert the 2-bit data of the input terminal pair (A1, A0) of the input portion 101D1 into 4-bit data, and a decoder 400D-2 configured to convert the 2-bit data of the input terminal pair (B1, B0) of the input portion 101D2 into 4-bit data. The interconnect network 200D is configured to be input with 4-bit decode data from the decoder 400D-1 and 4-bit decode data from the decoder 400D-2, substitute the two 4-bit data (or four interconnects), and output 4-bit data. The encoder 300D is configured to convert input 4-bit data into 2-bit data. The output portion 102D includes an output portion including a pair of output terminals (Z1, Z0) for outputting the 2-bit data of the encoder 300D. Two input data A and B, which are each 2-bit binaries, are input to the adder 1D, and the adder 1D adds together the two input data A and B, and outputs 2-bit binary output data.

The two decoders of the decoder 400D, the decoder 400D-1 and the decoder 400D-2 are analogous to the decoder 400C-1 and the decoder 400C-2 of FIG. 5.

Two 4-bit data which have been decoded are input to the interconnect network 200D. As shown in FIG. 10, a plurality of signal lines (here, four is the quantity) input with 4-bit data from the decoder 400D-2 and a plurality of output lines (here, four is the quantity) by which 4-bit data is output to the encoder 300D are arranged in a matrix. A connection element 620 is provided at each intersection point of the matrix and is configured to set into connection or disconnection the signal lines from the decoder 400D-2 and the signal lines to the encoder 300D. The connection element 620 is the same as that of FIG. 5, as each includes two data terminals and one control input terminal configured to control connection and disconnection of the two data terminals. Connected to the control input terminal is a signal line from the decoder 400D-1. That is, decoded data of the input data that was input to the input terminals (A1, A0) of the input portion 101D1 is input to each control input terminal.

As shown in FIG. 10, when there exists a matrix of the four signal lines from the decoder 400D-2 and the four output lines from the interconnect network 200D to the encoder 300D, the four signal lines from the decoder 400D-1 are connected, respectively, to four control input terminals of the four connection elements 620 situated on each of the output lines. Moreover, the signal lines from the decoder 400D-1, when viewed at each output line, are each separately connected to one of the four control input terminals of the four connection elements 620 connected to each output line. Also, the signal lines from the decoder 400D-1, when viewed at each signal line from the decoder 400D-2, are each connected to one of the four control input terminals of the four connection elements 620 connected to each signal line. Thus, the signal lines of the decoder 400D-1 and the control input terminal of each connection element 620 are connected according to interconnect in a manner such that the output of the addition result of the two input data is output from the encoder 300D.

The adder 1D shown in FIG. 10 is a no-carry adder of two 2-digit binaries. The adder 1D includes two 2-digit binary inputs A and B, and both inputs are each decoded by the decoder 400D. The decoded data is sent to the interconnect network 200D, are subject to execution of adding, and then passed to the encoder 300D. The no-carry adder operates in the manner shown in FIG. 11.

FIG. 11 is a diagram showing the relationship between the input and the output of the adder of FIG. 10. The interconnect network 200D that realizes the operation shown in FIG. 11 is as shown in FIG. 10. The interconnect network 200D is structured, in the same manner as in FIG. 5, in a manner in which the connection element 620 connects the input and the output. The connection of the control input thereof differs. In this manner, if the decoded data is of an input/output relationship that corresponds to a pair, it is possible to realize a logic circuit using a string of connection elements.

In the above described manner, the decode data of the input B is input into a terminal of one end of the plurality of connection elements 620 of the above described interconnect network 200D, and the plurality of output lines to the encoder 300D are connected to the terminal of the other end of the plurality of connection elements 620. Moreover, by inputting the decode data of the input A into each of the control input terminals of the plurality of connection elements 620 as the control input, substitution of the bit position of the decode data of the input B on the interconnect network 200D is executed.

Therefore, with using the decoder 400D, the interconnect network 200D, and the encoder 300D, as shown in FIG. 10, it is possible to realize a no-carry adder. At this time, the number of signals of the outputs of the decoder 400D-1 and the decoder 400D-2 that are H are always the same, that is, one, and even on the interconnect network 200D the number of signals that are H will be one regardless of the kind of input. Therefore, the fluctuation of the electrical power consumption in the no-carry adding is suppressed regardless of the value of the input data.

Fifth Embodiment

Figure 12:
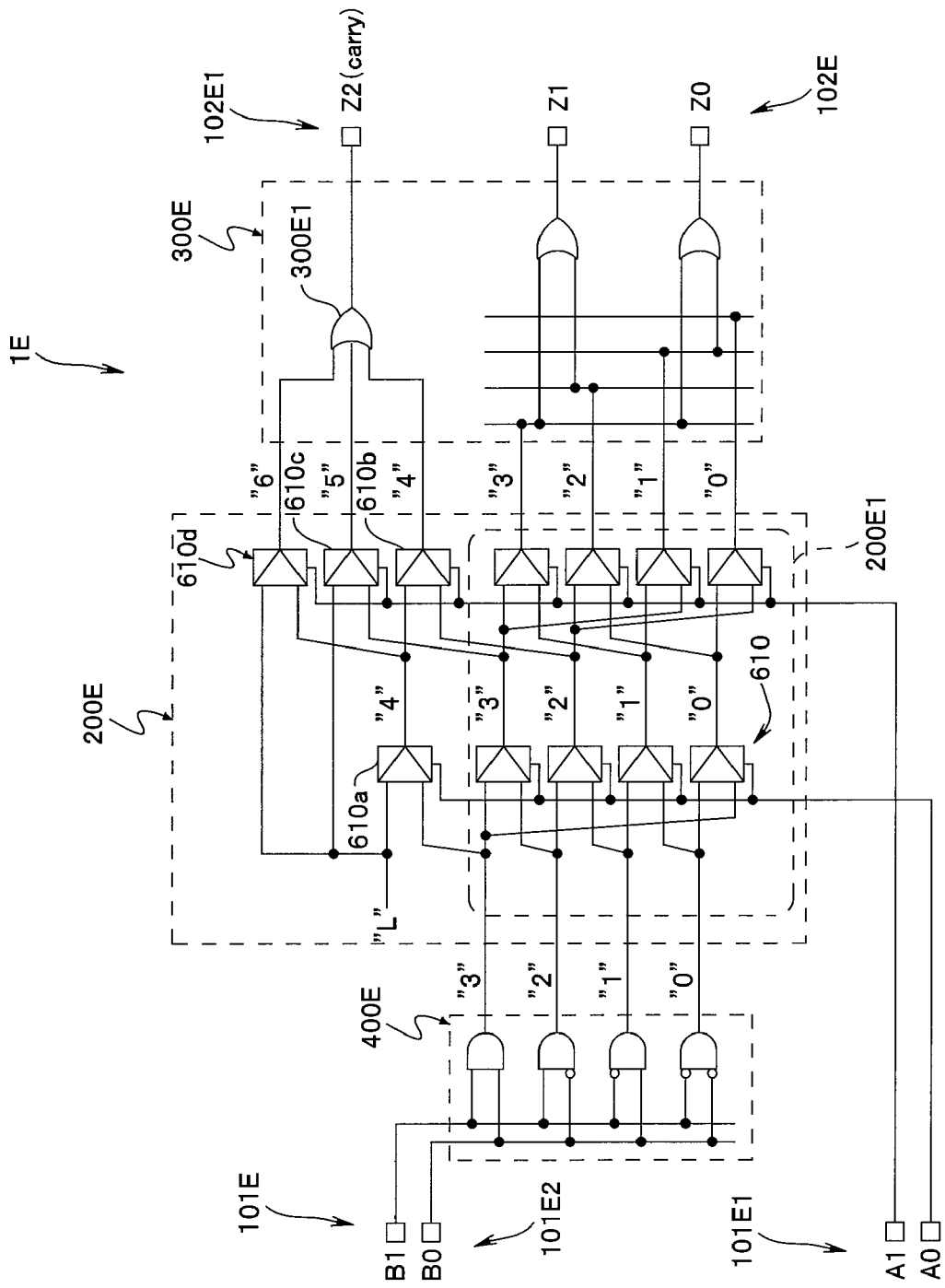
FIG. 12 is a block diagram showing the configuration of an adder according to a fifth embodiment of the present invention.

Next, description, based on FIG. 12, will be given in regard to the entire configuration of a logic circuit according to a fifth embodiment of the present invention. FIG. 12 is a block diagram showing the configuration of an adder according to the fifth embodiment. The adder of the present embodiment is an adder with a carry.

The basic configuration of the adder of FIG. 12 includes a decoder, an interconnect network, and an encoder, as is similar to the basic configuration shown in FIG. 1.

An adder 1E of FIG. 12 includes an input portion 101E, a decoder 400E, an interconnect network 200E, an encoder 300E, and an output portion 102E. The input portion 101E includes two input portions 101E1 and 101E2 that include a pair of input terminals (A1, A0) and (B1, B0) respectively, each for 2-bit input data. The decoder 400E is a decoder configured to convert the 2-bit data of the input terminal pair (B1, B0) of the input portion 101E2 into 4-bit data. The interconnect network 200E is configured to be input with 4-bit decode data from the decoder 400E and 2-bit data from the input portion 101E1, substitute the 4-bit data (or four interconnects), and output 4-bit data as well as 3-bit data. The encoder 300E is configured to convert input 4-bit data into 2-bit data as well as output a carry signal. The output portion 102E includes a pair of output terminals (Z1, Z0) for outputting the 2-bit data of the encoder 300E, and an output portion (Z2) used for the carry signal. Two input data A and B, which are each 2-bit binaries, are input to the adder 1E, and the adder 1E adds together the two input data A and B, and outputs the resulting 2-bit binary output data and a carry signal output-data.

The decoder 400E is analogous to the decoder 400B of FIG. 4.

The interconnect network 200E is an interconnect network including a plurality of selector circuits 610. The interconnect network 200E includes a rotate shifter 200E1 having a 2-stage selector. A first stage selector and a second stage selector of the rotate shifter 200E1 each include four selector circuits 610. The output of the rotate shifter 200E1 is an output of an adding result unrelated to the presence or absence of a carry.

Each of the selector circuits 610 includes two inputs (input 1 and input 2), one control input, and one output. Each of the selector circuits 610 pass either of the input 1 or the input 2 to the output terminal of one end in response to the control input that is input to the control input terminal. In the case of FIG. 12, in a case in which the control input, which is a control signal, is 0, the input 1 of the upper side of each of the selector circuits 610 is output from the output terminal, and in a case in which the control input is 1, the input 2 of the lower side of each of the selector circuits 610 is output from the output terminal.

Then, four data "0", "1", "2", "3" from each of the first to fourth AND circuits of the decoder 400E are input to the input terminal of one end of the four first stage selector circuits 610. Four data "1", "2", "3", "0" from each of the second, third, fourth, and first AND circuits of the decoder 400E are input to the input terminal of the other end of the four first stage (first to fourth) selector circuits 610. That is, the output of an AND circuit adjacent to an AND circuit connected to each of the input terminals of one side of the four first stage selector circuits 610 is connected to the input terminal of the other side of the selector circuits 610. An input data A0 is input to the control input terminal of each of the four first stage selector circuits 610 as the control input.

Therefore, in a case in which the A0 is 0, the outputs "0", "1", "2", "3" of the decoder 400E are each output to the "0", "1", "2", "3" outputs of the first stage selectors, and in a case in which the A0 is 1, the outputs "3", "0", "1", "2" of the decoder 400E are each output to the "0", "1", "2", "3" outputs of the first stage selectors.

Four outputs of the four first stage (first to fourth) selector circuits 610 are each input to the input terminals of one end of the four second stage (first to fourth) selector circuits 610. Four outputs "0", "1", "2", "3" from each of the four first stage (third, fourth, first, and second) selector circuits 610 are input to the input terminals of the other end of the four second stage (first to fourth) selector circuits 610. That is, the outputs of the selector circuit 610 adjacent to the selector circuit 610 adjacent to each selector circuit 610 connected to each of the input terminals of one end are connected to the input terminals of the other end of the four second stage selector circuits 610. The input data A1 is input into each of the control input terminals of the four second stage selector circuits 610 as the control input.

The interconnect network 200E further includes four selector circuits 610 which constitute a network used to calculate a carry. An output "3" of the fourth AND circuit is input to the input terminal of one end of a first selector circuit 610a, and an "L" is input to the input terminal of the other end thereof. The input data A0 is input to the control input terminal of the first selector circuit 610a as the control input.

An output "4" of the first selector circuit 610a is connected to the input terminal of one end of a second selector circuit 610b. An output "2" of the third selector circuit 610 of the first stage selector is connected to the input terminal of the other end of the second selector circuit 610b. An input data A1 is input to the control input terminal of the second selector circuit 610b as the control input.

An output "3" of the fourth selector circuit 610 of the first selector is connected to the input terminal of one end of a third selector circuit 610c. The "L" is input to the input terminal of the other end of the third selector circuit 610c. The input data A1 is input to the control input terminal of the third selector circuit 610c as the control input.

An output "4" of the first selector circuit 610a is connected to the input terminal of one end of a fourth selector circuit 610d. The "L" is input to the input terminal of the other end of the fourth selector circuit 610d. The input data A1 is input to the control input terminal of the fourth selector circuit 610d as the control input.

Output of an initial stage selector including four selector circuits 610 of a first stage selector and a first selector circuit 610a of a carry calculation network is the output "0", "1", "2", "3", "4". Output of a subsequent stage selector including four selector circuits 610 of the second stage selector and the second, third, and fourth selector circuits 610b, 610c, 610d of the carry calculation network is the output "0", "1", "2", "3", "4", "5", "6".

A0 is input to the control input of the initial stage selector, and A1 is input to the control input of the subsequent stage selector. Since the A1 is the second digit of a binary, it is denoted by the decimal 2. Therefore this corresponds to the adding of 2 when A1 is 1. The output in a case in which the input of the upper side of the subsequent stage selector (the output in a case in which A1 is 0) is selected is an initial stage selector output of "0", "1", "2", "3", "4", and the output in a case in which the input of the lower side is selected (the output in a case in which A1 is 1) is "2", "3", "0", "1", "2", "3", "4".

The encoder 300E has a configuration analogous to the encoder 300B shown in FIG. 4. That is, as is shown in FIG. 12, the encoder 300E inputs the output of the four selector circuits 610 of the second stage selector into two OR circuits, and puts out the output of the two OR circuits to the output terminals (Z1, Z0).

Also, the encoder 300E includes an OR circuit 300E1 configured to be input with three outputs "4", "5", and "6" of the second, third and fourth selector circuits 610b, 610c, and 610d of the carry calculation network, and the output of the OR circuit 300E1 is output to the output terminal (Z2) as the carry signal.

With using this kind of configuration, in a case in which a carry has been generated, according to the output of the second stage selector, any of the three outputs "4", "5", and "6" of the subsequent stage selector become H while attaining the same results as in FIG. 11. It is possible to calculate a carry bit according to the exclusive disjunction of the three outputs "4", "5", and "6".

In the above manner, in a case in which a carry has been generated by adding in the carry calculation network of the interconnect network 200E, any one input of the three input terminals of the OR circuit 300E1 becomes H. That is, in the example of FIG. 12, in a case in which four or more adding results are generated with respect to the two data inputs each from 0 to 3, any one of the three inputs (the outputs of "4", "5", "6" of the second, third, fourth selector circuits 610b, 610c, and 610d) of the OR circuit 300E1 shall become H.

In the above manner, the input A, which is separate from the input B, is input to each of the control input terminals of the plurality of selector circuits 610 of the above described interconnect network 200E as the control input. As a result of this, the output of the plurality of selector circuits 610 input with the decode data of the input B is changed, and substitution of the bit position of the decode data of input B is executed on the interconnect network 200E.

Therefore, with using the decoder 400E, the interconnect network 200E, and the encoder 300E as shown in FIG. 12, it is possible to realize an adder having a carry. At this time, in the output of the decoder 400E the number of signals that are H is always the same, that is, one, and even on the interconnect network 200E the number of signals that are H will be one regardless of the kind of input. Therefore, the fluctuation of the electrical power consumption in the adding with a carry is suppressed regardless of the value of the input data.

Sixth Embodiment

Figure 13:
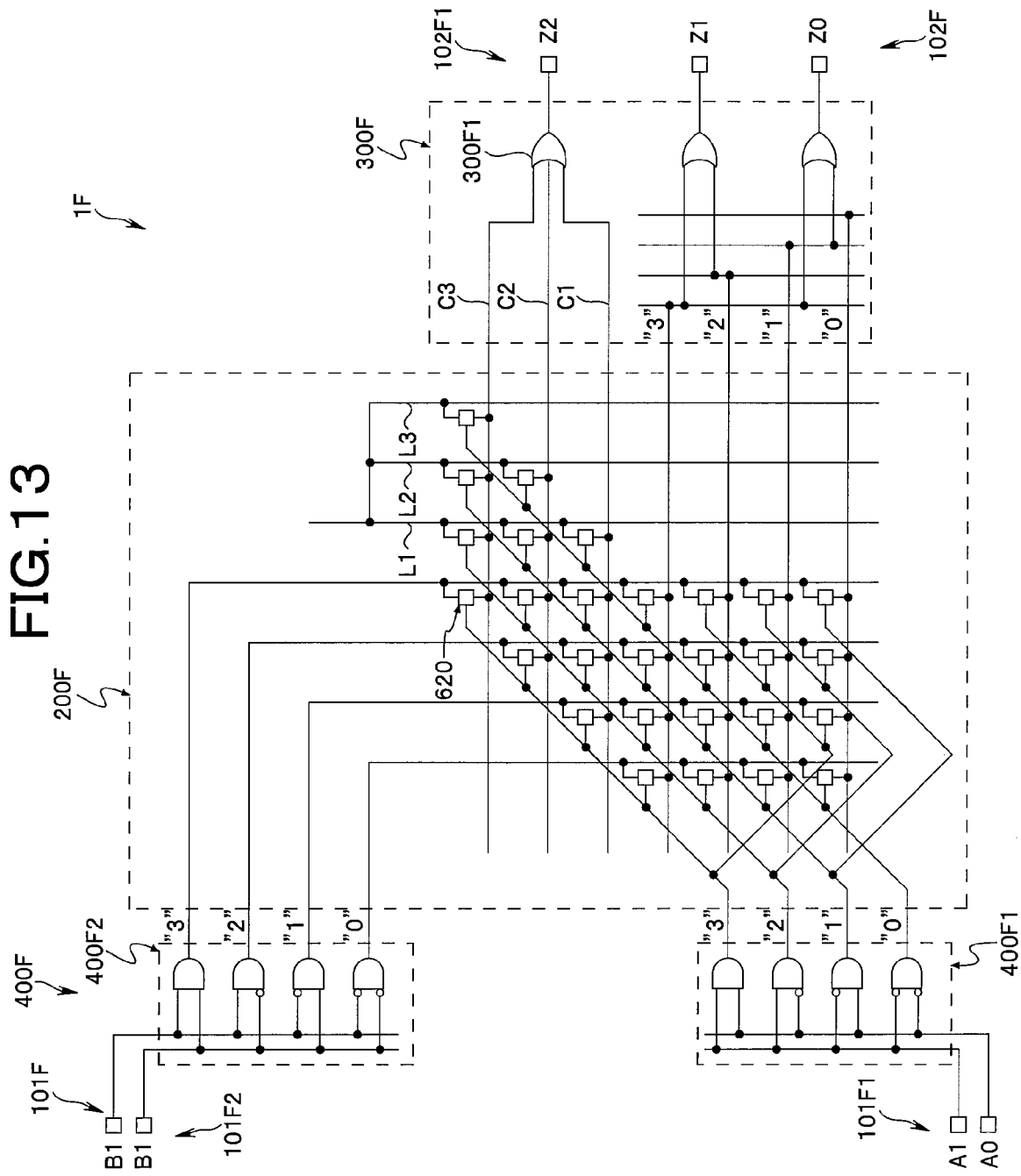
FIG. 13 is a block diagram showing the configuration of an adder according to a sixth embodiment of the present invention.

Next, description, based on FIG. 13, will be given in regard to the entire configuration of a logic circuit according to a sixth embodiment of the present invention. FIG. 13 is a block diagram showing the configuration of an adder according to the sixth embodiment. The adder of the present embodiment is an adder with a carry.

The basic configuration of the adder of FIG. 13 includes a decoder, an interconnect network, and an encoder, as is similar to the basic configuration shown in FIG. 1.

An adder 1F of FIG. 13 includes an input portion 101F, a decoder 400F, an interconnect network 200F, an encoder 300F, and an output portion 102F. The input portion 101F includes two input portions 101F1 and 101F2 that include a pair of input terminals (A1, A0) and (B1, B0) respectively, each for inputting 2-bit input data. The decoder 400F includes a decoder 400F-1 configured to convert the 2-bit data of the input terminal pair (A1, A0) of the input portion 101F1 into 4-bit data, and a decoder 400F-2 configured to convert the 2-bit data of the input terminal pair (B1, B0) of the input portion 101F2 into 4-bit data. The interconnect network 200F is configured to be input with 4-bit decode data from the decoder 400F-1 and 4-bit decode data from the decoder 400F-2, substitute the two 4-bit data (or four interconnects), and output 4-bit data to the encoder 300F as well as output 3-bit data to the encoder 300F.

The encoder 300F is configured to convert input 4-bit data into 2-bit data as well as output a carry signal. The output portion 102F includes a pair of output terminals (Z1, Z0) for outputting the 2-bit data of the encoder 300F, and an output portion (Z2) used for the carry signal. Two input data A and B, which are each 2-bit binaries, are input to the adder 1F, and the adder 1F adds together the two input data A and B, and outputs the resulting 2-bit binary output data and a carry signal output-data.

The decoder 400F-1 and the decoder 400F-2 of the decoder 400F are analogous to the decoder 400C-1 and the decoder 400C-2 of FIG. 5.

Two 4-bit data which have each been decoded are input to the interconnect network 200F. As shown in FIG. 13, four signal lines input with 4-bit data from the decoder 400F-2 and four signal lines by which 4-bit data is output to the encoder 300F are arranged in a matrix. A connection element 620 is provided at each intersection point of the matrix and is configured to set into connection or disconnection the signal lines from the decoder 400F-2 and the signal lines to the encoder 300F. The connection element 620 is the same as that of FIG. 5, as each includes two data terminals and one control input terminal configured to control connection and disconnection of the two data terminals. Connected to the control input terminal is a signal line from the decoder 400F-1. That is, decoded data of the input data A that was input to the input terminals (A1, A0) of the input portion 101F1 is input to each control input terminal as a control input.

As shown in FIG. 13, when there exists a matrix of the four signal lines from the decoder 400F-2 and the four output lines from the interconnect network 200F to the encoder 300F, each of the four signal lines from the decoder 400F-1 are connected, respectively, to four control input terminals of the four connection elements 620 situated on each of the output lines. Moreover, the four signal lines from the decoder 400F-1, when viewed at each output line, are each separately connected to one of the four control input terminals of the four connection elements 620 connected to each output line. Also, the four signal lines from the decoder 400F-1, when viewed at each signal line, are each separately connected to one of the four control input terminals of the four connection elements 620 connected to each signal line. Thus, the signal lines of the decoder 400F-1 and the control input terminal of each connection element 620 are connected via interconnect in a manner such that the output of the addition result of the two input data with the carry is output from the encoder 300F.

The interconnect network 200F further includes twelve connection elements 620 that constitute a carry calculation network, and three L level signal lines supplied with a "0" (that is, an "L" level) signal.

The encoder 300F has the same configuration as the encoder 300B of FIG. 4. Moreover, as shown in FIG. 13, the encoder 300F includes an OR circuit 300F1 input with signals of three carry signal lines. Four connection elements 620 are each provided on a first carry signal line C1 at four intersection points of three signal lines of a second, third, and fourth AND circuits of the decoder 400F-2 and a first L level signal line L1. Four connection elements 620 are each provided on a second carry signal line C2 at four intersection points of two signal lines of the third and fourth AND circuits of the decoder 400F-2 and the first and second L level signal lines L1 and L2. Four connection elements 620 are each provided on a third carry signal line C3 at four intersection points of the signal lines of the fourth AND circuit of the decoder 400F-2 and the first, second, and third L level signal lines L1, L2, and L3. The three carry signal lines C1, C2, and C3 are connected to an input terminal of the OR circuit 300F1. The output of the OR circuit 300F1 is output to the output terminal (Z2).

The adder F1 configured in this manner is a logic circuit that realizes the same function as that of FIG. 12. In the interconnect network of FIG. 12, one input is processed with data that has not been decoded, while in the interconnect network of FIG. 13, both inputs are processed with a decoded value.

Figure 14:
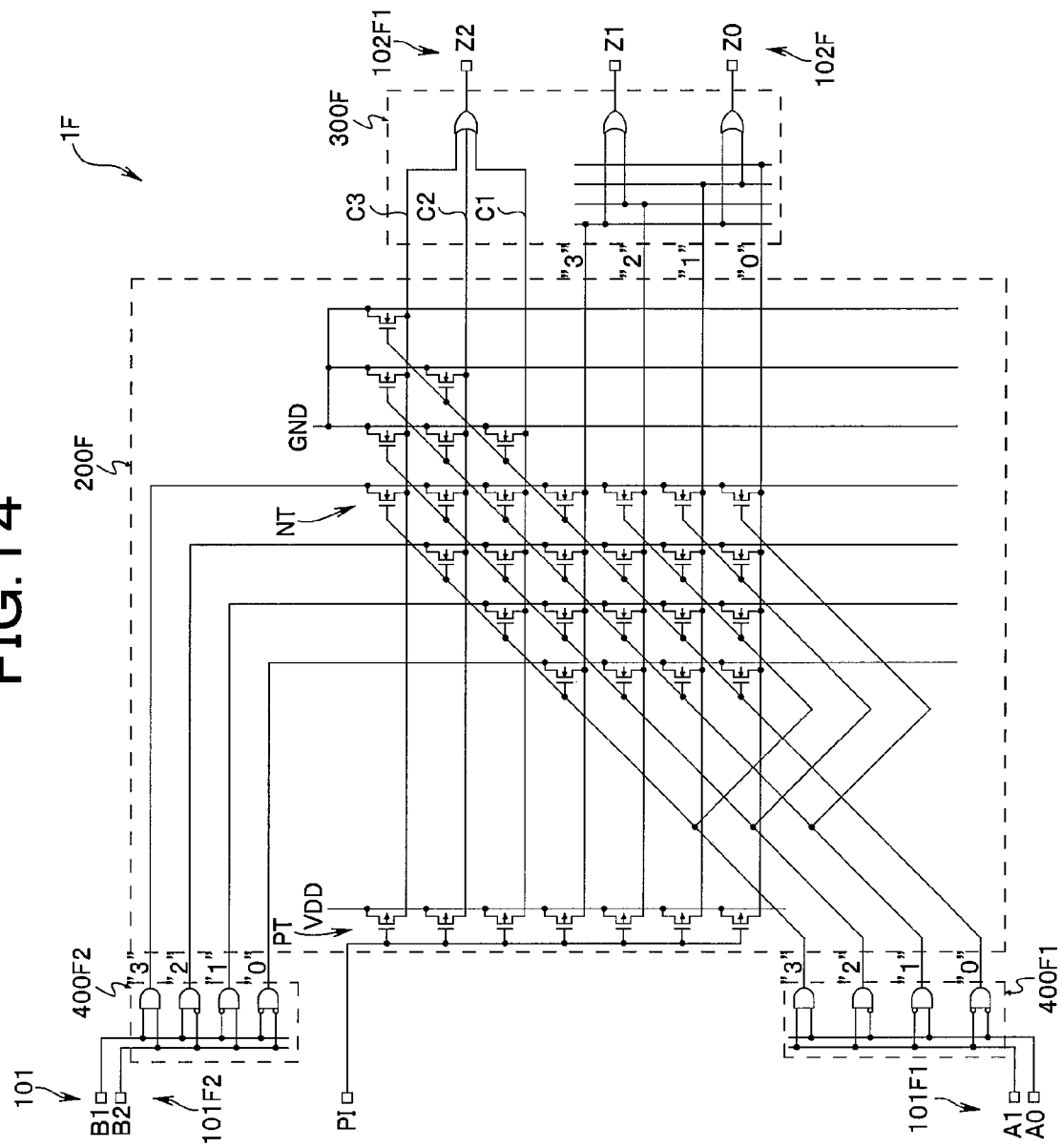
FIG. 14 is a schematic circuit diagram showing a concrete example of the configuration of the adder circuit of FIG. 13.

FIG. 14 is a schematic circuit drawing showing a concrete example configuration of the adder circuit shown in FIG. 13.

FIG. 14 shows an example configuration of a case using an n-channel transistor NT as the connection element 620. Also, there is connected to each of the output lines, a drain of a p-channel transistor PT used for pre-charging. Before an operation is executed, all of the p-channel transistors PT are controlled to become ON, and all outputs of the interconnect network 200F become H. Next, all of the p-channel transistors PT are switched OFF, and data is supplied to the interconnect network 200F from the decoder 400F-1 and the decoder 400F-2, and each of the n-channel transistors NT are switched either ON or OFF according to each of their inputs. In each of the output lines, in a case in which each output from the decoder 400F-1 is L, the electrical charges that have been accumulated are pulled, and the H state is held only in a case in which the output from the decoder 400F-1 is H. Therefore, after the n-channel transistor NT has acted, a signal of a result identical to that of FIG. 13 is output from the interconnect network 200F. According to configuration in this manner, it is possible to cut the number of transistors in the interconnect network 200F, and it also becomes possible to reduce the result dependence of the electrical power consumption, as a former output state is erased according to executing pre-charging.

In the above manner, decode data of the input B is input to the terminals of one side of a plurality of the connection elements 620 of the above described interconnect network 200F, and a plurality of output lines to the encoder 300F are connected to the terminals of the other side of the plurality of connection elements 620. Moreover, by inputting the decode data of the input A to the each of the control input terminals of the plurality of connection elements 620 as the control input, substitution of the bit position of the decode data of the input B is conducted on the interconnect network 200F.

Therefore, with using the decoder 400F, the interconnect network 200F, and the encoder 300F as shown in FIG. 13 and FIG. 14, it is possible to realize an adder with a carry. At this time, in the output of the decoder 400F-1 and the decoder 400F-2, the number of signals that are H is always the same, that is, one, and even on the interconnect network 200F the number of signals that are H will be one regardless of the kind of input. Therefore, the fluctuation of the electrical power consumption in the adding with a carry is suppressed regardless of the value of the input data.

Seventh Embodiment

Figure 15:
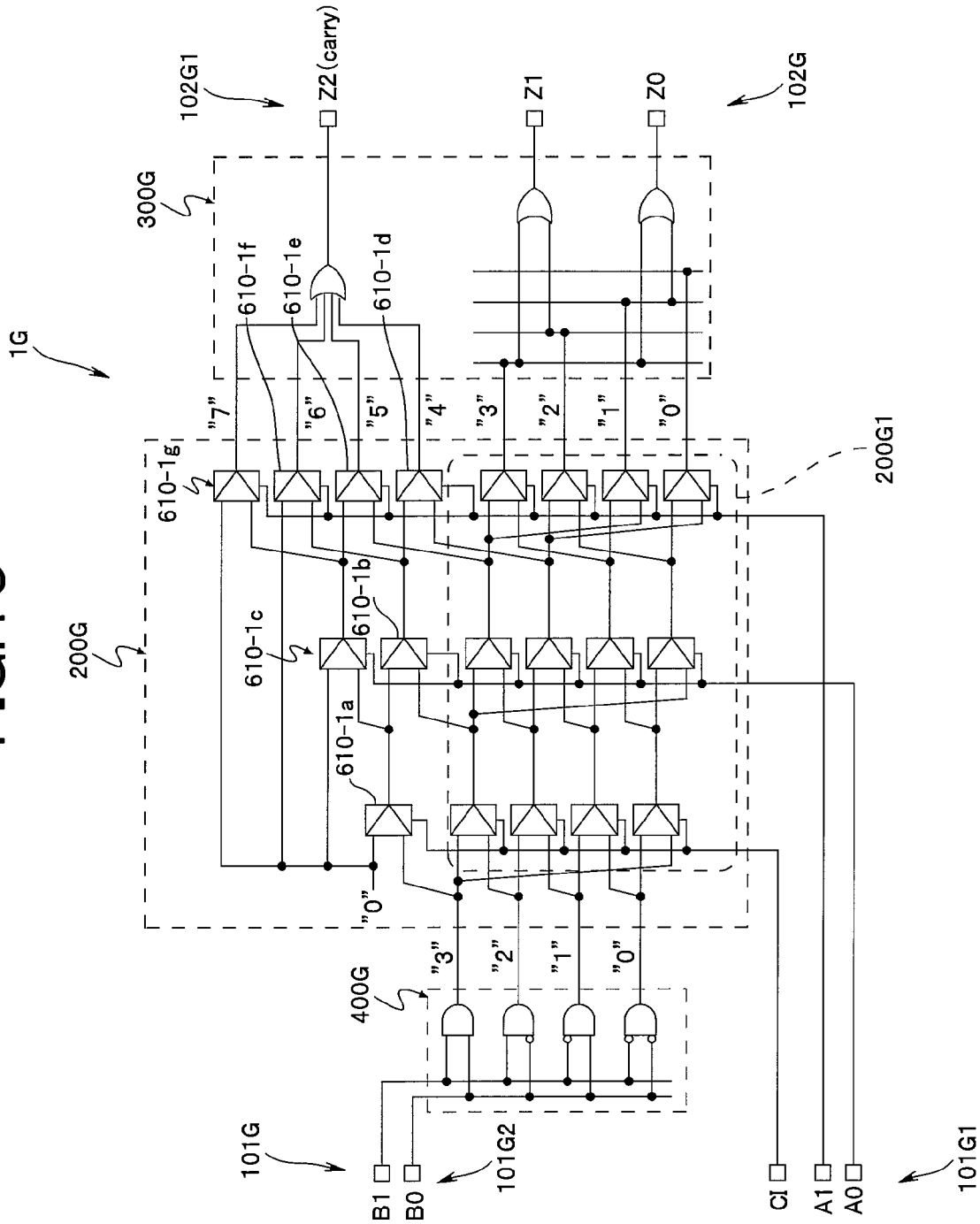
FIG. 15 is a block diagram showing the configuration of an adder according to a seventh embodiment of the present invention.

Next, description, based on FIG. 15, will be given in regard to the entire configuration of a logic circuit according to a seventh embodiment of the present invention. FIG. 15 is a block diagram showing the configuration of an adder according to the seventh embodiment. The adder of the present embodiment is an adder with a carry input.

The basic configuration of the adder of FIG. 15 includes a decoder, an interconnect network, and an encoder, as is similar to the basic configuration shown in FIG. 1.

An adder 1G of FIG. 15 includes an input portion 101G, a decoder 400G, an interconnect network 200G, an encoder 300G, and an output portion 102G. The input portion 101G includes two input portions 101G1 and 101G2 that include a pair of input terminals (A1, A0) and (B1, B0) respectively, each for inputting 2-bit input data. The decoder 400G is a decoder configured to convert the 2-bit data of the input terminal pair (B1, B0) of the input portion 101G2 into 4-bit data. The interconnect network 200G is configured to be input with 4-bit decode data from the decoder 400G, 2-bit data from the input portion 101G, and a carry input data CI, substitute the two 4-bit data (or four interconnects), and output 4-bit data of the adding result to the encoder 300G as well as output a 4-bit data, which is used for the carry, to the encoder 300G. The encoder 300G is configured to convert input 4-bit data into 2-bit data as well as output a carry signal. The output portion 102G includes a pair of output terminals (Z1, Z0) for outputting the 2-bit data of the encoder 300G, and an output portion (Z2) used for the carry signal. A carry signal input-data CI and two input data A and B, which are each 2-bit binaries, are input to the adder 1G, and the adder 1G adds together the two input data A and B, and outputs the resulting 2-bit binary output data and a carry signal output-data.

The decoder 400G is analogous to the decoder 400B of FIG. 4.

The interconnect network 200G is an interconnect network including a plurality of selector circuits 610. The interconnect network 200G includes a rotate shifter 200G1 including a 3-stage selector. A first stage selector, a second stage selector, and a third stage selector of the rotate shifter 200G1 each include four selector circuits 610. The output of the rotate shifter 200G1 is an output of an adding result unrelated to the presence or absence of a carry.

Each of the selector circuits 610 includes two inputs (input 1 and input 2), one control input, and one output. Each of the selector circuits 610 pass either of the input 1 or the input 2 to the output terminal of one end in response to the control input that is input to the control input terminal. In the same manner as in the case of FIG. 12, in a case in which the control input is 0, the input 1 of the upper side of each of the selector circuits 610 is output from the output terminal, and in a case in which the control input is 1, the input 2 of the lower side of each of the selector circuits 610 is output from the output terminal.

Then, four data "0", "1", "2", "3" from each of the first to fourth AND circuits of the decoder 400G are input to the input terminal of one end of the four selector circuits 610 of the first stage. Four data "3", "0", "1", "2" from each of the fourth, first, second, and third AND circuits of the decoder 400G are input to the input terminal of the other end of the four first stage (that is, the first to fourth) selector circuits 610. That is, the output of an AND circuit adjacent to an AND circuit connected to each of the input terminals of one side is connected to the input terminal of the other side of the four first stage selector circuits 610. The carry input data CI is input to the control input terminal of each of the four first stage selector circuits 610 as the control input.

Therefore, in a case in which the CI is 0, the outputs "0", "1", "2", "3" of the decoder 400G are each output to the "0", "1", "2", "3" outputs of the first stage selectors, and in a case in which the CI is 1, the outputs "3", "0", "1", "2" of the decoder 400G are each output to the "0", "1", "2", "3" outputs of the first stage selectors.

Four outputs of the four first stage (first to fourth) selector circuits 610 are each input to the input terminals of one end of the four second stage (first to fourth) selector circuits 610. Four outputs from each of the four first stage (fourth, first, second, and third) selector circuits 610 are input to the input terminals of the other end of the four second stage (first to fourth) selector circuits 610. That is, the outputs of the selector circuit 610 adjacent to the selector circuit 610 adjacent to each selector circuit 610 connected to each of the input terminals of one end are connected to the input terminals of the other end of the four second stage selector circuits 610. The input data A0 is input into each of the control input terminals of the four second-stage selector circuits 610 as the control input.

Four outputs of the four second stage (first to fourth) selector circuits 610 are each input to the input terminals of one end of the four third stage (first to fourth) selector circuits 610. Four outputs from each of the four second stage (third, fourth, first, and second) selector circuits 610 are input to the input terminals of the other end of the four third stage (first to fourth) selector circuits 610. That is, the outputs of the selector circuit 610 adjacent to the selector circuit 610 adjacent to each selector circuit 610 connected to each of the input terminals of one end are connected to the input terminals of the other end of the four third stage selector circuits 610. The input data A1 is input into each of the control input terminals of the four third stage selector circuits 610 as the control input.

The interconnect network 200G further includes seven selector circuits 610 which constitute a network used to calculate a carry. An output of the fourth AND circuit is input to the input terminal of one end of a first selector circuit 610-1$a$, and a 0(="L") is input to the input terminal of the other end. The input data CI is input to the control input terminal of the first selector circuit 610-1$a$ as the control input. The second to seventh selector circuits 610-1$b$ to 610-1$g$ constitute a selector that processes the carry result.

An output of the first selector circuit 610-1$a$ is connected to the input terminal of one end of a second selector circuit 610-1$b$. An output of the fourth selector circuit of the first stage selector is connected to the input terminal of the other end of the second selector circuit 610-1$b$. An input data A0 is input to the control input terminal of the second selector circuit 610-1$b$ as the control input.

An output of the first selector circuit 610-1$a$ is connected to the input terminal of one end of a third selector circuit 610-1$c$. The 0(="L") is input to the input terminal of the other end of the third selector circuit 610-1$c$. The input data A0 is input to the control input terminal of the third selector circuit 610-1$c$ as the control input.

An output of the third selector circuit of the second selector is connected to the input terminal of one end of a fourth selector circuit 610-1$d$. The output of the second selector circuit 610-1$b$ is input to the input terminal of the other end of the fourth selector circuit 610-1$d$. The input data A1 is input to the control input terminal of the fourth selector circuit 610-1$d$ as the control input.

An output of the fourth selector circuit of the second selector is connected to the input terminal of one end of a fifth selector circuit 610-1$e$. The output of the third selector circuit 610-1$c$ is input to the input terminal of the other end of the fifth selector circuit 610-1$e$. The input data A1 is input to the control input terminal of the fifth selector circuit 610-1$e$ as the control input.

An output of the second selector circuit 610-1$b$ is connected to the input terminal of one end of a sixth selector circuit 610-1$f$. The 0(="L") is input to the input terminal of the other end of the sixth selector circuit 610-1$f$. The input data A1 is input to the control input terminal of the sixth selector circuit 610-1$f$ as the control input.

An output of the third selector circuit 610-1$c$ is connected to the input terminal of one end of a seventh selector circuit 610-1$g$. The 0(="L") is input to the input terminal of the other end of the seventh selector circuit 610-1$g$. The input data A1 is input to the control input terminal of the seventh selector circuit 610-1$g$ as the control input.

Output of an initial stage selector including the four selector circuits 610 of the first stage selector and a first selector circuit 610-1$a$ of a carry calculation network is the output "0", "1", "2", "3", "4". Output of a mid stage selector including the four selector circuits 610 of the second stage selector and the second and third selector circuits 610-1$b$ and 610-1$c$, of the carry calculation network is the output "0", "1", "2", "3", "4", "5", "6". Output of a subsequent stage selector including the four selector circuits 610 of the third stage selector and the fourth, fifth, sixth, and seventh selector circuits 610-1*d*, 610-1*e*, 610-1*f* and 610-1*g*, of the carry calculation network is the output "0", "1", "2", "3", "4", "5", "6", "7", "8". The selector of the initial stage is a selector stage established before the interconnect network used for adding, and is for realizing one addition.

A1 is input to the control input of the subsequent stage selector. Since the A1 is the second digit of a binary, it is denoted by the decimal 2. Therefore this corresponds to the adding of 2 when A1 is 1. The output in a case in which the input of the upper side of the subsequent stage selector (the output in a case in which A1 is 0) is selected is a mid stage selector output of "0", "1", "2", "3", "4", L, L, and the output in a case in which the input of the lower side is selected (the output in a case in which A1 is 1) is "2", "3", "0", "1", "2", "3", "4", "5".

The encoder 300G has a configuration analogous to the encoder 300B shown in FIG. 4. That is, as is shown in FIG. 15, the encoder 300G inputs the output of the four selector circuits 610 of the third stage selector into two OR circuits, and puts out the output of those two OR circuits to the output terminals (Z1, Z0).

Also, the encoder 300G includes an OR circuit 300G1 configured to be input with the four outputs "4", "5", "6", and "7" of the fourth, fifth, sixth, and seventh selector circuits 610-1*d*, 610-1*e*, 610-1*f* and 610-1*g*, of the carry calculation network, and the output of this OR circuit 300G1 is output to the output terminal (Z2) as the carry signal.

With using this kind of configuration, in a case in which a carry has been generated, according to the output of the second stage selector, any of the four outputs "4", "5", "6", and "7" of the subsequent stage selector become H while attaining the same results as in FIG. 12. It is possible to calculate a carry bit according to the exclusive disjunction of the four outputs "4", "5", "6", and "7".

In the above manner, the initial selector is provided on the interconnect network 200G so as to further add "one" in response to an input of a carry. Moreover, in a case in which a carry has been generated by adding, any one input of the four input terminals of the OR circuit 300G1 becomes H. That is, in the example of FIG. 15, in a case in which four or more addition results are generated with respect to the two data inputs each from 0 to 3, any one of the three inputs (second, third, fourth selector circuits 610*b*, 610*c*, and 610*d*) of the OR circuit 300E1 shall become H.

In the above manner, the input A, which is separate from the input B, and the carry data are input to each of the control input terminals of the plurality of selector circuits 610 of the above described interconnect network 200G as the control input. As a result of this, the output of the plurality of selector circuits 610 input with the decode data of the input B is changed, and substitution of the bit position of the decode data of input B is executed on the interconnect network 200G.

Therefore, with using the decoder 400G, the interconnect network 200G, and the encoder 300G as shown in FIG. 15, it is possible to realize an adder having a carry input. At this time, in the output of the decoder 400G the number of signals that are H is always the same, that is, one, and even on the interconnect network 200G the number of signals that are H will be one regardless of the kind of input. Therefore, the fluctuation of the electrical power consumption in the adding with a carry input is suppressed regardless of the value of the input data.

Eighth Embodiment

Figure 16:
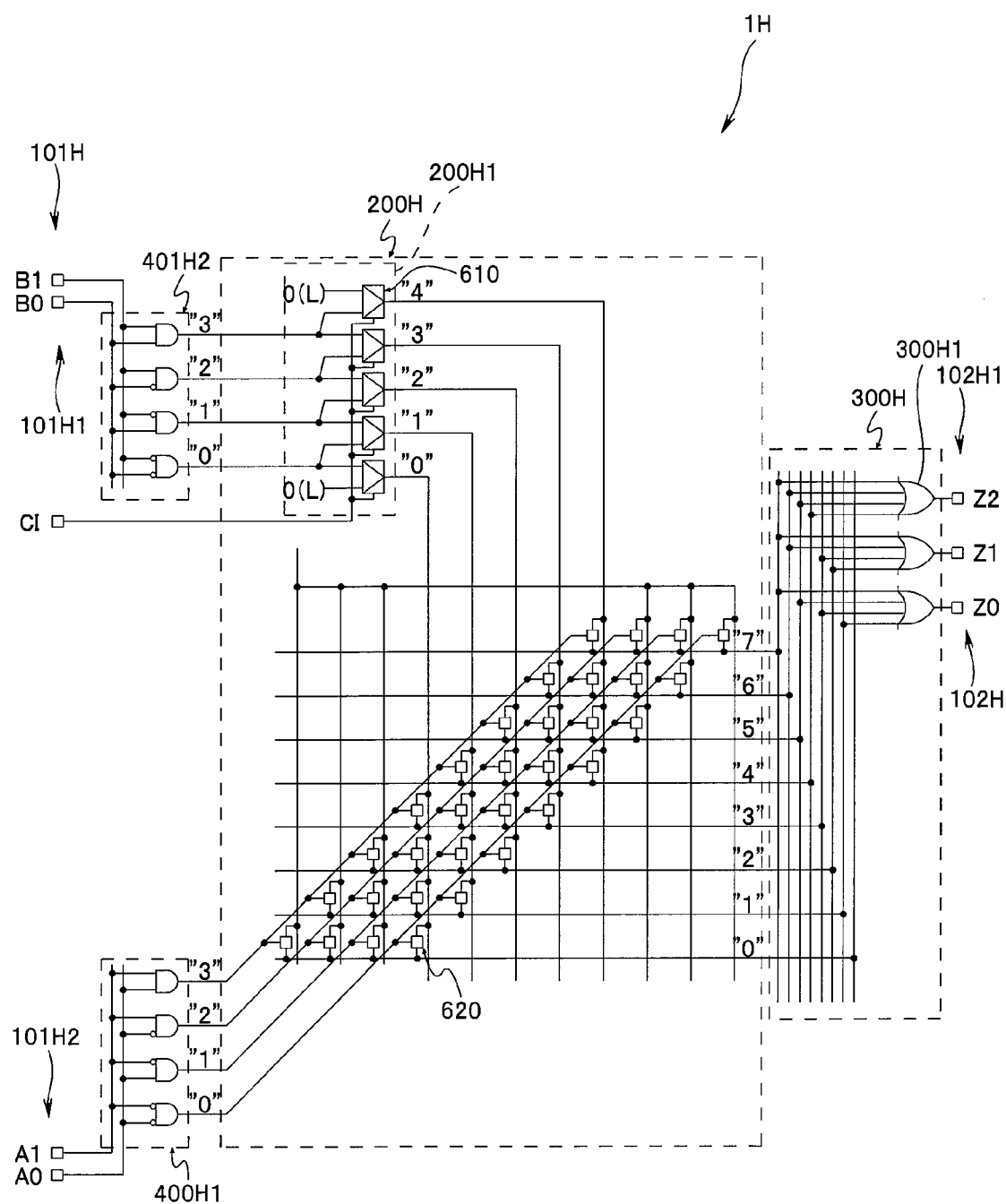
FIG. 16 is a block diagram showing the configuration of an adder according to an eighth embodiment of the present invention.

Next, description, based on FIG. 16, will be given in regard to the entire configuration of a logic circuit according to an eighth embodiment of the present invention. FIG. 16 is a block diagram showing the configuration of an adder according to the eighth embodiment. The adder of the present embodiment is an adder with a carry input.

The basic configuration of the adder of FIG. 16 includes a decoder, an interconnect network, and an encoder, as is similar to the basic configuration shown in FIG. 1.

An adder 1H of FIG. 16 includes an input portion 101H, a decoder 400H, an interconnect network 200H, an encoder 300H, and an output portion 102H. The input portion 101H includes two input portions 101H1 and 101H2 that include a pair of input terminals (A1, A0) and (B1, B0) respectively, each for inputting 2-bit input data A and B. The decoder 400H includes a decoder 400H-1 configured to convert the 2-bit data of the input terminal pair (A1, A0) of the input portion 101H1 into 4-bit data, and a decoder 400H-2 configured to convert the 2-bit data of the input terminal pair (B1, B0) of the input portion 101H2 into 4-bit data. The interconnect network 200H is configured to be input with 4-bit decode data from the decoder 400H-1, 4-bit decode data from the decoder 400H-2, and a carry input data CI, substitute the two 4-bit data (or four interconnects), output 4-bit data of an addition result to the encoder 300H, and also output 4-bit data, which is used for carrying, to the encoder 300H.

The encoder 300H is configured to convert input 4-bit data into 2-bit data, and also output a carry signal. The output portion 102H includes a pair of output terminals (Z1, Z0) for outputting the 2-bit data of the encoder 300H, and an output terminal (Z2) used for the carry signal. Two input data A and B, which are each 2-bit binaries, are input to the adder 1H, and the adder 1H adds together the two input data A and B, and outputs the resulting 2-bit binary output data and a carry signal output-data.

The decoder 400H-1 and the decoder 400H-2 of the decoder 400H are analogous to the decoder 400C-1 and the decoder 400C-2 of FIG. 5.

The interconnect network 200H includes a selector 200H1 that executes carry input processing, and has as input the four outputs from the decoder 400H-2. The selector H1 includes five selector circuits 610, and the first to four outputs of the decoder 400H-2 are each input to the input terminal of one end of four selector circuits 610 (the first through fourth selector circuits). A "0"(=L) signal is input to the input terminal of one end of the remaining selector circuit 610 (the fifth selector circuit). The "0"(=L) signal is input to the input terminal of the other end of the first selector circuit 610. Outputs "0", "1", "2", "3" of the first to fourth AND circuits of the decoder 400H-2 are input to the input terminal of the other end of the second to fifth selector circuits 610. The output of the first to fifth selector circuits 610 of the selector 200H1 is set to "0", "1", "2", "3", "4". According to the above configuration, in a case in which there is a carry input, the selector 200H1 changes five outputs in a manner such that 1 will be added to the output.

Data of eleven signal lines including the five outputs of the selector 200H1 and six outputs of the "0"(=L) signal, and 4-bit data from the decoder 400H-1, are input to the interconnect network 200H. As shown in FIG. 16, these eleven signal lines, and eight signal lines through which 8-bit data is output to the encoder 300H, are arranged in a matrix. The output of the interconnect network 200H is "0", "1", "2", "3", "4", "5", "6", "7".

As shown in FIG. 16, a connection element 620 is provided at each intersection point of the matrix and is configured to set into connection or disconnection the eleven signal lines and the eight output lines to the encoder 300H. As shown in FIG. 16, the connection elements 620 are not provided at all of the intersection points. The connection elements 620 are analogous to the connection elements 620 of FIG. 5, and include two data terminals, and one control input terminal that controls the connection and disconnection of the two data terminals. There is connected to the control input terminal a signal line from the decoder 400H-1. That is, decoded data of the input data A that was input to the input terminals (A1, A0) of the input portion 101H is input to each control input terminal. In other words, the interconnect network 200H including the connection elements 620 executes addition of a result that has underwent carry processing in the selector 200H1 and a result decoded in the decoder 400H-1.

As shown in FIG. 16, in a case in which the eleven signal lines are aligned in order from the first to the eleventh signal line, the first to the third signal lines are "0"(=L) signal lines. The fourth to eighth signal lines are signal lines corresponding to the output "0", "1", "2", "3", "4" of the first to fifth selector circuits 610 of the selector 200H1. The ninth to eleventh signal lines are "0"(=L) signal lines.

As shown in FIG. 16, there is provided a connection element 620 at the intersection point of each of the eight outputs "0", "1", "2", "3", "4", "5", "6", "7" to the encoder 300H and the four signal lines out of the eleven signal lines.

Provided at each of the intersection points of the first output line and the first to fourth signal lines is a connection element 620. Provided at each of the intersection points of the second output line and the second to fifth signal lines is a connection element 620. There is provided a connection element 620 at each of other interconnections as well.

That is, there is provided at each of the intersection points of the n-th output line and the n-th to (n+3)-th signal lines is a connection element 620. Moreover, in the case of FIG. 16, n denotes 1 to 8.

Then, the fourth output "3" of the decoder 400H-1 is connected to the control input terminal of the connection element 620 provided at each intersection point of the n-th output line and the n-th signal line. The third output "2" of the decoder 400H-1 is connected to the control input terminal of the connection element 620 provided at each intersection point of the n-th output line and the (n+1)-th signal line. The second output "1" of the decoder 400H-1 is connected to the control input terminal of the connection element 620 provided at each intersection point of the n-th output line and the (n+2)-th signal line. The first output "0" of the decoder 400H-1 is connected to the control input terminal of the connection element 620 provided at each intersection point of the n-th output line and the (n+3)-th signal line.

The eight outputs of the interconnect network 200H are input to the encoder 300H.

The encoder 300H includes a configuration identical to the configuration of the encoder 300B of FIG. 4. Moreover, as shown in FIG. 16, the encoder 300H includes an OR circuit 300H1 that is input with the signals of four carry signal lines.

Each output of a first OR circuit and a second OR circuit is connected to the two output terminals (Z1, Z0) that output the addition result. A second, a fourth, a sixth, and an eighth output are each connected to the four inputs of the first OR circuit, respectively. A third, the fourth, a seventh, and the eighth outputs are each connected to the four inputs of the second OR circuit, respectively.

The output of the third OR circuit 300H1 are connected to the output terminal (Z2) that outputs the carry result. A fifth, a sixth, the seventh, and the eighth outputs are each connected to the four inputs of the second OR circuit 300H1, respectively.

According to configuration in the above manner, one of the five values from 0 to 4 is taken as a result of carrying being executed in the selector 200H1. Also, since the output of the decoder 400H-1 takes one of the four values from 0 to 3, it is possible to take one of the eight values from 0 to 7 as the addition result thereof. Therefore, the output of the interconnect network 200H becomes eight output lines, and operation occurs in which one of the eight output lines becomes "1" (=H) and the remaining output lines become "0"(=L).

For example, in a case in which the input A is 2, the input B is 3, and the carry input CI is 0, the "3" output of the outputs of the selector 200H1, which is a carry processing circuit, becomes H, and the remaining outputs of the selector 200H1 become L. Among the plurality of the connection elements 620, only those each of whose control inputs is connected to the output "2" of the decoder 400H-1 assume a conductive state. Therefore, only the output "5" of the interconnect network 200H becomes H, while the remaining outputs become L. According to the kind of operation described herein above, only data that has been subject to addition operation is output from the interconnect network 200H and input to the encoder 300H. The encoder 300H encodes the input data, and in the case of this example, outputs a binary 101. According to the kind of operation described herein above, it is possible to realize addition processing.

Moreover, although in the circuits of FIGS. 12 to 15 there were included an addition result output line and a carry output line, the adder of the present embodiment is configured in a manner in which the addition result output line and the carry output line are not respective exclusive-use output lines.

The adder 1H configured in this manner is a logic circuit that realizes the same function as in FIG. 13 while including a carry input. Also, in the present embodiment as well, the fluctuation of the electrical power consumption is suppressed regardless of carry adding since only one of the plurality of output lines of the interconnect network become H.

In the above manner, the decode data of input B and the carry data are input to the plurality of the selector circuits of the above described interconnect network 200H, and a carrying data is generated. The carrying data is input to the terminal of one end of the plurality of connection elements 620, and a plurality of output lines to the encoder 300H are connected to the terminals of the other end of the plurality of connection elements 620. Moreover, according to inputting decode data of the input data A into each of the control input terminals of the plurality of connection elements 620 as the control input, substitution of the bit position of the decode data of the input B is executed in the interconnect network 200H.

Therefore, with using the decoder 400H, the interconnect network 200H, and the encoder 300H as shown in FIG. 16, it is possible to realize an adder with a carry input. At this time, the number of signals of the outputs of the decoder 400H-1 and the decoder 400H-2 that are H are always the same, that is, one, and even on the interconnect network 200H the number of signals that are H will be one regardless of the kind of input. Therefore, the fluctuation of the electrical power consumption in the adding with a carry input is suppressed regardless of the value of the input data.

Ninth Embodiment

Figure 17:
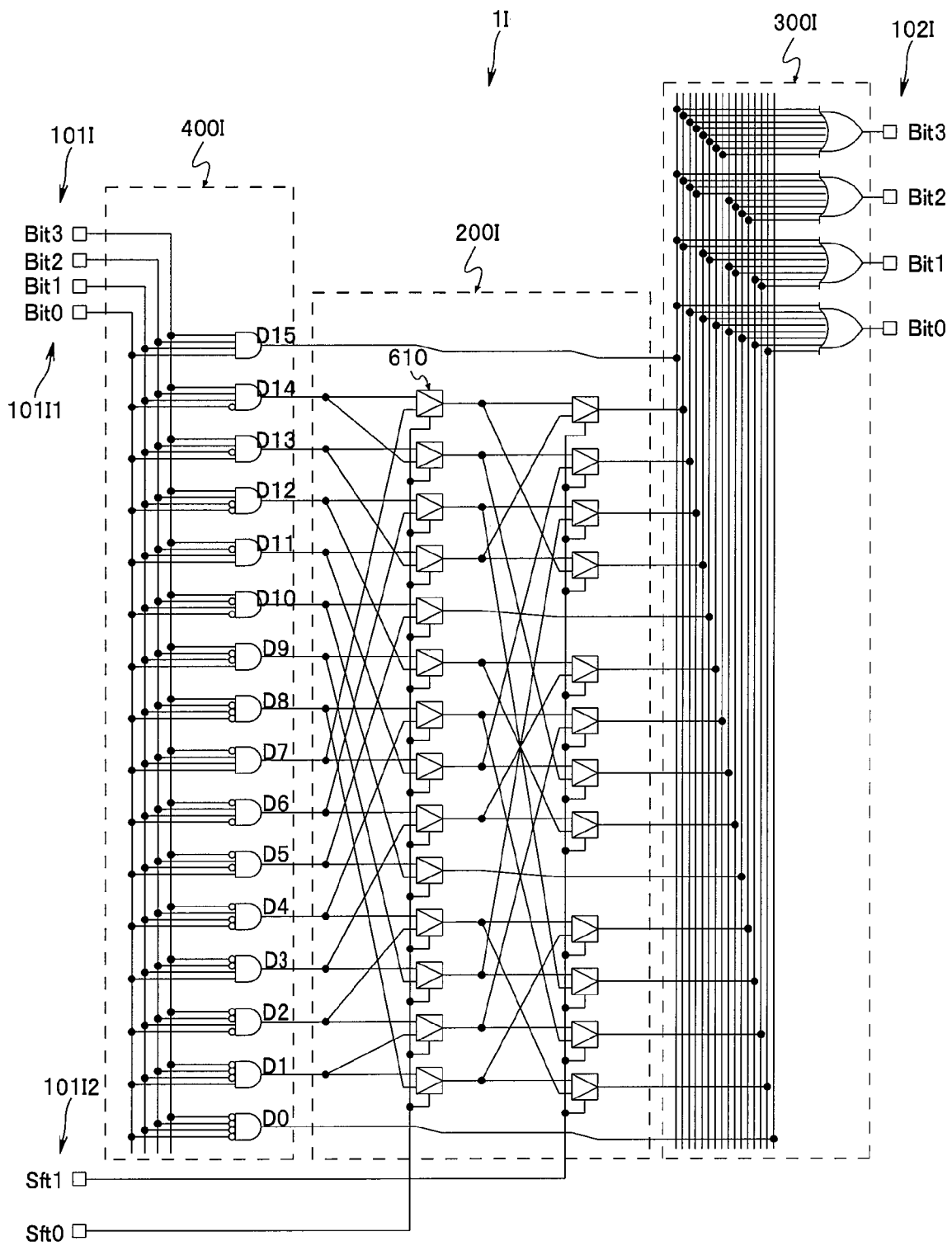
FIG. 17 is a block diagram showing the configuration of a cyclic shifter according to a ninth embodiment of the present invention.

Next, description, based on FIG. 17, will be given in regard to the entire configuration of a logic circuit according to a ninth embodiment of the present invention. FIG. 17 is a block diagram showing the configuration of a cyclic shifter according to the ninth embodiment.

The basic configuration of the cyclic shifter of FIG. 17 includes a decoder, an interconnect network, and an encoder, as is similar to the basic configuration shown in FIG. 1. A cyclic shifter 1I of FIG. 17 includes an input portion 101I, a decoder 400I, an interconnect network 200I, an encoder 300I, and an output portion 102I. The cyclic shifter 1I is an example of a circuit that right shifts 4-bit binary input data from any of 0 to 3-bit.

The input portion 101I includes an input portion 101I1 including four input terminals (Bit0, Bit1, Bit2, Bit3) for inputting 4-bit input data, and an input portion 101I2 including two input terminals (Sft0, Sft1). The decoder 400I is a decoder that converts 4-bit data of the four input terminals (Bit0, Bit1, Bit2, Bit3) of the input portion 101I1 into 16-bit data, based on the input data of the input portion 101I2. The interconnect network 200I inputs the 4-bit decode data from the decoder 400I and 2-bit shift quantity data from the input portion 101I2, executes substitution of the 16-bit data (or 16 interconnects), and outputs 16-bit data. The encoder 300I converts the input 16-bit data into 4-bit data, and outputs to the output portion 102I. The output portion 102I has four output terminals (Bit0, Bit1, Bit2, Bit3) for outputting the 4-bit data of the encoder 300I. 4-bit binary input data and 2-bit shift quantity data are input to the cyclic shifter 1I, and the cyclic shifter 1I outputs 16-bit binary output data shifted according to the input shift quantity.

Here, the decoder 400I includes sixteen AND circuits, and provided on the input terminals of the sixteen AND circuits is an inverter circuit, so that for each of sixteen respective values (0 to 15) expressed in 4-bit, an output is put out only from one AND circuit. The decoder 400I generates a 16-bit output from a 4-bit input. The output of each of the AND circuits of the decoder 400I is connected to a corresponding input terminal of the interconnect network 200I. Each output of the interconnect network 200I is connected to each input terminal of the encoder 300I.

In FIG. 17, for example, a first AND circuit having four inverter circuits provided, respectively, on four input terminals is configured in a manner so that when the 4-bit input data is (0, 0, 0, 0), an output is put out only on an output terminal D0 of the decoder 400I. A second AND circuit having three inverter circuits are provided, respectively, on three input terminals is configured in a manner so that when the 4-bit input data is (0, 0, 0, 1), an output is put out only on an output terminal D1 of the decoder 400I. In the same manner, an AND circuit having no inverter circuits on its input is provided in a manner so that when the 4-bit input data is (1, 1, 1, 1), an output is only put out on an output terminal D15 of the decoder 400I. That is, on the output of the decoder 400I, only one of the interconnects (that is, outputs) will become active (or H which denotes a logic value of 1, in this example).

The interconnect network 200I is an interconnect network including a plurality of selector circuits 610. The 200I includes a two stage selector. A first stage selector includes fourteen selector circuits 610. A second stage selector includes twelve selector circuits 610.

Moreover, the output of the first output terminal D0 of the decoder 400I is input to the first input terminal of the 200I, and is output as is from the first output terminal. In the same manner, the output of the sixteenth output terminal D15 of the decoder 400I is input to the fifteenth input terminal of the 200I and is output as is from the fifteenth output terminal.

Each of the selector circuits 610 includes two inputs (input 1 and input 2), one control input, and one output. Each of the selector circuits 610 outputs passing one of either the input 1 or the input 2 to the output terminal in response to the control input. In FIG. 17, in a case in which the control input is 0, the input 1 of the upper side of each of the selector circuits 610 is output from the output terminal, and in a case in which the control input is 1, the input 2 of the lower side of each of the selector circuits 610 is output from the output terminal.

Then, fourteen data from the second to fifteenth AND circuits of the decoder 400I are input to the input terminal of one end of the fourteen first stage selector circuits 610 (from the first to the fifteenth selector circuits). Fourteen data from each of the ninth, second, tenth, third, eleventh, fourth, twelfth, fifth, thirteenth, sixth, fourteenth, seventh, fifteenth, and eighth AND circuits are input to the input terminal of the other end of the first stage selector circuits 610 (from the second to the fifteenth selector circuits). An input data Sft0 is input to the control input terminal of each of the fourteen first stage selector circuits 610 as the control input.

Therefore, in a case in which the Sft0 is 0, each of the outputs of the decoder 400I is output, and in the case in which the Sft0 is 1, the outputs "D0", "D8", "D1", "D9", "D2", "D10", "D3", "D11", "D4", "D12", "D5", "D13", "D6", "D14", "D7", "D15" of the output terminal of the decoder 400I are each output.

The twelve outputs from the twelve first to fourth, sixth to ninth and eleventh to fourteenth first selector circuits 610, respectively, are input to the input terminals of the one end of the twelve first to fourth, the fifth to eighth, and the ninth to twelfth second stage selector circuits 610.

The twelve outputs from the twelve fourth, eighth, twelfth, first, ninth, thirteenth, second, sixth, fourteenth, third, seventh, and eleventh first stage selector circuits 610, respectively, are input to the input terminals of the other end of the twelve first to fourth, the fifth to eighth, and the ninth to twelfth second stage selector circuits 610.

Moreover, the output of the fifth selector circuit 610 of the first stage is connected, as is, to the sixth output terminal of the interconnect network 200I. In the same manner, the output of the tenth selector circuit 610 of the first stage is connected, as is, to the eleventh output terminal of the interconnect network 200I.

The outputs of the twelve first to fourth, fifth to eighth, and ninth to twelfth second stage selector circuits 610 are each connected, respectively, to the second to fifth, seventh to tenth, and twelfth to fifteenth output terminals of the interconnect network 200I. The input data Sft1 is input, as the control input, to each of the control input terminals of the twelve second stage selector circuits 610.

The interconnect network 200I includes a two stage selector. The first stage selector is a selector for switching between a 1-bit shift and no shift. The second stage selector is a selector for switching between a 2-bit shift and no shift. According to these two selectors, it is possible to realize a 0 to 3 bit shift of input data.

FIG. 18 is a table showing the input and result of when the binary input data has been shifted. The first selector of FIG. 17 is a selector for realizing the 1-bit shift of this table, while the second stage selector is a selector for realizing the 2-bit shift of this table.

Moreover, in FIG. 17, although the shift quantity (the control input to the selector) uses a value that has not been decoded, realization is also possible with a configuration using an interconnect network including the connection elements 620 and wherein the shift quantity uses a decoded value.

The encoder 300I is input with signals from sixteen output terminals of the interconnect network 200I, and outputs 4-bit data from the output portion 102I including the four output terminals (Bit0, Bit1, Bit2, Bit3).

The encoder 300I includes the first to the fourth OR circuits. The second, fourth, sixth, eighth, tenth, twelfth, fourteenth, and sixteenth output terminals of the interconnect network 200I are connected to the eight input terminals of the first OR circuit. The third, fourth, seventh, eighth, eleventh, twelfth, fifteenth, and sixteenth output terminals of the interconnect network 200I are connected to the eight input terminals of the second OR circuit. The fifth to eighth, and the thirteenth to sixteenth output terminals of the interconnect network 200I are connected to the eight input terminals of the third OR circuit. The ninth to sixteenth output terminals of the interconnect network 200I are connected to the eight input terminals of the fourth OR circuit. The outputs of the first, second, third, and fourth OR circuits are respectively connected to four output terminals (Bit0, Bit1, Bit2, Bit3).

With using this kind of configuration, it is possible to realize cycle shifting functionality that right shifts a 4-bit binary from 0 to 3 bits.

In the above manner, a shift quantity data other than the input data B is input, as the control input, to each of the control input terminals of the plurality of selector circuits 610 of the above described interconnect network 200I. As a result, the output of the plurality of selector circuits 610 to which the decode data of input B has been input is changed, and substitution of the bit position of the decode data of the input B is executed on the interconnect network 200I.

Thus, with using the decoder 400I, the interconnect network 200I, the encoder 300I as shown in FIG. 17, it is possible to realize a cyclic shifter circuit. At this time, in the output of the decoder 400I the number of signals that are H is always the same, that is, one, and even on the interconnect network 200I the number of signals that are H will be one regardless of the kind of input. Therefore, the fluctuation of the electrical power consumption in the cyclic shift processing is suppressed regardless of the value of the input data.

Tenth Embodiment

Figure 19:
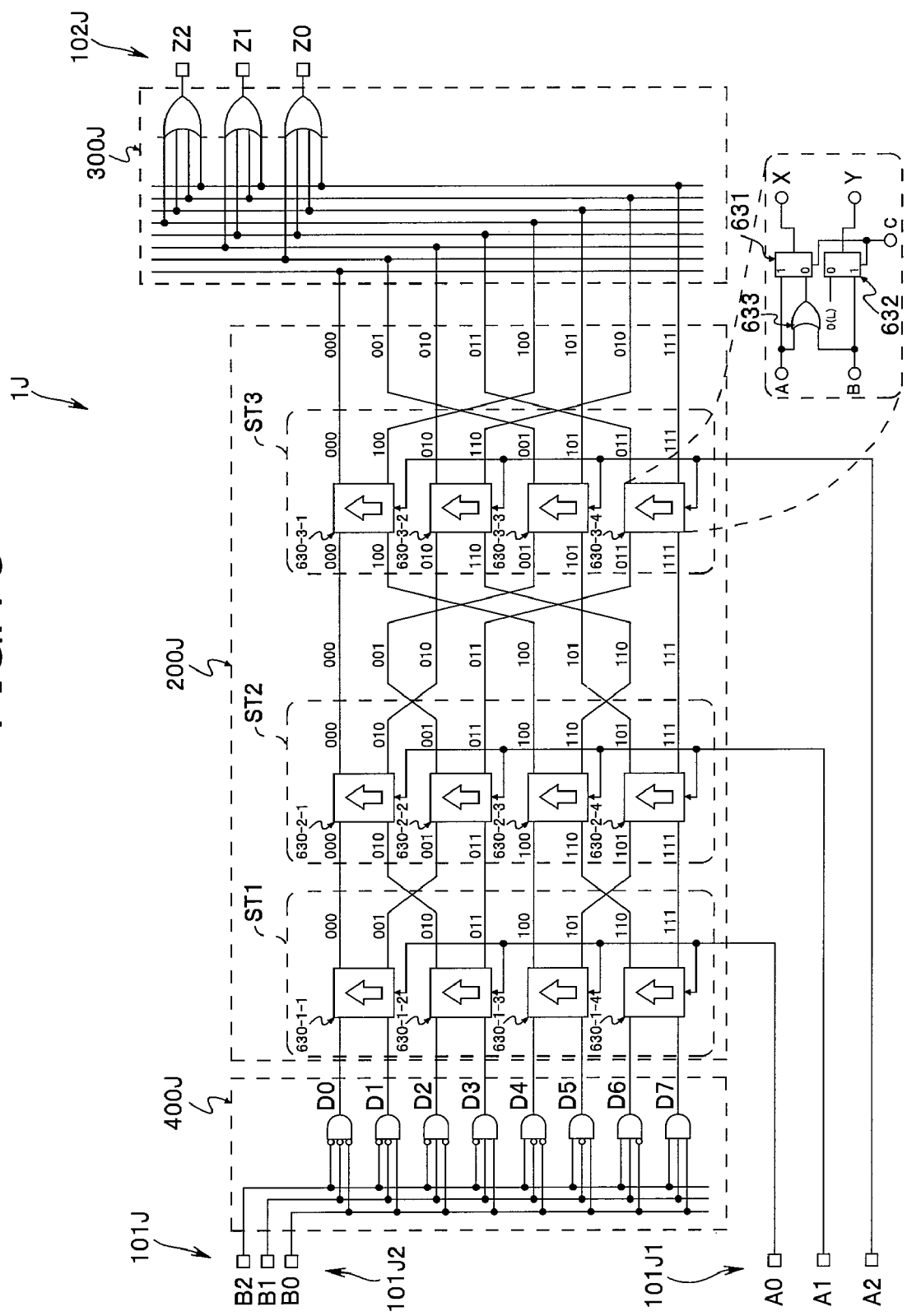
FIG. 19 is a block diagram showing the configuration of an AND circuit according to a tenth embodiment of the present invention.

Next, description, based on FIG. 19, will be given in regard to the entire configuration of a logic circuit according to a tenth embodiment of the present invention. FIG. 19 is a block diagram showing the configuration of an AND circuit according to the tenth embodiment.

The basic configuration of the AND circuit of FIG. 19 includes, in the same manner as the basic configuration shown in FIG. 1, the decoder, the interconnect network, and the encoder. An AND circuit 1J of FIG. 19 includes an input portion 101J, a decoder 400J, an interconnect network 200J, an encoder 300J, and an output portion 102J. The AND circuit 1J is an example of a circuit that takes the logical conjunction of two three-digit input data.

In a logic conjunction (AND) circuit, since a plurality of input conditions exist with respect to an output result, realization is not possible with a simple bit substitution. For example, in a case in which an input 1 is 01 and an output is 00, 10 or 00 can be had as an input 2. Therefore, substitution of interconnect dependant on both the input 1 and the input 2 becomes necessary.

The AND circuit 1J of FIG. 19 includes input portions 101J1 and 101J2 each including to input terminals (A2, A1, A0), (B2, B1, B0), respectively, for inputting 3-bit input data, the decoder 400J that converts the 3-bit data from the input portion 101J2 into 8-bit data, the interconnect network 200J that executes conversion that substitutes the 8-bit data (or interconnect), the encoder 300J that converts 8-bit data into 3-bit data, and the output portion 102J that includes three output terminals (Z2 to Z0) for outputting the 3-bit data of the encoder 300J. The two input data A and B, which are each 3-bit binaries, are input to the AND circuit 1J, and the AND circuit 1J outputs 3-bit binary output data.

The decoder 400J is configured in a manner identical to the decoder 400A of FIG. 2. Therefore, only one of the interconnects (that is, outputs) becomes active (H which denotes the logic value 1, in this example) in the output of the decoder 400J. The output of each AND circuit of the decoder 400J is connected to a corresponding input terminal of the interconnect network 200J. Each output of the interconnect network 200J is connected to each input terminal of the encoder 300J.

The encoder 300J is also configured in a manner identical to the encoder 300A of FIG. 2.

The interconnect network 200J, which realizes the AND functionality, is configured by connecting multiple stages of data dependant switches 630 with one another, which execute data substitution dependant on the input data and the control input signal.

The interconnect network 200J includes first, second and third stages. Included at each stage are four data dependant switches 630. The data dependant switch 630 includes two input terminals, two output terminals, and one control input terminal for use with two inputs, two outputs, and one control input. In a case in which the control input, which is the control signal, is 1, the data dependant switch 630 outputs the input data as is and without substituting it, in a manner in which the upper side input is output from the upper side output, and the lower side input is output from the lower side output. In a case in which the control input is 0, data is substituted dependant on the input data. That is, in a case in which there is a 1 in the data, substitution will be executed in a manner outputting to the output terminal of the upper side while the output terminal of the lower side becomes 0.

The eight outputs from the decoder 400J are input to eight input terminals of the four data dependant switches 630 of the first stage. The eight outputs of the four data dependant switches 630 of the first stage are input through an interconnect portion to eight input terminals of the four data dependant switches 630 of the second stage. Moreover, the eight outputs of the four data dependant switches 630 of the second stage are input through an interconnect portion to eight input terminals of the four data dependant switches 630 of the third stage. On the interconnect network 200J, although the first to eighth input terminals are each connected to the first to eighth output terminals, substitution of a portion of the interconnect is executed as is described next.

The interconnect of the interconnect portion between the first and second stage includes a first interconnect substitution portion. More specifically, as shown in FIG. 19, interconnect is substituted in a manner in which the output terminal of the lower side of a first data dependant switch 630-1-1 of the first stage is connected to the input terminal of the upper side of the second data dependant switch 630-2-2 of the second stage, the output terminal of the upper side of the second data dependant switch 630-1-2 of the first stage is connected to the input terminal of the lower side of the first data dependant switch 630-2-1 of the second stage, the output terminal of the lower side of the third data dependant switch 630-1-3 of the first stage is connected to the input terminal of the upper side of the fourth data dependant switch 630-2-4 of the second stage, and the output terminal of the upper side of the fourth data dependant switch 630-1-4 of the first stage is connected to the input terminal of the lower side of the third data dependant switch 630-2-3 of the second stage.

The interconnect of the interconnect portion between the second and third stage includes a second interconnect substitution portion. More specifically, as shown in FIG. 19, interconnect is substituted in a manner in which the output terminal of the lower side of a first data dependant switch 630-2-1 of the second stage is connected to the input terminal of the upper side of the second data dependant switch 630-3-2 of the third stage, the output terminal of the upper side of the second data dependant switch 630-2-2 of the second stage is connected to the input terminal of the upper side of the third data dependant switch 630-3-3 of the third stage, the output terminal of the lower side of the second data dependant switch 630-2-2 of the second stage is connected to the input terminal of the upper side of the fourth data dependant switch 630-3-4 of the third stage, the output terminal of the upper side of the third data dependant switch 630-2-3 of the second stage is connected to the input terminal of the lower side of the first data dependant switch 630-3-1 of the third stage, and the input terminal of the lower side of the third data dependant switch 630-2-3 of the second stage is connected to the input terminal of the lower side of the second data dependant switch 630-3-2 of the third stage, the input terminal of the upper side of the fourth data dependant switch 630-2-4 of the second stage is connected to the input terminal of the lower side of the third data dependant switch 630-3-3 of the fourth stage.

Moreover, the eight outputs of the four data dependant switches 630 of the third stage are connected to the first to eighth input terminals of the encoder 300J. At this time, as shown in FIG. 19, the interconnect in between the encoder 300J and the four data dependant switches 630 of the third stage of the interconnect network 200J include a third interconnect substitution portion in a manner such that the first to eighth output terminals of the four data dependant switches 630 of the third stage are connected to the first, fifth, third, seventh, second, sixth, fourth, and eighth input terminals of the encoder, respectively.

The data dependant switch 630, as shown in FIG. 19, includes two selectors 631 and 632, and one OR circuit. An upper side input terminal (A) and a lower side input terminal (B) are each connected to an input terminal (1) of one end of the two selectors 631 and 632, and two input terminals of the OR circuit 633. The output terminal of the OR circuit 633 is connected to the input terminal (0) of the other end of the first selector 631, and the "0"(=L) is input to the input terminal (0) of the other end of the second selector 632. Connected thereto the two selectors 631 and 632 is a control input terminal (C). The output of the two selectors 631 and 632 are connected to an upper side and a lower side output terminal (X) and (Y), respectively.

The A0 of the input portion 101J1 is input to each of the control input terminals of the four data dependant switches 630 of the first stage, the A1 of the input portion 101J1 is input to each of the control input terminals of the four data dependant switches 630 of the second stage, and the A2 of the input portion 101J1 is input to each of the control input terminals of the four data dependant switches 630 of the third stage.

Next, description using an example will be given in regard to operation of the logic circuit of FIG. 19.

Description of the operation will be carried out using a case in which the input A=010, and the input B=011. Since B=011, the output of the decoder 400J is 00010000. That is, only D3 is H, and the remaining signals are L. To the data dependant switch 630-1-2, 0 is input to the input terminal of the upper side, 1 is input to the input terminal of the lower side, and 0 is input to the control input terminal. Since the control input is 0(=A0), data is substituted in a manner dependant on the input data. Since one of the data is 1, that data is output to the output terminal of the upper side, and 0 is output to the output terminal of the lower side.

Therefore, the output of the first stage becomes 00100000 (=010), which results from AND operation of the lowest-order bit thereof and the lowest-order bit of the A. Although processing in the same manner is executed on the second stage as well, since the control input is 1 (=A1), output is conducted no conversion of low and high. In the third stage, H is input to the input terminal of the upper side of the data dependant switch 630-3-2, and L is input to other input terminals. Although conversion is executed in a manner dependant on data since H is input to the input terminal of the upper side of the data dependant switch 630-3-2 and 0 is input to the control input, output occurs in a manner in which H arrives on the output of the upper side. Therefore, 00100000(=010) is input to the input of the encoder 300J and 010(=2) is output as the operational result of the logical conjunction.

With using the kind of configuration described above, it is possible to realize functionality of logical conjunction of each of the 3-bit binaries.

In the above described manner, it is possible to realize functionality of logical conjunction, by configuring in a manner in which only one of among the eight outputs of the decoder 400J, with respect to eight data inputs from 0 to 7, becomes H.

In the above manner, an input data other than the input data B is input as the control input, to the control input terminal of each of the plurality of data dependant switches 630 of the above described interconnect network 200J. As a result of this, the output of the plurality of data dependant switch 630 that have been input with the decode data of the input B is changed, and substitution of the bit position of the decode data of the input B is executed on the interconnect network 200J.

Therefore, with using the decoder 400J, the interconnect network 200J, and the encoder 300J of the kind shown in FIG. 19, it is possible to realize a logic circuit. At this time, in the output of the decoder 400J, the number of signals that are H is always the same, that is, one, and even on the interconnect network 200J the number of signals that are H will be one regardless of the kind of input. Therefore, the fluctuation of the electrical power consumption in the circuit-processing of the logic conjunction is suppressed regardless of the value of the input data.

Eleventh Embodiment

Figure 20:
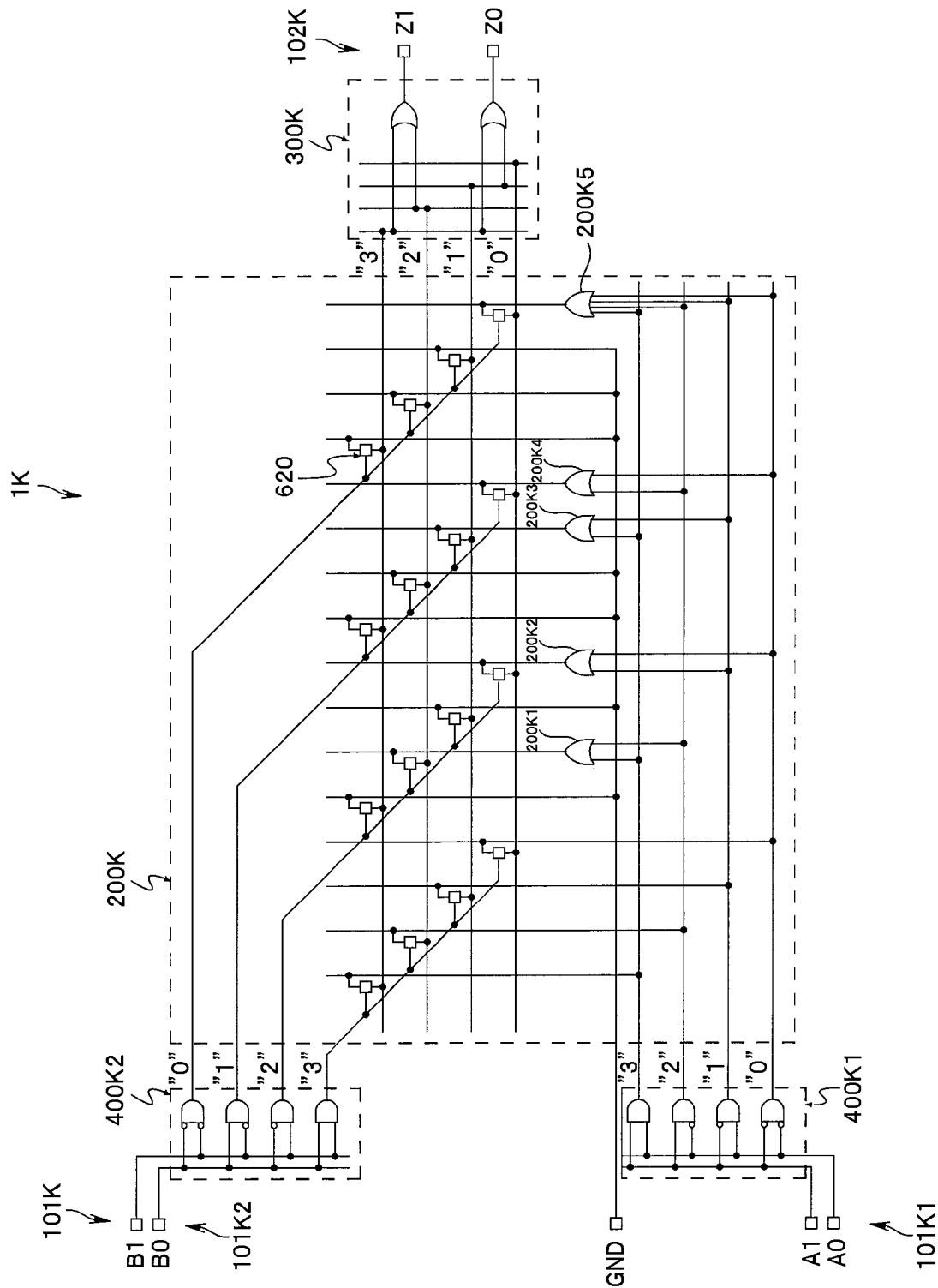
FIG. 20 is a block diagram showing the configuration of an AND circuit according to an eleventh embodiment of the present invention.

Next, description, based on FIG. 20, will be given in regard to the entire configuration of a logic circuit according to an eleventh embodiment of the present invention. FIG. 20 is a block diagram showing the configuration of an AND circuit according to the eleventh embodiment.

The basic configuration of the AND circuit of FIG. 20 includes, in the same manner as the basic configuration shown in FIG. 1, a decoder, an interconnect network, and an encoder. An AND circuit 1K of FIG. 20 includes an input portion 101K, a decoder 400K, an interconnect network 200K, an encoder 300K, and an output portion 102K. The AND circuit 1K is an example of a circuit that takes the logical conjunction of two two-bit input data.

The input portion 101K includes input portions 101K1 and 101K2 including plurality of (here, a pair of) input terminals (A1, A0), (B1, B0), respectively, for inputting 2-bit input data. The decoder 400K includes a decoder 400K-1 that converts the 2-bit data of one pair of input terminals (A1, A0) of the input portion 101K1 into 4-bit data, and a decoder 400K-2 that converts the 2-bit data of one pair of input terminals (B1, B0) of the input portion 101K2 into 4-bit data. The interconnect network 200K is input with 4-bit decode data from the decoder 400K-1 and 4-bit decode data from the decoder 400K-2, executes conversion that substitutes the two 4-bit data (or four interconnects), and outputs 4-bit data. The encoder 300K converts input 4-bit data to 2-bit data. The output portion 102K includes an output portion that includes a pair of output terminals (Z1, Z0) for outputting the 2-bit data of the encoder 300K. The two input data A and B, which are each 2-bit binaries, are input to the AND circuit 1K, and the AND circuit 1K takes the logical conjunction of the two input data A and B and outputs 2-bit binary output data.

The two decoders, the decoder 400K-1 and the decoder 400K-2, of the decoder 400K are configured in the same manner as the two decoders, the decoder 400C-1 and 400C-2 of FIG. 5. The output of each AND circuit of the decoder 400K is connected to a corresponding input terminal of the interconnect network 200K. Each output of the interconnect network 200K is connected to an input terminal of the encoder 300K.

Operation of the two decoders, the decoder 400K-1 and the decoder 400K-2, of FIG. 20 is identical to the operation of the decoder 400B described in FIG. 5, and thus description thereof is omitted here. Also, the encoder 300K is also identical to the encoder 300C described in FIG. 5, and thus description thereof is omitted here.

Two 4-bit data that have each been decoded, and, a ground potential (GND), are input to the interconnect network 200K. The interconnect network 200K includes a GND line connected to the electric potential (GND). As shown in FIG. 20, the GND line and 4-bit data signal lines from the decoder 400K-1 are converted to sixteen signal lines, as shown in FIG. 20. These sixteen signal lines, as well as four output lines to which 4-bit data is output to the encoder 300K, are arranged in a matrix formation. A connection element 620 is provided at each intersection point of the matrix and is configured to set into connection or disconnection the sixteen signal lines and the output lines to the encoder 300K. Each connection element 620 includes two data terminals and one control input terminal configured to control connection and disconnection of the two data terminals. Connected to the control input terminal is a signal line from the decoder 400K-2. That is, decoded data of the input data that was input to the input terminals (B1, B0) of the input portion 101K2 is input to each control input terminal of the connection elements 620.

As shown in FIG. 20, the first to fourth signal lines of the sixteen signal lines are connected, respectively, to the first to fourth outputs of the decoder 400K-1. The fifth to eighth signal lines of the sixteen signal lines are connected, respectively, to the GND line, the output of the OR circuit 200K1 which has the first and second outputs of the decoder 400K-1 as input, the GND line, and the output of the OR circuit 200K2 which has the third and fourth outputs of the decoder 400K-1 as input. The ninth to twelfth signal lines of the sixteen signal lines are connected, respectively, to the GND line, the GND line, the output of the OR circuit 200K3 which has the first and third outputs of the decoder 400K-1 as input, and the output of the OR circuit 200K4 which has the second and fourth outputs of the decoder 400K-1 as input. The thirteenth to sixteenth signal lines of the sixteen signal lines are connected, respectively, to the GND line, the GND line, the GND line, the output of the OR circuit 200K5 which has the first to fourth outputs of the decoder 400K-1 as input.

As shown in FIG. 20, when there is a matrix formed by the sixteen signal lines and the four output lines from the interconnect network 200K to the encoder 300K, four signal lines from the decoder 400K-2 are connected, respectively, to four control input terminals of four connection elements 620 located on each output line. More specifically, among the four signal lines from the decoder 400K-2, the first signal line is connected to four control inputs of the connection elements 620 connected to the first to fourth signal lines of among the sixteen signal lines. The second signal line of the decoder 400K-2 is connected to four control inputs of the connection elements 620 connected to the fifth to eighth signal lines of among the sixteen signal lines. The third signal line of the decoder 400K-2 is connected to four control inputs of the connection elements 620 connected to the ninth to twelfth signal lines of among the sixteen signal lines. The fourth signal line of the decoder 400K-2 is connected to four control inputs of the connection elements 620 connected to the thirteenth to sixteenth signal lines of among the sixteen signal lines.

With the AND circuit according to the above described configuration, in a case in which the input B is 00, the result of the interconnect network 200K will be 00 regardless of the input A. In a case in which the input B is 01 and the input A is 01 or 11, the result will be 01, and at all other times, the result will be 00. In a case in which the input B is 10 and the input A is 10 or 11, the result will be 10, and at all other times, the result will be 00. In a case in which the input B is 11, the input A will be output as-is.

In the above manner, according to using the decoder 400K, the interconnect network 200K, and the encoder 300K of the kind shown in FIG. 20, it is possible to realize a logic conjunction circuit.

At this time, the number of signals that become active on the interconnect network is always only one regardless of the kind of input, and the fluctuation of the electrical power consumption is suppressed.

Moreover, although here an AND circuit is shown, easy configuration of an OR circuit is also possible with the same method.

In the above manner, the decode data of the input A is input to terminals on one end of the plurality of the connection elements 620 of the above described interconnect network 200K, and the plurality of output lines to the encoder 300K are connected to terminals on the other end of the plurality of the connection elements 620. Moreover, by inputting the decode data of the input B to each of the control input terminals of the plurality of connection elements 620 as the control input, substitution of the bit position of the decode data of the input A is executed on the interconnect network 200K.

Therefore, with using the decoder 400K, the interconnect network 200K, and the encoder 300K of the kind shown in FIG. 20, it is possible to realize a logic conjunction circuit. At this time, in the output of the decoders 400K-1 and 400K-2, the number of signals that are H is always the same, that is, one, and even on the interconnect network 200K the number of signals that are H will be one regardless of the kind of input. Therefore, the fluctuation of the electrical power consumption in the processing of the logic conjunction is suppressed regardless of the value of the input data.

Twelfth Embodiment

Figure 21:
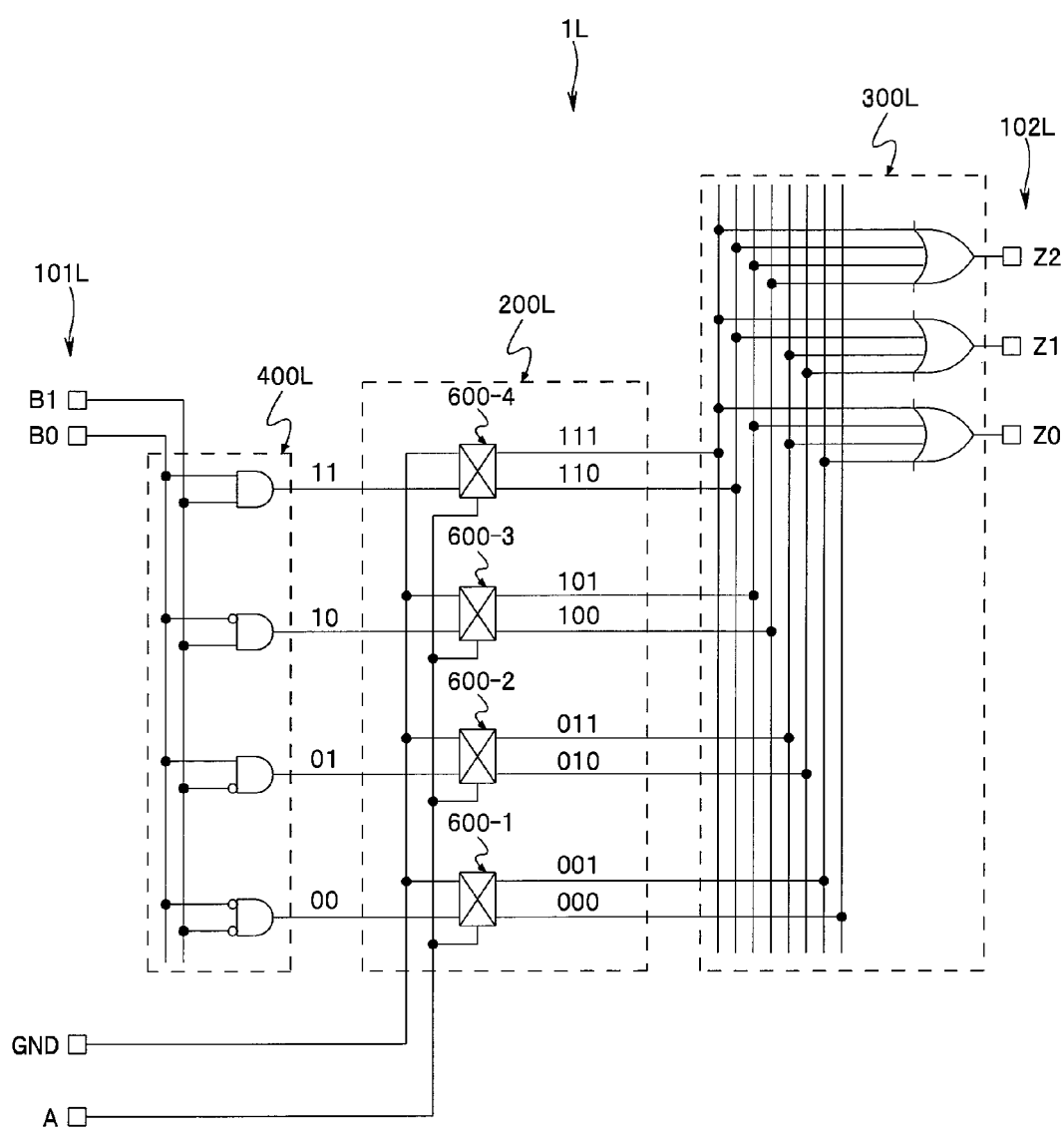
FIG. 21 is a block diagram showing the configuration of a lower-order bit adding circuit according to a twelfth embodiment of the present invention.

Next, description, based on FIG. 21, will be given in regard to the entire configuration of a logic circuit according to a twelfth embodiment of the present invention. FIG. 21 is a block diagram showing the configuration of a lower-order bit adding circuit according to the twelfth embodiment.

The basic configuration of the lower-order bit adding circuit of FIG. 21 includes, in the same manner as the basic configuration shown in FIG. 1, a decoder, an interconnect network, and an encoder. A lower-order bit adding circuit 1L of FIG. 21 includes an input portion 101L, a decoder 400L, an interconnect network 200L, an encoder 300L, and an output portion 102L. The lower-order bit adding circuit 1L is an example of a circuit that adds lower order bit data to 2-bit binary input data.

The input portion 101L includes two input portions having a pair of input terminals (B1, B0) for inputting 2-bit input data B, and an input terminal (A) for the purpose of inputting 1-bit input data. The decoder 400L converts the 2-bit data of the pair of input terminals (B1, B0) into 4-bit data. The interconnect network 200L is input with 4-bit decode data from the decoder 400L and 1-bit data of the input terminal A, executes conversion that substitutes the 4-bit data (or four interconnects) from the decoder 400L. The encoder 300L converts input 8-bit data to 3-bit data. The output portion 102L includes three output terminals (Z2, Z1, Z0) for outputting the 3-bit data of the encoder 300L.

Since the decoder 400L has the same configuration as the decoder 400B of FIG. 4, description thereof is omitted here. The outputs of the interconnect network 200L are connected to input terminals of the encoder 300L, respectively.

Here, the encoder 300L includes three OR circuits, and in order that the 3-bit data may be output with respect to the 8-bit data, the connection of each input terminal to each interconnect of output of the interconnect network 200L is mutually different in the three OR circuits.

The interconnect network 200L includes four selector circuits 600-1, 600-2, 600-3, and 600-4. Each of the selector circuits includes two input data (input 1 and input 2), one control input, and two output data (output 1 and output 2). Each of the selector circuits passes and outputs the input 1 and the input 2 to either of the outputs, output 1 and output 2, in response to the control input. In the case of FIG. 21, in a case in which the control input is 0, the two input data proceed straightly, and as a result of this, the input 1 is output from the output 1, and the input 2 is output from the output 2. In a case in which the control input is 1, the two input data will cross, and as a result of this, the input 1 is output from the output 2, and the input 2 is output from the output 1. In other words, each of the selector circuits 600 are circuits configured to change the state at which the two signals input to the two input terminals appear on the two output terminals, in response to the control input that is input to the control input terminal.

Then, in the first stage selector circuit 600-1, the output of the first AND circuit of the decoder 400L is connected to the input 1, and the GND line connected to the GND potential is connected to the input 2. The GND line connected to the GND potential is the logic value of 0 (L level). In the second selector circuit 600-2 the output of the second AND circuit of the decoder 400L is connected to the input 1, and the GND line connected to the GND potential is connected to the input 2. In the third selector circuit 600-3 the output of the third AND circuit of the decoder 400L is connected to the input 1, and the GND line connected to the GND potential is connected to the input 2. In the fourth selector circuit 600-4 the output of the fourth AND circuit of the decoder 400L is connected to the input 1, and the GND line connected to the GND potential is connected to the input 2. The control input terminal of each selector circuit is connected to the input terminal (A).

The output 1 and the output 2 of the first selector circuit 600-1 are connected, respectively, to the first and second input terminals of the eight input terminals of the encoder 300L. The output 1 and the output 2 of the second selector circuit 600-2 are connected, respectively, to the third and fourth input terminals of the eight input terminals of the encoder 300L. The output 1 and the output 2 of the third selector circuit 600-3 are connected, respectively, to the fifth and sixth input terminals of the eight input terminals of the encoder 300L. The output 1 and the output 2 of the fourth selector circuit 600-4 are connected, respectively, to the seventh and eighth input terminals of the eight input terminals of the encoder 300L.

In the encoder 300L, the second, fourth, sixth and eighth input terminals are connected, respectively, to the four input terminals of the first OR circuit. The third, fourth, seventh and eighth input terminals are connected, respectively, to the four input terminals of the second OR circuit. The fifth to eighth input terminals are connected, respectively, to the four input terminals of the third OR circuit. The output of the first OR circuit is connected to the output terminal (Z0), the output of the second OR circuit is connected to the output terminal (Z1), and the output of the third OR circuit is connected to the output terminal (Z2).

FIG. 21 shows a circuit configuration that realizes addition of a bit to a position below (the lower-order of) the input data. FIG. 21 shows a circuit having a function of adding a 1-bit data A to a position below the 2-bit data B. In a case in which 0 is added to the lower-order when the input B is 00, the output will be 000, and in a case in which 1 is added to the lower-order, the output will be 001.

The logic value 0 is input to the upper side input of each of the selector circuits 600, and the input A, which is an added bit, is input to the control input terminal of the selector circuit 600. In a case in which the input A is 0, the signals above and below the input side are not converted and output, as is, as the signals above and below the output side. In a case in which the input A is 1, the signals above and below the input side are converted and output as the signals above and below the output side. For example, in a case in which the input B is 00, in the output of the decoder 400L, only the output (00) of the first AND circuit is H, and other outputs are L. In the selector circuit 600-1, an H signal of the decoder 400L is input to only the input terminal of the lower side, and L is input to the upper side. In a case in which the input A is input to the control input of the selector circuit 600-1 and the input A is 0, H is output to the lower side of the output side, and in a case in which the input A is 1, H is output to the upper side of the output side. That is, in a case in which input A is 0, the output terminal (000) of the lower side of the selector circuit 600-1 becomes H, and in a case in which the input A is 1, the output terminal 001 of the upper side of the selector circuit 600-1 becomes H.

In the above manner, lower-order bit adding is possible according to the circuit shown in FIG. 21.

Also, in the outputs of the decoder 400L and the interconnect network 200L, the number of signals that are H is always the same, that is, one, and therefore, fluctuation of the electrical power consumption occurring in the bit addition operation can be suppressed regardless of the value of the input data.

Figure 22:
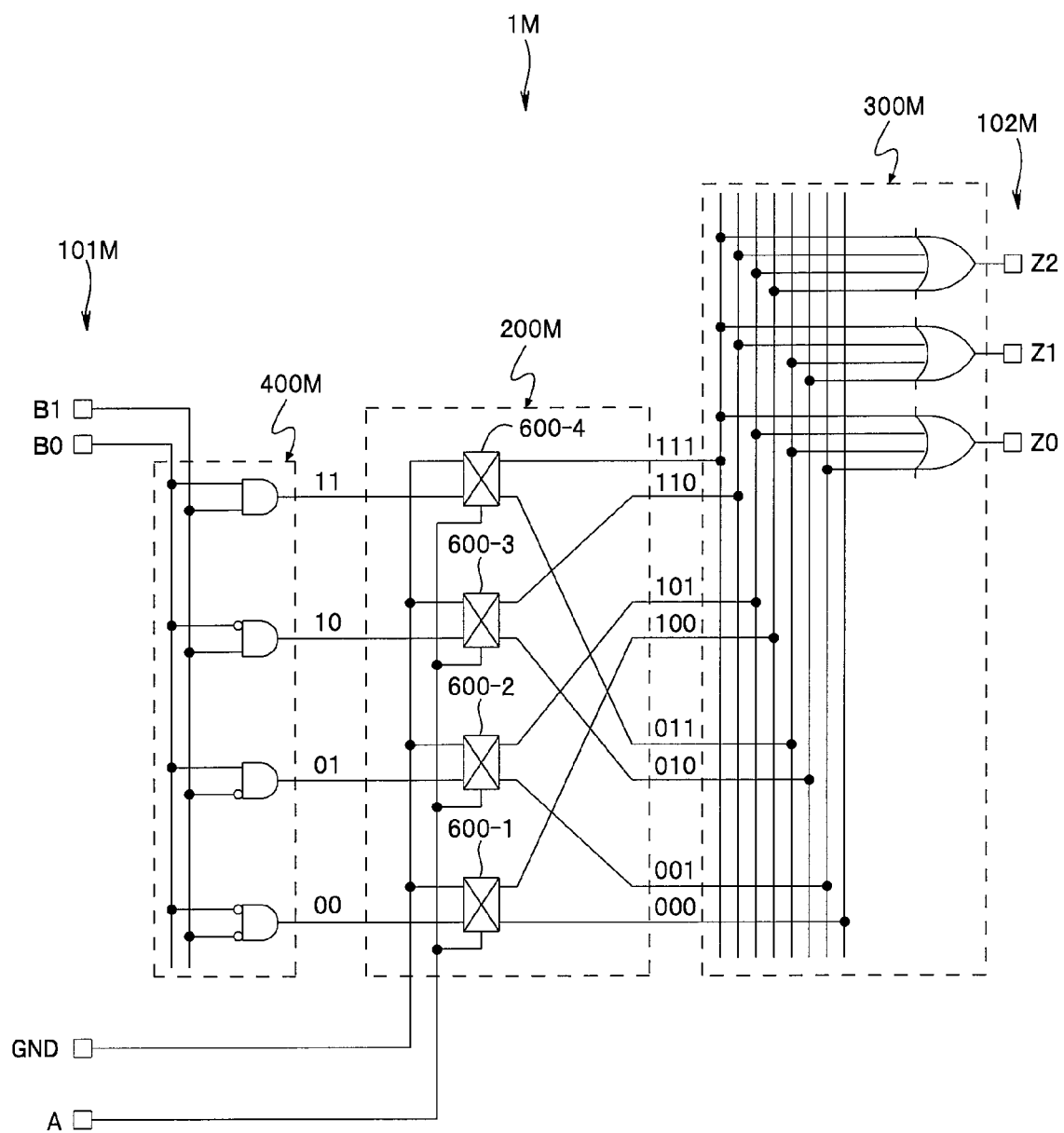
FIG. 22 is a block diagram showing an example of the configuration of a higher-order bit adding circuit according to the twelfth embodiment of the present invention.

Moreover, although FIG. 21 shows a lower-order bit adding circuit that adds a lower-order bit to the input data, with such configuration as that of the circuit of FIG. 22, it is possible to realize a higher-order bit adding circuit that adds a higher-order bit to the input data. FIG. 22 is a circuit showing a configuration example of the higher-order bit adding circuit.

In the circuit of FIG. 22, a point of difference with that of FIG. 21 is just the relationship of connection between the output terminal of an interconnect network 200M and the input terminal of a encoder 300M. Therefore, an input portion 101M, a decoder 400M, the interconnect network 200M, the encoder 300M, and an output portion 102M are configured in the same manner as the input portion 101L, the decoder 400L, the interconnect network 200L, the encoder 300L, and the output portion 102L of FIG. 21.

The output 1 and the output 2 of the first selector circuit 600-1 of the interconnect network 200M are connected, respectively, to the first and the fifth input terminals of the eight input terminals of the encoder 300L. The output 1 and the output 2 of the second selector circuit 600-2 are connected, respectively, to the second and sixth input terminals of the eight input terminals of the encoder 300L. The output 1 and the output 2 of the third selector circuit 600-3 are connected, respectively, to the third and seventh input terminals of the eight input terminals of the encoder 300L. The output 1 and the output 2 of the fourth selector circuit 600-4 are connected, respectively, to the fourth and eighth input terminals of the eight input terminals of the encoder 300L.

By configuring in the above manner, higher-order bit addition is possible.

In the above manner, the decode data of the input B and the electric ground potential (GND) are input to the plurality of the selector circuits 600 of the above described interconnect networks 200L and 200M. By inputting the input data A as a control input, which is separate from the input data B, into each of the control input terminals of the plurality of selector circuits 600, the plurality of selector circuits 600 execute substitution of the bit position of the bit data of the decode data of the input B.

Therefore, with using the decoders 400L and 400M, the interconnect networks 200L and 200M, and the encoders 300L and 300M of the kind shown in FIGS. 21 and 22, it is possible to realize a bit addition circuit. At this time, in the output of the decoders 400L and 400M, the number of signals that are H is always the same, that is, one, and even on the interconnect networks 200L and 200M the number of signals that are H will be one regardless of the kind of input. Therefore, the fluctuation of the electrical power consumption in the processing of the bit addition is suppressed regardless of the value of the input data.

Thirteenth Embodiment

Figure 23:
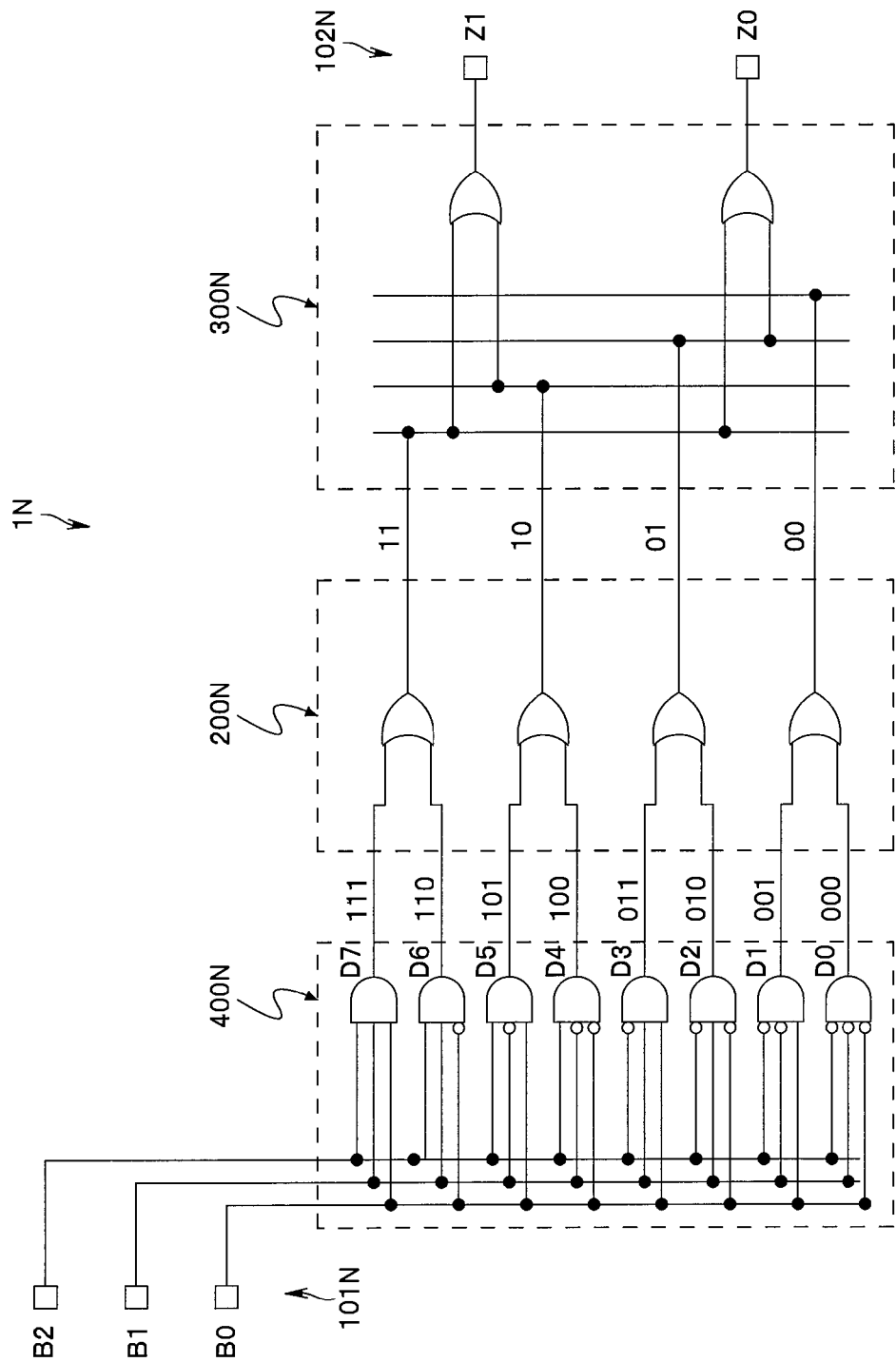
FIG. 23 is a block diagram showing the configuration of a lower-order bit eraser circuit according to a thirteenth embodiment of the present invention.

Next, description, based on FIG. 23, will be given in regard to the entire configuration of a logic circuit according to a thirteenth embodiment of the present invention. FIG. 23 is a block diagram showing the configuration of a lower-order bit subtracter circuit according to the thirteenth embodiment.

The basic configuration of the lower-order bit subtracter circuit of FIG. 23 includes, in the same manner as the basic configuration shown in FIG. 1, a decoder, an interconnect network, and an encoder. A lower-order bit subtracter circuit 1N of FIG. 23 includes an input portion 101N, a decoder 400N, an interconnect network 200N, an encoder 300N, and an output portion 102N. The lower-order bit subtracter circuit is an example of a circuit that subtracts lower order bit data from 3-bit binary input data.

The lower-order bit subtracter circuit 1N includes the input portion 101N that includes three input terminals (B2, B1, B0) for the purpose of inputting 3-bit input data, a decoder 400N configured to convert 3-bit data into 8-bit data, an interconnect network 200N configured to execute conversion substituting the 8-bit data (or interconnect), an encoder 300N configured to convert 4-bit data into 2-bit data, and an output portion 102N including two output terminals (Z1, Z0) for the purpose of outputting 2-bit data of the encoder 300N. 3-bit binary data is input into the lower-order bit subtracter circuit 1N, and the lower-order bit subtracter circuit 1N is configured to output 2-bit binary data that has undergone lower-order bit subtraction.

Since the decoder 400N is configured in the same manner as the decoder 400A of FIG. 2, description thereof is omitted. Each output of the interconnect network 200N is connected to each input terminal of the encoder 300N.

Since the encoder 300N is configured in the same manner as the encoder 300B of FIG. 4, description thereof is omitted.

The interconnect network 200N includes four OR circuits. Each of the OR circuits includes two inputs (input 1 and input 2). A first output and a second output of the decoder 400N are connected to the first OR circuit. A third output and a fourth output of the decoder 400N are connected to the second OR circuit. A fifth output and a sixth output of the decoder 400N are connected to the third OR circuit. A seventh output and an eighth output of the decoder 400N are connected to the fourth OR circuit.

The outputs of the first to fourth OR circuits are each connected, respectively, to the first to fourth input terminals of the encoder 300N.

Only one output of the outputs of the eighth AND circuits of the decoder 400N become H. That is, only one of the interconnects (that is, outputs) of the output of the decoder 400N becomes active (in this example H denotes the logic value of 1). In the same manner, only one of the outputs of the four OR circuits of the interconnect network 200N becomes H.

FIG. 24 is a table showing the relationship between input and output in the circuit of FIG. 23. As shown in FIG. 24, an output is such data as obtained by subtracting the lowest-order bit of an input. As shown in FIG. 24, when the output of the decoder 400N is (000) or (001), the output (00) of the first OR circuit becomes H. When the output of the decoder 400N is (010) or (011), the output (01) of the second OR circuit becomes H. When the output of the decoder 400N is (100) or (101), the output (10) of the third OR circuit becomes H. When the output of the decoder 400N is (110) or (111), the output (11) of the second OR circuit becomes H. It is possible to realize lower-order bit subtraction by the interconnect network 200N of this kind.

In the manner above, in the outputs of the decoder 400N and the interconnect network 200N, the number of signals that are H is always the same, that is, one, and therefore, the fluctuation of the electrical power consumption in the operation of bit subtraction can be suppressed regardless of the value of the input data.

Figure 25:
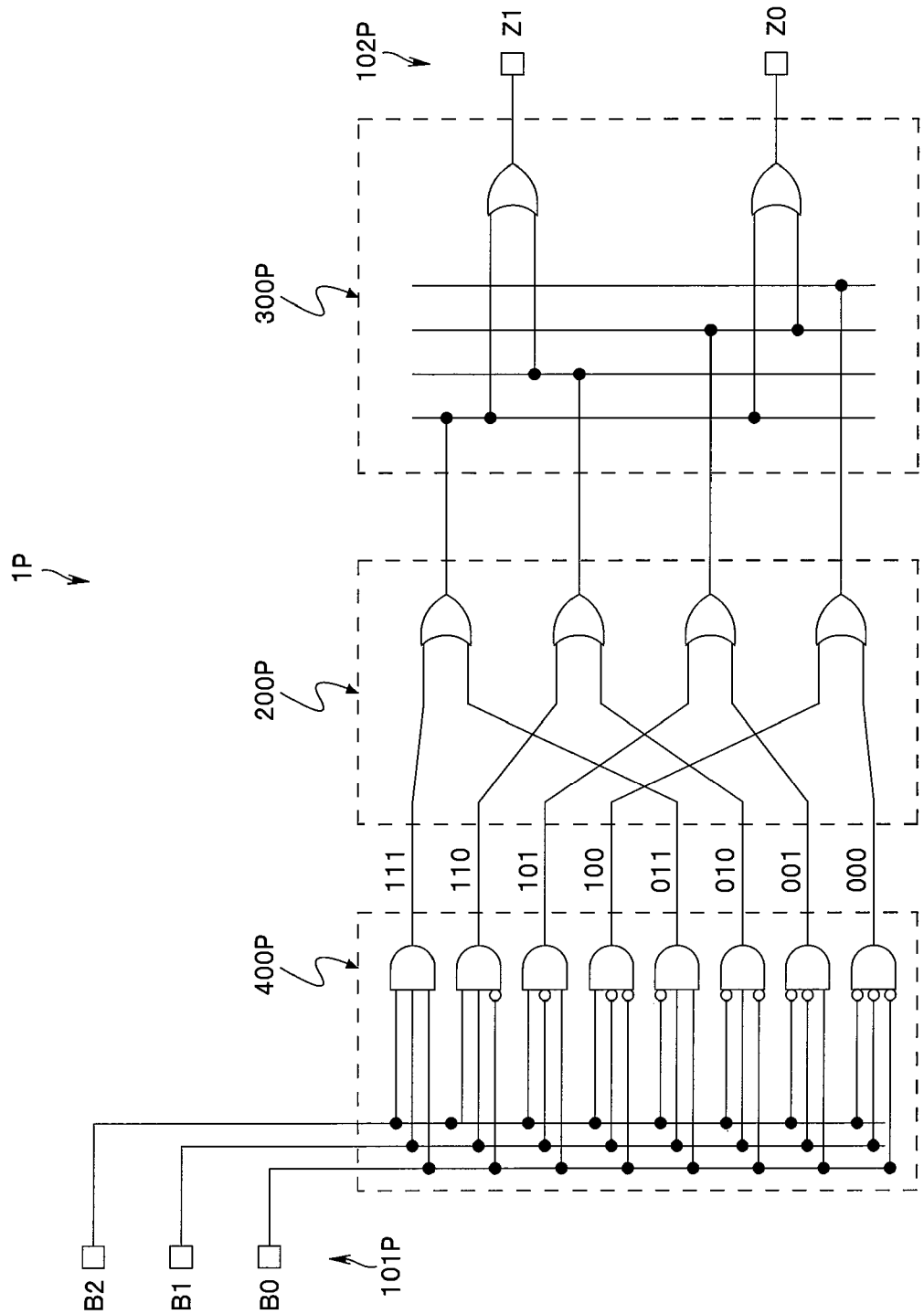
FIG. 25 is a schematic circuit diagram showing an example of the configuration of a higher-order bit subtracter circuit.

Furthermore, although the circuit of FIG. 23 is a lower-order bit subtracter circuit that subtracts a lower-order bit from the input data, with the configuration in the manner of the circuit of FIG. 25, it is possible to realize a higher-order bit subtracter circuit that subtracts a higher-order bit from the input data. FIG. 25 is a schematic circuit diagram showing an example of the configuration of a higher-order bit subtracter circuit.

In the circuit of FIG. 25, the point of difference with that of FIG. 23 is just a relationship of the connection between the output terminal of a decoder 400P and the input terminal of an interconnect network 200P. Accordingly, an input portion 101P, the decoder 400P, the interconnect network 200P, an encoder 300P, and an output portion 102P are configured in the same manner as the input portion 101N, the decoder 400N, the interconnect network 200N, the encoder 300N, and the output portion 102N of FIG. 23.

The two input terminals of a first OR circuit of the interconnect network 200P are connected to the output terminals of the first and the fifth AND circuits of the decoder 400P. The two input terminals of a second OR circuit of the interconnect network 200P are connected to the output terminals of the second and the sixth AND circuits of the decoder 400P. The two input terminals of a third OR circuit of the interconnect network 200P are connected to the output terminals of the third and the seventh AND circuits of the decoder 400P. The two input terminals of a fourth OR circuit of the interconnect network 200P are connected to the output terminals of the fourth and the eighth AND circuits of the decoder 400P.

With the configuration in the above manner, higher-order bit subtraction becomes possible.

In the above manner, by inputting decode data of the input B into the input terminal of the plurality of OR circuits of the interconnect networks 200N and 200P, substitution of the bit position of the decode data of the input B is executed on the interconnect networks 200N and 200P.

Accordingly, as shown in FIGS. 23 and 25, with using the decoders 400N and 400P, the interconnect networks 200N and 200P, and the encoders 300N and 300P, it is possible to realize a bit subtraction circuit. At this time, in the output of the decoders 400N and 400P, the number of signals that are H is always the same, that is, one, and even on the interconnect networks 200N and 200P, the number of signals that are H will be one regardless of the kind of input. Therefore, the fluctuation of the electrical power consumption in the bit subtraction processing is suppressed regardless of the value of the input data.

It is also possible to realize in the same manner a circuit that adds or subtracts bits at arbitrary positions as an application of the configuration shown in FIGS. 21 to 25.

Fourteenth Embodiment

Figure 26:
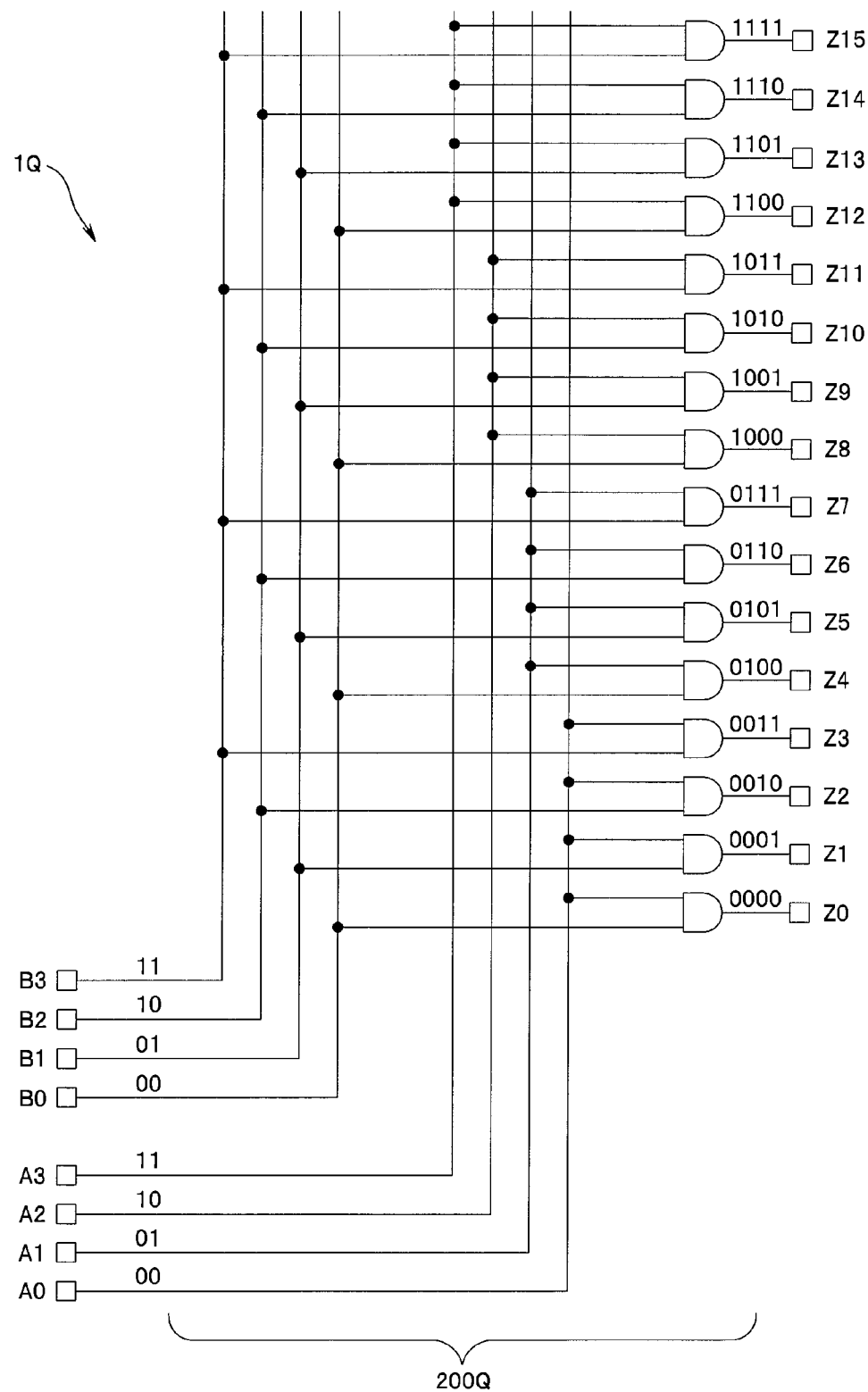
FIG. 26 is a block diagram showing the configuration of a bit connector circuit according to a fourteenth embodiment of the present invention.

Next, description, based on FIG. 26, will be given in regard to the entire configuration of a logic circuit according to a fourteenth embodiment of the present invention. FIG. 26 is a block diagram showing the configuration of a bit connector circuit according to the fourteenth embodiment.

The basic configuration of the bit connector circuit of FIG. 26 includes, in the same manner as the basic configuration shown in FIG. 1, a decoder, an interconnect network, and an encoder. The bit connector circuit 1Q of FIG. 26 includes an input portion, a decoder, an interconnect network 200Q, an encoder, and an output portion. The bit connector circuit 1Q is an example of a circuit that connects two input data, which are each 2-bit binaries, and outputs a 4-bit data of the two connected 2-bit data as output data.

In FIG. 26, only the configuration of the interconnect network 200Q is shown. The two decoders (not shown) each decode two 2-bit inputs A and B, respectively, into 4-bit data. In the output of the two decoders, only one bit becomes H out of four output bits for each of the inputs A and B. The eight outputs from the decoders are output, respectively, to each of the eight input terminals of the interconnect network 200Q.

The interconnect network 200Q includes sixteen AND circuits, that is, the first to sixteenth AND circuits. As shown in FIG. 26, the eight input terminals are each connected to the plurality of input terminals of the AND circuits. Each of the AND circuits includes two inputs.

The input terminals of one end of each of the first to fourth AND circuits are connected to an input terminal (A0) corresponding to the (00) of input A. The input terminals of the other end of each of the first to fourth AND circuits are connected to four input terminals (B0), (B1), (B2), (B3) each corresponding, respectively, to the (00), (01), (10), and (11) of input B.

The input terminals of one end of each of the fifth to eighth AND circuits are connected to an input terminal (A1) corresponding to the (01) of input A. The input terminals of the other end of each of the fifth to eighth AND circuits are connected to four input terminals (B0), (B1), (B2), (B3) each corresponding, respectively, to the (00), (01), (10), and (11) of input B.

The input terminals of one end of each of the ninth to twelfth AND circuits are connected to an input terminal (A2) corresponding to the (10) of input A. The input terminals of the other end of each of the ninth to twelfth AND circuits are connected to four input terminals (B0), (B1), (B2), (B3) each corresponding, respectively, to the (00), (01), (10), and (11) of input B.

The input terminals of one end of each of the thirteenth to sixteenth AND circuits are connected to an input terminal (A3) corresponding to the (11) of input A. The input terminals of the other end of each of the thirteenth to sixteenth AND circuits are connected to four input terminals (B0), (B1), (B2), (B3) each corresponding, respectively, to the (00), (01), (10), and (11) of input B.

Therefore, with the interconnect network 200Q of the above described configuration, only one of the output lines of the sixteen output lines of the interconnect network 200Q according to combinations of the inputs A and B. Then the encoder (not shown) receives the output of the interconnect network 200Q and generates data corresponding to a combination of the inputs A and B.

In the above manner, the interconnect network 200Q of FIG. 26 is an interconnect network for the purpose of realizing connection of two input data that have each been decoded, and is an interconnect network that connects the two inputs A and B, which are each 2-bit binaries. The two inputs A and B are each decoded, thus becoming the signals A0 to A3 and B0 to B3. The interconnect network 200Q shown in FIG. 26 connects these, and generates data corresponding to 4-bit binaries (A and B). For example, in a case in which the input A is 01, and the input B is 10, the signal that is generated will be 0110. In the case of this example, in the signals A0 to A3, only A1(01) becomes H, and in the signals B0 to B3, only B2(10) becomes H.

Accordingly, in the output, only Z6(0110) will become H and the other signals will be L.

In the above manner, according to the circuit of the present embodiment, it is possible to realize bit connection.

In particular, in the output of the decoder and the interconnect network 200Q, the number of signals that will become H is always the same, that is, one, therefore, the fluctuation of the electrical power consumption in the bit connection operation can be suppressed regardless of the value of the input data.

In the above manner, by inputting each decode data of the inputs A and B into the input terminals of the plurality of AND circuits of the interconnect network 200Q, substitution of the bit position of the two decode data is executed on the interconnect network 200Q.

Accordingly, by using the decoder 400Q, the interconnect network 200Q, and the encoder 300Q of the kind shown in FIG. 26, it is possible to realize a bit connector circuit. At this time, in the output of the two decoders, the number of signals that are H is always the same, that is, one, and even on the interconnect network 200Q the number of signals that are H will be one regardless of the kind of input. Therefore, the fluctuation of the electrical power consumption in the processing of bit connection can be suppressed regardless of the value of the input data.

Fifteenth Embodiment

Figure 27:
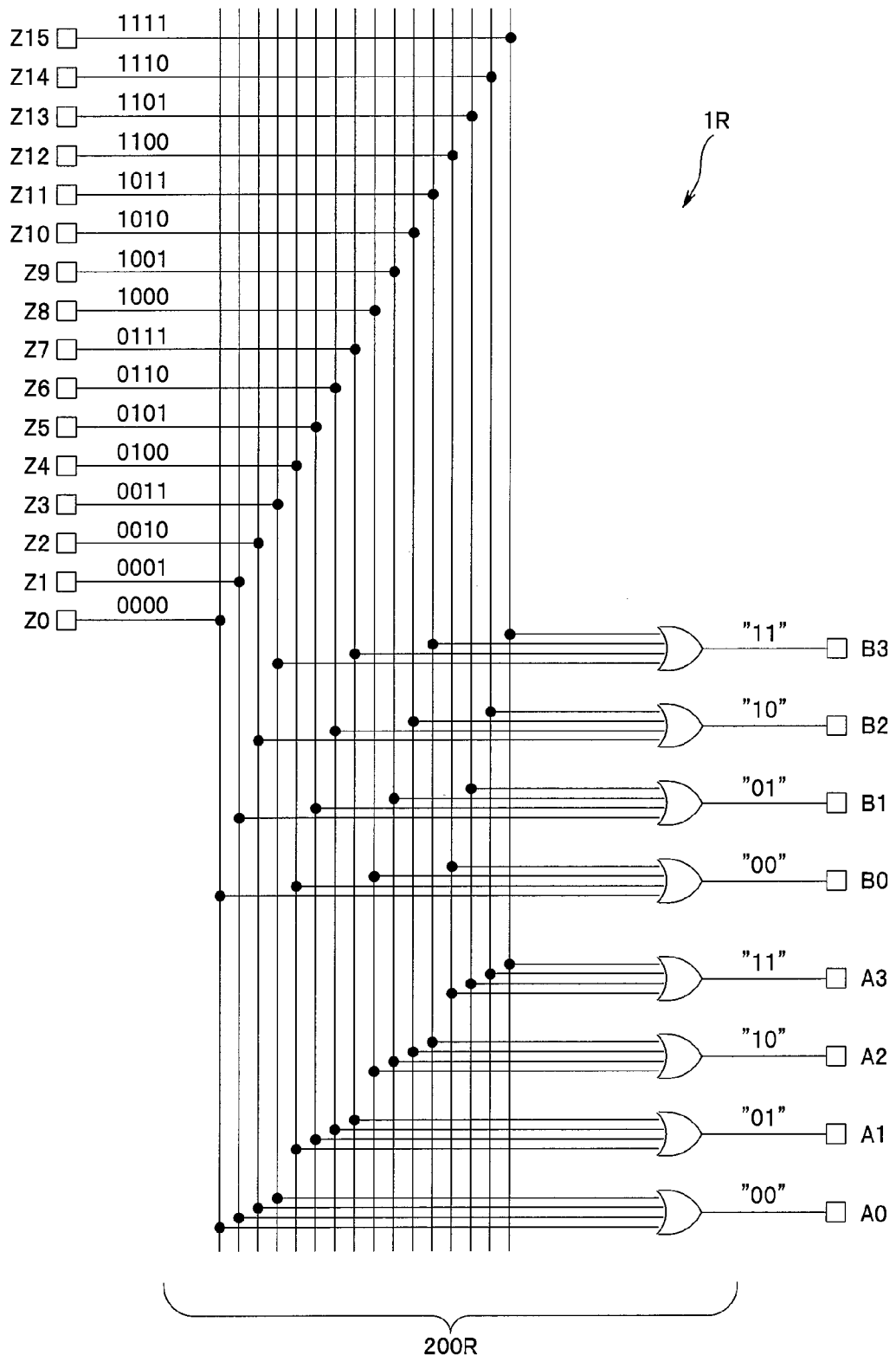
FIG. 27 is a block diagram showing the configuration of a bit partitioning circuit according to a fifteenth embodiment of the present invention.

Next, description, based on FIG. 27, will be given in regard to the entire configuration of a logic circuit according to a fifteenth embodiment of the present invention. FIG. 27 is a block diagram showing the configuration of a bit partitioning circuit according to the fifteenth embodiment.

The basic configuration of the bit partitioning circuit of FIG. 27 includes, in the same manner as the basic configuration shown in FIG. 1, a decoder, an interconnect network, and an encoder. A bit partitioning circuit 1R of FIG. 27 includes an input portion, a decoder, an interconnect network 200R, an encoder, and an output portion. The bit partitioning circuit 1R is an example of a circuit that partitions a single input data and outputs two sections of bit data attained from the partitioning.

In FIG. 27, only the configuration of the interconnect network 200R is shown. Output from the decoder (not shown) decodes a 4-bit input Z into 16-bit data. For outputs from the decoder, only one bit out of output 16 bits becomes H for each input Z value. The sixteen outputs from the decoder are each output, respectively, to sixteen input terminals (Z0 to Z15) of the interconnect network 200R.

The interconnect network 200R includes eight OR circuits, that is, the first to eighth OR circuits. As shown in FIG. 27, the sixteen input terminals (Z0 to Z15) are connected to a plurality of inputs of the plurality of OR circuits. Each of the OR circuits includes four inputs.

The four input terminals of the first OR circuit are connected to four input terminals (Z0 to Z3) that correspond to (0000 to 0011) of the input Z. The four input terminals of the second OR circuit are connected to four input terminals (Z4 to Z7) that correspond to (0100 to 0111) of the input Z. The four input terminals of the third OR circuit are connected to four input terminals (Z8 to Z11) that correspond to (1000 to 1011) of the input Z. The four input terminals of the fourth OR circuit are connected to four input terminals (Z12 to Z16) that correspond to (1100 to 1111) of the input Z.

The four input terminals of the fifth OR circuit are connected to the four input terminals (Z0, Z4, Z8, Z12) that correspond to the (0000), (0100), (1000), (1100) of the input Z. The four input terminals of the sixth OR circuit are connected to the four input terminals (Z1, Z5, Z9, Z13) that correspond to the (0001), (0101), (1001), (1101) of the input Z. The four input terminals of the seventh OR circuit are connected to the four input terminals (Z2, Z6, Z10, Z14) that correspond to the (0010), (0110), (1010), (1110) of the input Z. The four input terminals of the eighth OR circuit are connected to the four input terminals (Z3, Z7, Z11, Z15) that correspond to the (0011), (0111), (1011), (1111) of the input Z.

The eight outputs of the first to eight OR circuits are connected to a 4-bit first output terminal (A0 to A3) and a 4-bit second output terminal (B0 to B3).

First, the binary input Z is decoded and input to the interconnect network 200R as 16-bit decode data of Z0 to Z15. The interconnect network 200R generates two outputs A and B each corresponding to two signals A0 to A3 and B0 to B3 of the partitioned input Z, and outputs them to the encoder. For example, in a case in which the input Z is 0111, only the Z7 of FIG. 27 becomes H, and remaining signals are L. At this time, since only the OR circuit (second and eighth OR circuits) connected to the input Z7 becomes H, the outputs A1 and B3 become H, and the remaining signals are L. Accordingly, the output A is 01, the output B is 11, and the input Z is partitioned into two signals.

Therefore, with the interconnect network 200R of the above described configuration, only one input line of the sixteen input lines of the interconnect network 200R becomes H according to the value of the input Z. Then, the encoder (not shown) receives the output of the interconnect network 200R, and generates data corresponding to combinations of the outputs A and B as partitioned data.

In the manner above, the interconnect network 200R of FIG. 27 is an interconnect network that realizes partitioning of decoded data, and is an interconnect network that partitions into two outputs that are 4-bits each. The bit partitioning circuit 1R includes the interconnect network 200R that generates the outputs A and B, which are each 2-bit binaries, and, from the 4-bit binary Z, the higher-order 2 bit of the input Z becomes the output A, and the lower-order 2 bit of the input Z becomes the output B.

In the above manner, according to the circuit of the present embodiment, it is possible to realize bit partitioning.

In particular, in the output of the decoder and the interconnect network 200R, the number of signals that become H are always the same, that is, one, and therefore, the fluctuation of the electrical power consumption in the operation of bit partitioning can be suppressed regardless of the value of the input data.

In the above manner, by inputting the input data Z into the input terminals of the plurality of OR circuits of the interconnect network 200R, substitution of the bit position of the bit data of the input data Z is executed on the interconnect network 200R.

Therefore, with using the decoder 400, the interconnect network 200R, and the encoder of the kind shown in FIG. 27, it is possible to realize bit partitioning. At this time, in the output of the decoder, the number of signals that are H is always the same, that is, one, and even on the interconnect network 200R the number of signals that are H will be two regardless of the kind of input. Therefore, the fluctuation of the electrical power consumption in the processing of bit partitioning can be suppressed regardless of the value of the input data.

Sixteenth Embodiment

Figure 28:
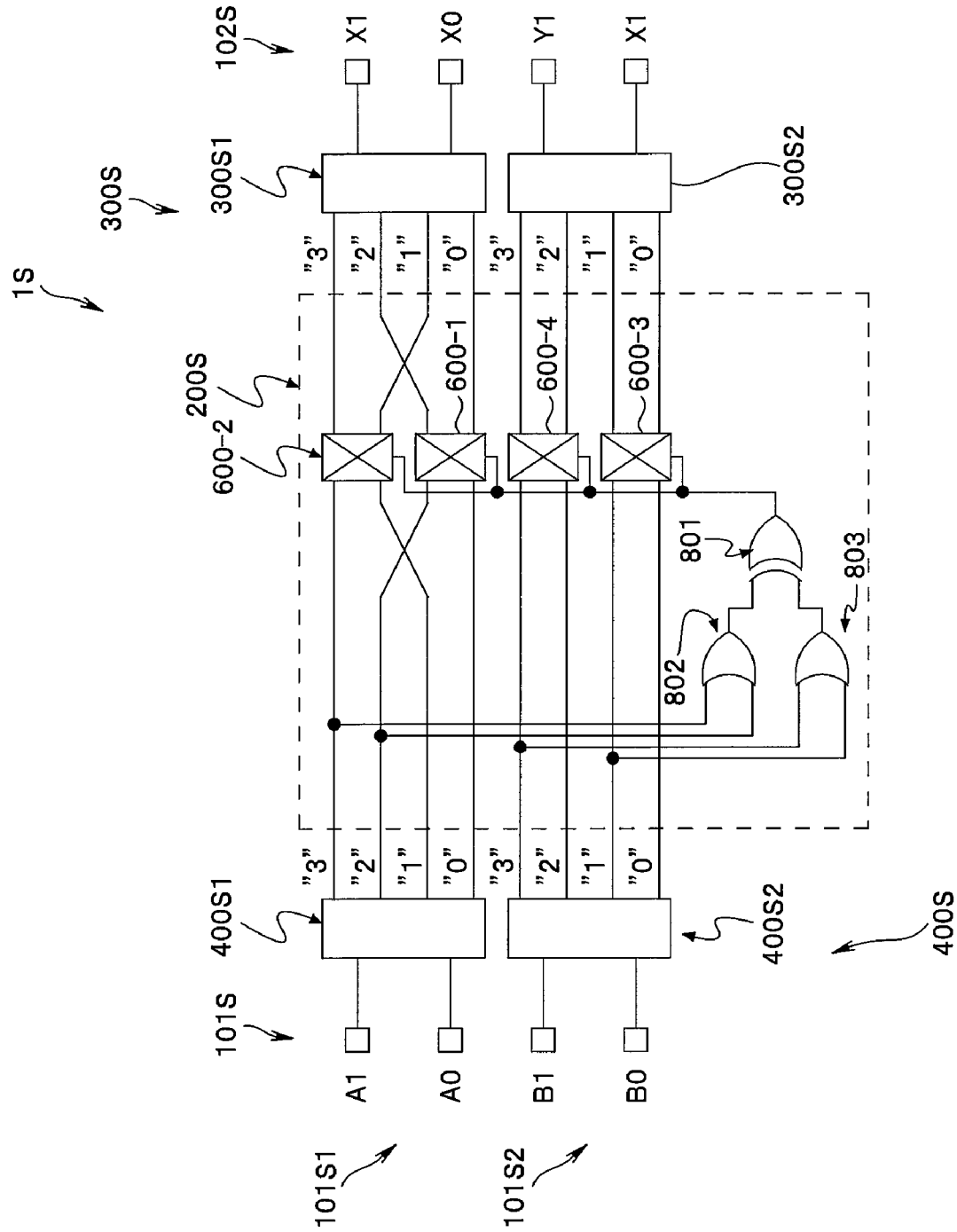
FIG. 28 is a block diagram showing the configuration of a bit substitution circuit according to a sixteenth embodiment of the present invention.

Next, description, based on FIG. 28, will be given in regard to the entire configuration of a logic circuit according to a sixteenth embodiment of the present invention. FIG. 28 is a block diagram showing the configuration of a bit substitution circuit according to the sixteenth embodiment.

The basic configuration of the bit substitution circuit of FIG. 28 includes, in the same manner as the basic configuration shown in FIG. 1, a decoder, an interconnect network, and an encoder. A bit substitution circuit 1S of FIG. 28 includes an input portion, a decoder, an interconnect network 200S, an encoder, and an output portion. The bit substitution circuit 1S of FIG. 28 is an example of a circuit that outputs bit data that has underwent bit substitution between two inputs that are each 2-bit binary inputs. The bit substitution circuit 1S is a circuit that generates a 2-bit output X (X1 and X0) and Y (Y1 and Y0) from 2-bit inputs A (A1 and A0) and B (B1 and B0).

An input portion 101S includes two input portions 101 S1 and 101S2 that each include a pair of input terminals (A1 and A0), (B1 and B0), respectively, for the purpose of inputting 2-bit input data. A decoder 400S includes a decoder 400S-1 that converts 2-bit data of the pair of input terminals (A1 and A0) of the input portion 101S1 into 4-bit data, and a decoder 400S-2 that converts 2-bit data of the pair of input terminals (B1 and B0) of the input portion 101S2 into 4-bit data. The interconnect network 200S is input with the 4-bit decode data from the decoder 400S-1 and the 4-bit decode data from the decoder 400S-2, executes substitution of the two 4-bit data (or four interconnects), aid outputs 8-bit data. The encoder 300S includes two encoders 300S1 and 300S2 that is input with each of the two 4-bit data, and output 2-bit data. The output portion 102S has four output terminals for the purpose of outputting the 4-bit data of the encoder 300S. Two of the output terminals (X0 and X1) are connected to the two outputs of the encoder 300S1, and two of the output terminals (Y0 and Y1) are connected to the two outputs of the encoder 300S2.

The two decoders 400S-1 and 400S-2 of the decoder 400S are configured in the same manner as the decoders 400C-1 and 400C-2 of FIG. 5.

The two encoders 300S1 and 300S2 of the encoder 300S are each configured in the same manner as the encoder 300C of FIG. 5.

The interconnect network 200S includes four selector circuits 600, one exclusive disjunction circuit (hereinafter referred to as 'XOR circuit') 801, and two OR circuits 802 and 803. In the first selector circuit 600-1, an input 1 of the lower side is connected to a first output of the decoder 400S-1 corresponding to the 0 of the input A, and an input 2 of the upper side is connected to a third output of the decoder 400S-1 corresponding to the 2 of the input A. In the first selector circuit 600-1, an output 1 of the lower side is connected to a first input of the encoder 300S1, and an output 2 of the upper side is connected to a third input of the encoder 300S1.

In the second selector circuit 600-2, an input 1 of the lower side is connected to a second output of the decoder 400S-1 corresponding to the 1 of the input A, and an input 2 of the upper side is connected to a fourth output of the decoder 400S-1 corresponding to the 3 of the input A. In the second selector circuit 600-1 an output 1 of the lower side is connected to a second input of the encoder 300S1, and an output 2 of the upper side is connected to a fourth input of the encoder 300S1.

In the third selector circuit 600-3, an input 1 of the lower side is connected to a first output of the decoder 400S-2 corresponding to the 0 of the input B, and an input 2 of the upper side is connected to a second output of the decoder 400S-1 corresponding to the 1 of the input B. In the third selector circuit 600-3 an output 1 of the lower side is connected to a first input of the encoder 300S2 and an output 2 of the upper side is connected to a second input of the encoder 300S2.

In the fourth selector circuit 600-4, an input 1 of the lower side is connected to a third output of the decoder 400S-2 corresponding to the 2 of the input B, and an input 2 of the upper side is connected to a fourth output of the decoder 400S-2 corresponding to the 3 of the input B. In the fourth selector circuit 600-4 an output 1 of the lower side is connected to a third input of the encoder 300S2 and an output 2 of the upper side is connected to a fourth input of the encoder 300S2.

Also, the two input terminals of the first OR circuit 802 are connected to the third and the fourth outputs of the decoder 400S-1. The two input terminals of the second OR circuit 803 are connected to the second and the fourth outputs of the decoder 400S-2.

Moreover, the two input terminals of the XOR circuit 801 are connected, respectively, to the outputs of the first and the second OR circuits 802 and 803. The output of the XOR circuit 801 is connected to the control inputs of the first to fourth selector circuits 600-1, 600-2, 600-3, and 600-4.

The circuit of FIG. 28 is a circuit that obtains the exclusive disjunction of the higher-order bit A1 of A and the lower order bit B0 of B, and based on the result of which, executes substitution of data. Since the output "2" or "3" of the decoder 400S-1 becomes H when the A1 is H, it is possible to detect that A1 is H according to the conjunction of these two signals. In the same manner, it is possible to detect that B0 is H from the output "1" and "3" of the decoder 400S-2. Therefore, by obtaining the exclusive disjunction of the result of the logical conjunction, it is possible to determine whether or not data is changed according to substitution. In FIG. 28, the OR circuit 802 detects the input A1, the OR circuit 803 detects the input B0, and the XOR circuit 801 detects a mismatch of the two bits from the two OR circuits. The output of the XOR circuit 801 is passed to the control input of the selector circuit 600, and in a case in which there is a mismatch, signal substitution is executed, and in a case in which there is a match, the input is passes as is to the output.

Operation of FIG. 28 will be described. In the circuit of FIG. 28, the higher-order bit A1 of the input A, and the lower-order bit B0 of the input B are substituted, and the outputs X (=B0, A0) and Y (=B1, A1) are generated. However, if the substituted bits A1 and B0 are of the same value, the outputs X and Y will be the same as the inputs A and B, that is, the output will not change from the input. With regard to this, if the bits A1 and B0 are different values, the values of the outputs X and Y will differ from the inputs A and B, that is, the outputs X and Y will differ from the input. FIG. 29 is a table for explaining a case in which a higher-order bit changes in the circuit of FIG. 28. As shown in FIG. 29, in a case in which A1 and B0 are the same value (a case of the left side column (0 to 0) and the right side (1 to 1) column of the table), the input A1 is output as the output X in a state in which the decoded input value 0 or 1 remains as is.

In a case in which A1 and B0 are different values (a case of the center left side column (0 to 1) and the center right side (1 to 0) column of the table), the higher-order bit A1 of the A is changed, and the input A is output as the output X. That is, the values 0 and 1 of the input A are substituted, respectively, with 2 and 3, and the values 2 and 3 of the input A are substituted, respectively, with 0 and 1. The same applies to the input B.

Therefore, in a case in which the substituted data is different, realization is possible by substituting two signals ("0", "2" and "1", "3") of decoded signals. Moreover, in the same manner, in a case of substituting the lower-order bit, realization is possible by substituting two adjacent signals ("0" and "1", and "2" and "3") of decoded signals.

Next, description will be given in regard to a first modification of the bit substitution circuit of the present embodiment.

Figure 30:
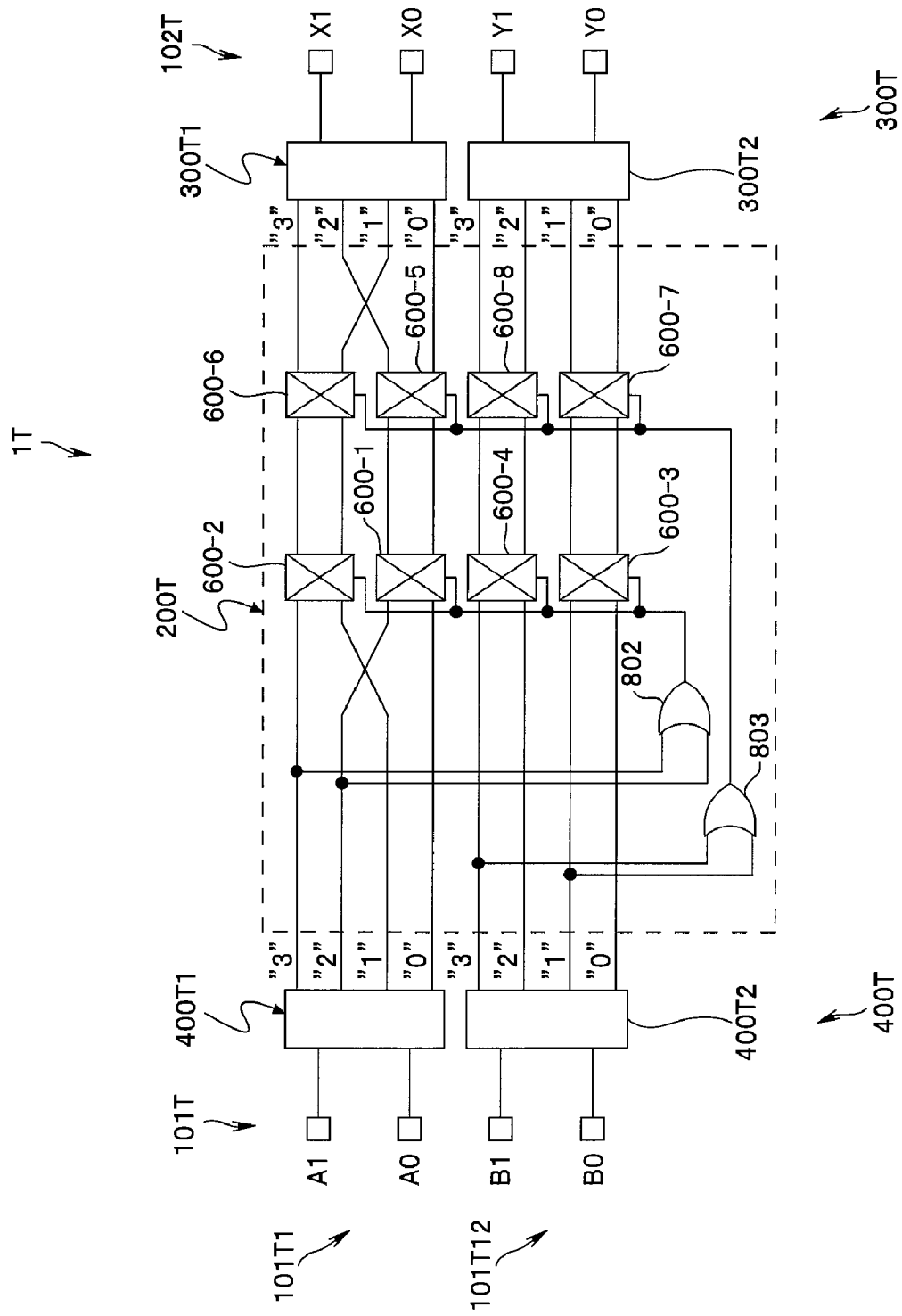
FIG. 30 is a schematic circuit diagram showing a first modification of the bit substitution circuit according to the sixteenth embodiment of the present invention.

FIG. 30 is a schematic circuit diagram showing a first modification of the bit substitution circuit. In FIG. 30, a point of difference with FIG. 28 is only the circuit configuration of within an interconnect network 200T. Therefore, an input portion 101T, a decoder 400T, an encoder 300T, and an output portion 102T are configured in the same manner as the input portion 101S, the decoder 400S, the encoder 300S, and the output portion 102S of FIG. 28.

The interconnect network 200T includes eight selector circuits 600 and two OR circuits 802 and 803. The first to fourth selector circuits 600-1, 600-2, 600-3, and 600-4 comprise a first stage selector. The fifth to eighth selector circuits 600-5, 600-6, 600-7, and 600-8 comprise a second stage selector.

The connection of each of the input terminals of the first to fourth selector circuits 600-1, 600-2, 600-3, and 600-4 with each of the output terminals of the decoder 400T is the same as the connection of each of the output terminals of the first to fourth selector circuits 600-1, 600-2, 600-3, and 600-4 with each of the output terminals of the decoder 400S in FIG. 28.

The connection of each of the input terminals of the fifth to eighth selector circuits 600-5, 600-6, 600-7, and 600-8 with each of the input terminals of the encoder 300T is the same as the connection of each of the output terminals of the first to fourth selector circuits 600-1, 600-2, 600-3, and 600-4 with each output terminal of the encoder 300S in FIG. 28.

In the first selector circuit 600-1, the output 1 of the lower side, is connected to the input 1 of the lower side of the fifth selector circuit 600-5, and the output 2 of the upper side is connected to the input 2 of the upper side of the fifth selector circuit 600-5. In the second selector circuit 600-2, the output 1 of the lower side, is connected to the input 1 of the lower side of the sixth selector circuit 600-6, and the output 2 of the upper side is connected to the input 2 of the upper side of the sixth selector circuit 600-6. Herein below, in the same manner, the outputs 1 and 2 of the lower and upper sides of each of the selector circuits of the first stage are connected, respectively, to the inputs 1 and 2 of the lower and upper sides of each of the selector circuits of the second stage.

Moreover, the output of the OR circuit 802 is connected to the control input of each of the selector circuits of the first stage selector. The output of the OR circuit 803 is connected to the control input of each of the selector circuits of the second stage selector.

In the above manner, in the circuit of FIG. 30, in comparison with the circuit of FIG. 28, the XOR circuit is omitted, and two selector stages are established. The value of the input A1 is input to an initial stage selector and the value of the input B0 is input to the second stage selector. Although in a case in which one of either of the inputs A1 and B0 are H substitution of the signals is executed, in a case in which both are L substitution is not executed. Also, in a case in which both are H, substitution is executed two times, and as a result a state in which substitution does not take place comes into effect. Thus, it is possible for the interconnect network 200T of FIG. 30 to realize the same functionality as the interconnect network 200S of FIG. 28.

Next, description is given to a second modification of the bit substitution circuit of the present embodiment.

Figure 31:
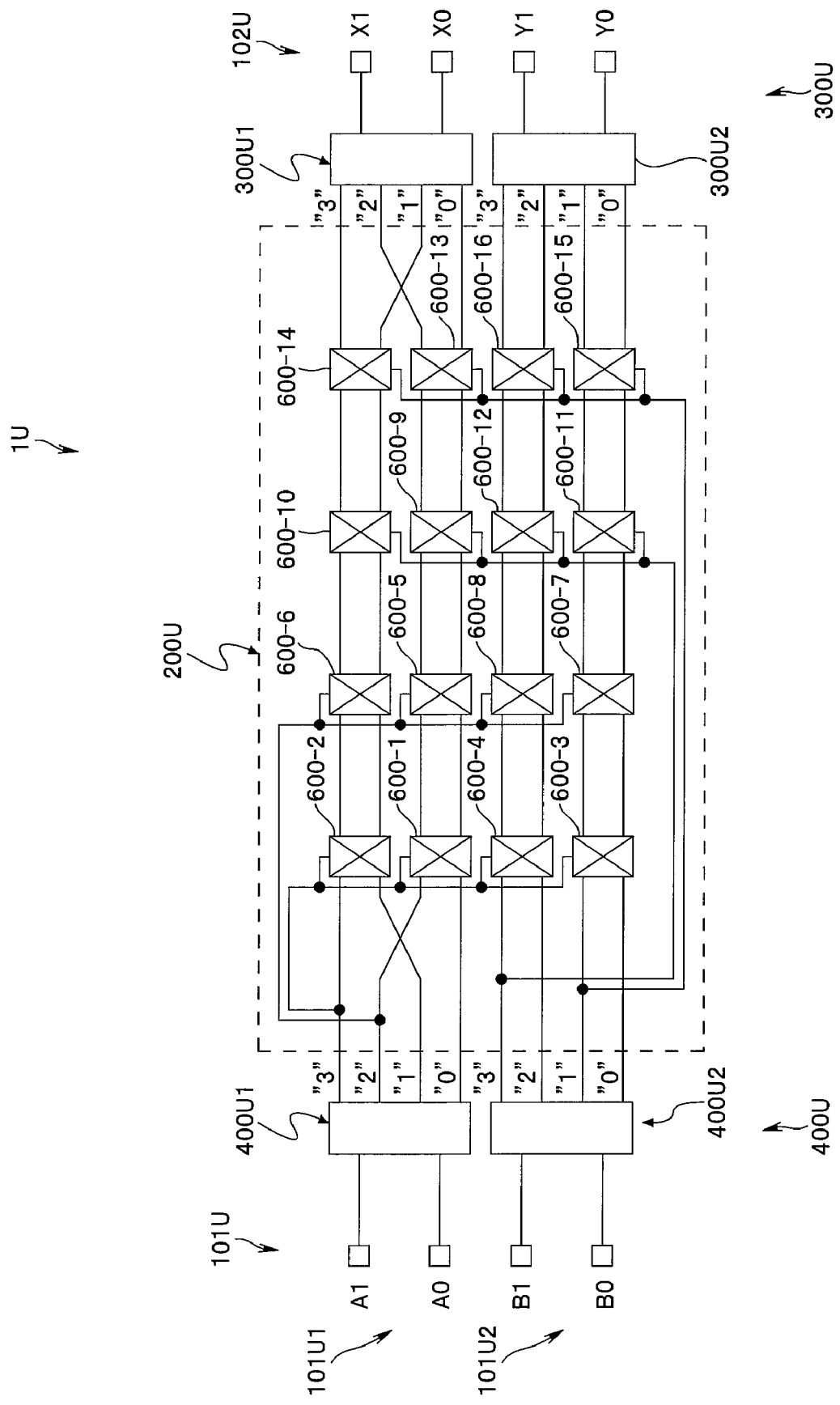
FIG. 31 is a schematic circuit diagram showing a second modification of the bit substitution circuit according to the sixteenth embodiment of the present invention.

FIG. 31 is a schematic circuit diagram showing a second modification of the bit substitution circuit. In the circuit of FIG. 31, a point of difference with that of FIG. 28 is only the circuit configuration of within an interconnect network 200U. Therefore, an input portion 101U, a decoder 400U, an encoder 300U, and an output portion 102U are configured in the same manner as the input portion 101S, the decoder 400S, the encoder 300S, and the output portion 102S of FIG. 28.

The interconnect network 200U includes sixteen selector circuits 600. The first to fourth selector circuits 600-1, 600-2, 600-3, and 600-4 comprise a first stage selector. The fifth to eighth selector circuits 600-5, 600-6, 600-7, and 600-8 comprise a second stage selector. The ninth to twelfth selector circuits 600-9, 600-10, 600-11, and 600-12 comprise a third stage selector. The thirteenth to sixteenth selector circuits 600-13, 600-14, 600-15, and 600-16 comprise a fourth stage selector.

The connection of each of the input terminals of the first to fourth selector circuits 600-1, 600-2, 600-3, and 600-4 with each of the output terminals of the decoder 400U is the same as the connection of each of the input terminals of the first to fourth selector circuits 600-1, 600-2, 600-3, and 600-4 with each of the output terminals of the decoder 400S in FIG. 28.

The connection of each of the input terminals of the thirteenth to sixteenth selector circuits 600-13, 600-14, 600-15, and 600-16 with each of the input terminals of the encoder 300U is the same as the connection of each of the output terminals of the first to fourth selector circuits 600-1, 600-2, 600-3, and 600-4 with each of the output terminals of the encoder 300S in FIG. 28.

The relationship of connection of the output and the input between each selector circuit between each selector is the same as the relationship of connection of the output and the input between each selector circuit between the first selector and the second selector in FIG. 30. That is, the output 1 of the lower side of the i-th selector circuit and the input 1 of the lower side of the (i+4)-th selector circuit are connected, and the output 2 of the upper side of the i-th selector circuit and the input 2 of the upper side of the (i+4)-th selector circuit are connected, between an n-th selector circuit and an (i+4)-th selector circuit. Here, 'i' is an integer from 1 to 12.

Moreover, the fourth output of the decoder 400U-1 is connected to the control input of each of the selector circuits 600 of the selector 1. The third output of the decoder 400U-1 is connected to the control input of each of the selector circuits 600 of the selector 2. The fourth output of the decoder 400U-2 is connected to the control input of each of the selector circuits 600 of the selector 3. The second output of the decoder 400U-2 is connected to the control input of each of the selector circuits 600 of the selector 4.

Operation of FIG. 31 is the same as FIG. 28. In FIG. 31, the OR circuits have been omitted, and the selector has four stages. One signal only of either of the outputs of the decoders 400U-1 and 400U-2 becomes H. In a case when the input A1 is H, one of the outputs "2" or "3" becomes H, and because of this, a signal is substituted at only one of either of the selectors of the first and second stages. In the same manner, in a case in which the input B0 is H, the signal is substituted at only one of either of the selectors of the third and fourth stages. Therefore, with the circuit of FIG. 31, it is possible to realize the same operation as the bit substitution circuit shown in FIG. 28 and FIG. 30.

In particular, in the output of the decoder and the interconnect network, the number of signals that are H is always the same, and therefore, the fluctuation of the electrical power consumption in the operation of bit substitution can be suppressed regardless of the value of the input data.

In the above manner, the decode data of the inputs A and B are each input, respectively, to the input terminals of the above mentioned plurality of selector circuits 610 of the interconnect networks 200S and 200T. Moreover, by inputting, respectively, data generated from the decode data of each of the inputs A and B into each of the control input terminals of the plurality of selector circuits 610 as the control input, substitution of the bit position of the decode data of each of the inputs A and B is executed in the interconnect networks 200S and 200T.

Also, the decode data of the inputs A and B are each input, respectively, to the input terminals of the above mentioned plurality of selector circuits 610 of the interconnect network 200U. Moreover, by inputting, respectively, data generated from the decode data of each of the inputs A and B into each of the control input terminals of the plurality of selector circuits 610 as the control input, substitution of the bit position of the decode data of each of the inputs A and B is executed in the interconnect network 200U.

Therefore, with using the decoder 400, the interconnect network 200, and the encoder 300 of the kind shown in FIG. 28, FIG. 30, and FIG. 31, it is possible to realize bit substitution circuit. At this time, the number of signals of the output of the two decoders 400 that are H are always the same, that is, one, and even on the interconnect network the number of signals that are H will be two regardless of the kind of input. Therefore, the fluctuation of the electrical power consumption in the bit substitution processing can be suppressed regardless of the value of the input data.

Seventeenth Embodiment

Figure 32:
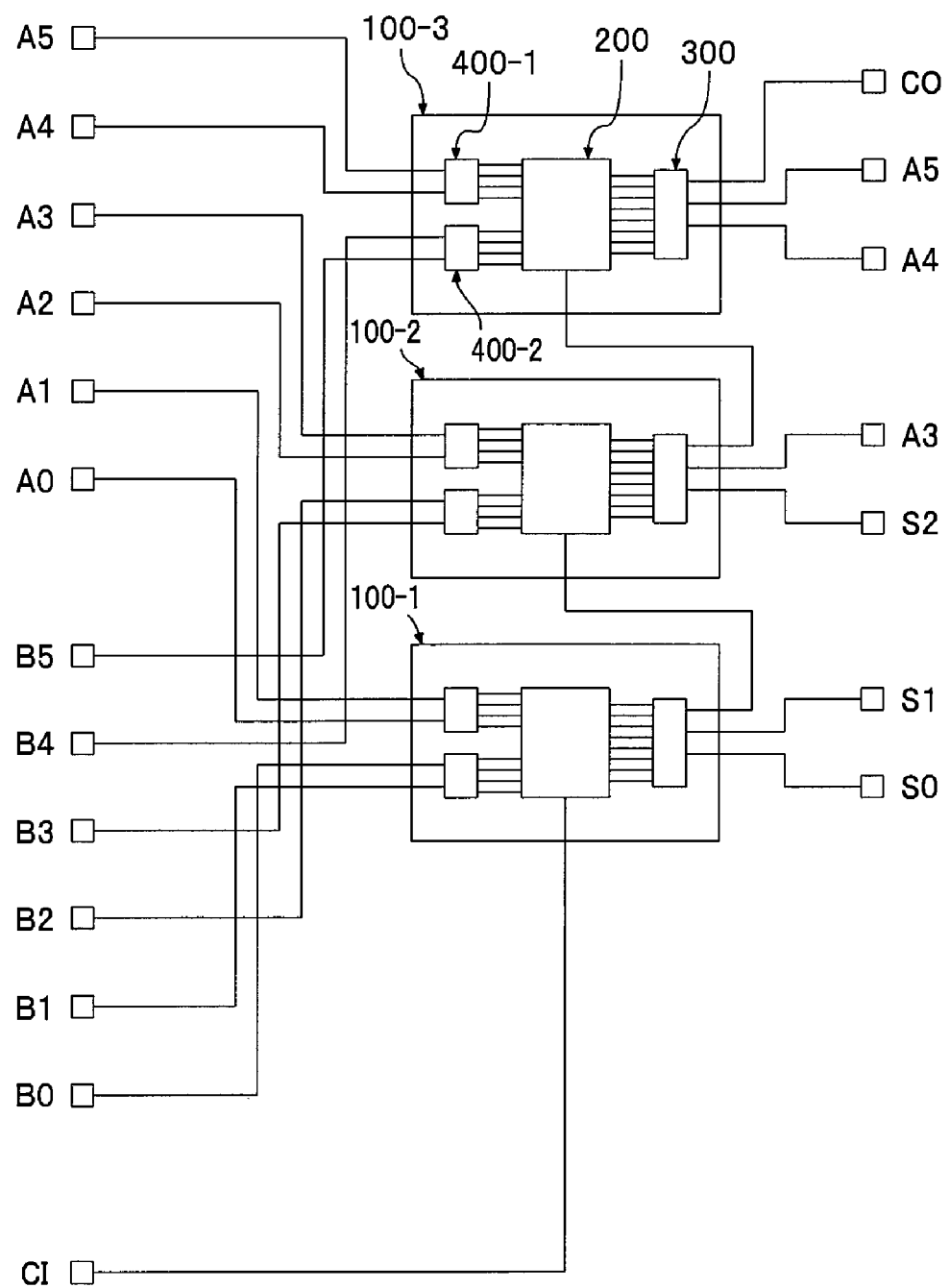
FIG. 32 is a block diagram showing the configuration of an adder composed of a combinatorial circuit of the logic circuit according to a seventeenth embodiment of the present invention.

Next, description, based on FIG. 32, will be given in regard to the entire configuration of a logic circuit according to a seventeenth embodiment of the present invention. FIG. 32 is a block diagram showing the configuration of an adder composed of a combinatorial circuit of the logic circuit according to the seventeenth embodiment.

Although the basic configuration of the combinatorial circuit of FIG. 32 includes, in the same manner as the basic configuration shown in FIG. 1, a decoder, an interconnect network, and an encoder, it is a circuit of a plurality of combined adders.

FIG. 32 is a circuit that inputs two input data, executes a prescribed operation (an adding operation here), and outputs the adding result as a plurality of bit data. More specifically, the logic circuit of FIG. 32 is a circuit that adds two inputs, A and B, which are each 6-bit data. To realize this, three 2-bit adders 100 are used. Each of these three 2-bit adders 100 are, for example the adders shown in FIG. 16.

The adders shown in FIG. 16 includes a carry input CI, two 2-bit data inputs, a 2-bit data output, and a carry output. The two 6-bit data A and B input to the circuit of FIG. 32 are each partitioned into three data of 2-bits apiece. The three 2-bit data of the input A are input, respectively, to a decoder 400-1 of one end of the 2-bit adders 100-1, 100-2, and 100-3. The three 2-bit data of the input B are input, respectively, to the decoder 400-2 of the other end of the 2-bit adders 100-1, 100-2, and 100-3.

The carry input and the lower order 2-bit (A1, A0, B1, B0) of the inputs A and B are input to the 2-bit adder 100-1, and the 2-bit adder 100-1 outputs the addition result (S1, S0) and the carry output. The carry output of the 2-bit adder 100-1 and the subsequent 2-bit (A3, A2, B3, B2) of the inputs A and B are input to the 2-bit adder 100-2, and the 2-bit adder 100-2 outputs the addition result (S3, S2) and the carry output. The carry output of the 2-bit adder 100-2 and the subsequent 2-bit (A5, A4, B5, B4) of the inputs A and B are input to the 2-bit adder 100-3, and the 2-bit adder 100-3 outputs the addition result (S5, S4) and a carry output CO.

In the above manner, the adder is formed of the combinatorial logic circuit includes a plurality of decoders, a plurality of interconnect networks, and a plurality of encoders.

Accordingly, it is possible to constitute an adder of even greater bit quantity by combining a plurality of adders that each include the decoder, the interconnect network, and the encoder. By combining an even greater quantity of this kind of adder, it is possible to realize a large scale adder or the like.

In this manner, it is possible to constitute an operation circuit by combining a plurality of logic circuits that each include the decoder, the interconnect network, and the encoder. By combining an even greater quantity of this kind of combinatory circuit, it is possible to constitute a circuit that realizes a prescribed arithmetic processing of a large scale. For example, it is possible to apply the combinatory circuit of the present embodiment to applications such as processors that execute a plurality of arithmetic operations.

Moreover, in the combinatory circuit as well, in the output of the decoder and the interconnect network, the number of signals that are H is always the same, according to the number of the combinatory circuit. Therefore, the fluctuation of the electrical power consumption in a plurality of logic arithmetic operations can be suppressed regardless of the value of the input data.

Figure 33:
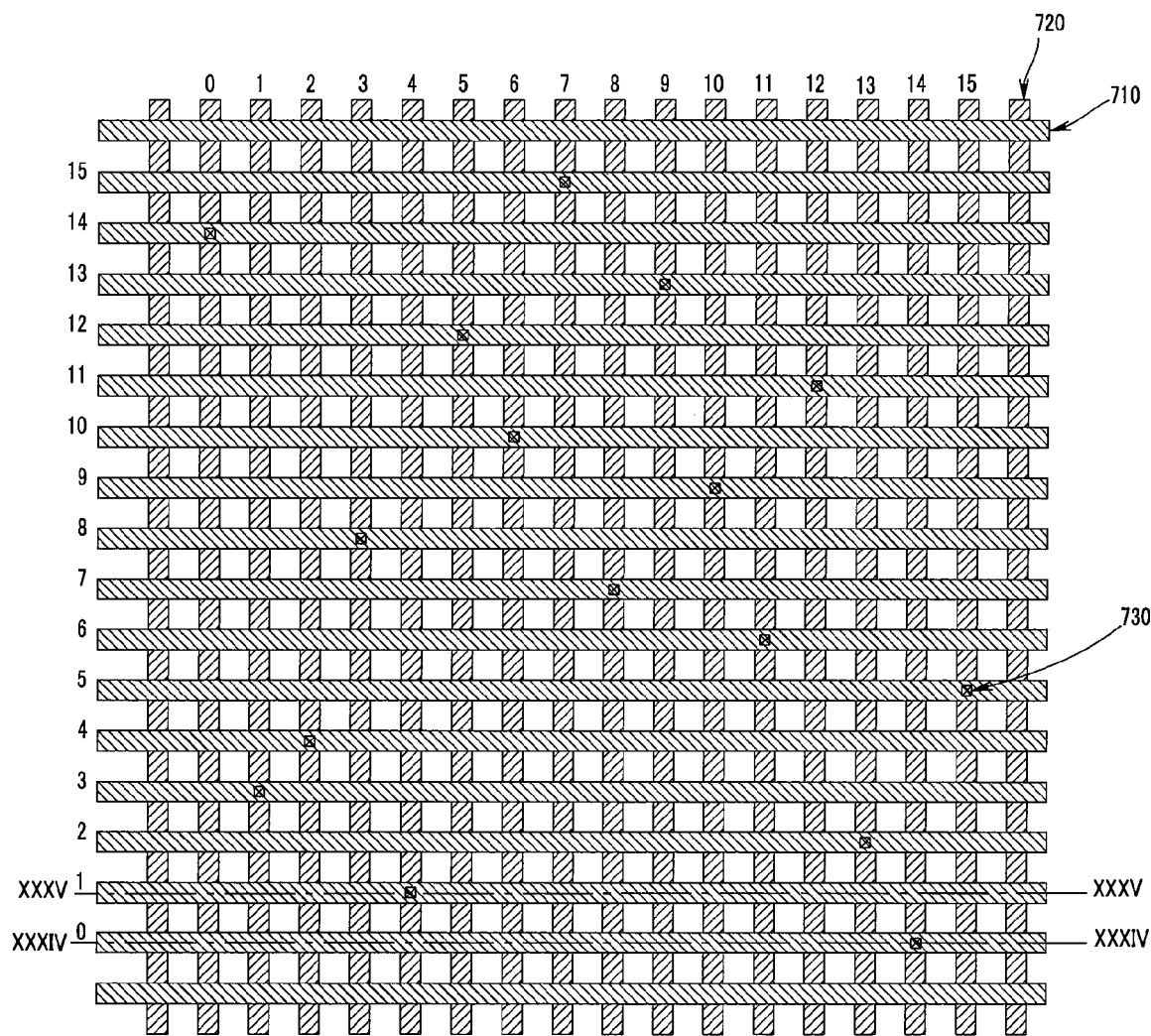
FIG. 33 is a top view showing an example of the layout of interconnect of the interconnect network according to the embodiments of the present invention.

Furthermore, in a case of an interconnect network of FIG. 2, the interconnect network may be configured in the following manner. FIG. 33 is a plan view showing an interconnect layout example of the above described interconnect network. In this case, 16-bit input and 16-bit output are used. Generally, in the case of CMOS, the electrical power consumption in LSI is dependant upon load capacity. Since the difference in capacity according to the interconnect in LSI will manifest as the difference of the electrical power consumption, it is necessary to even out the interconnect capacity in order to suppress fluctuation of electrical power consumption. As shown in the interconnect network of FIG. 2, in a case in which the interconnect pattern of the interconnect network is realized, as is, in a pattern that simply connects the interconnect input and output, the lengths thereof will differ according to the signal destinations, and differences in interconnect capacity will manifest.

Figure 34:
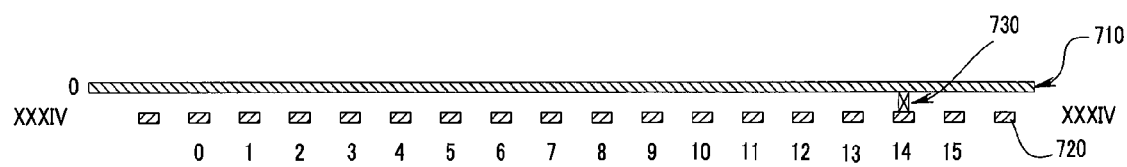
FIG. 34 is a cross-sectional diagram for explaining the cross-section along line XXXIV-XXXIV of FIG. 33.
Figure 35:
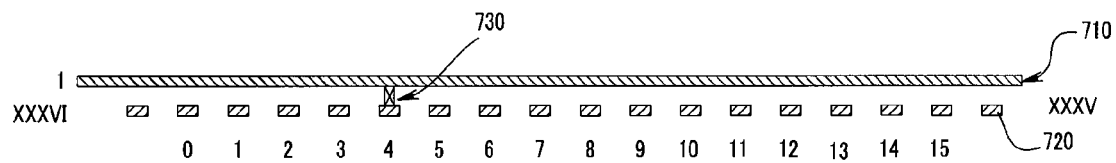
FIG. 35 is a cross-sectional diagram for explaining the cross-section along line XXXV-XXXV of FIG. 33.

At that, in the interconnect layout shown in FIG. 33, a horizontally oriented interconnect 710, and a vertically oriented interconnect 720, all have the same length. FIG. 34 is a cross-sectional diagram for explaining the cross-section along line XXXIV-XXXIV of FIG. 33. FIG. 35 is a cross-sectional diagram for explaining the cross-section along line XXXV-XXXV of FIG. 33.

More specifically, the interconnect network includes a plurality of interconnect patterns extending vertically and horizontally, and in order that the bit position of a plurality of bit data may be substituted, in the plurality of interconnect patterns 710 and 720, connected intersection points corresponding to terminals on the input side and terminals on the output side are electrically connected by a contact 730, as shown in FIG. 34 and FIG. 35. Also, a dummy interconnect is disposed on the outside of the necessary interconnect (0 to 15). The vertical interconnect and the horizontal interconnect are connected by the contact 730. In FIG. 33, the plurality of interconnect extending horizontally are connected to the input (decoder 4), and the plurality of interconnect extending vertically are connected to the output (encoder 3). In the interconnect layout shown in FIG. 33, since all of the interconnects are the same length and there is the dummy layer disposed on both sides of necessary interconnect, the capacity among the entirety of the interconnect, including the capacity between the interconnect and the substrate, as well as the capacity between interconnects, is equal. With using this kind of interconnect layout it is possible to equalize the load capacity of among all of the interconnect, and as a result, it is possible to reduce data-induced fluctuation in the electrical power consumption.

As described herein above, with the logic circuit according to the embodiments and modifications described herein, it is possible to realize a logic circuit able to make constant various electrical power consumption. Accordingly, it is possible to realize the making constant of the electrical power consumption of semiconductor devices that use the logic circuit according to the embodiments and modifications described herein.

Moreover, although the number of signal lines that become H has been described as one or two in the various embodiments described herein above, a number of signal lines may be three or more, as long as the hamming weight is constant.

Moreover, forming various kinds of circuits using the logic circuit of this kind will result in the disappearance of cases in which electrical power consumption rises sharply, and furthermore, will lead to reduction of electrical power consumption in semiconductor and other devices of application.

The present invention is not limited to the above described embodiments, and various modifications and changes are possible within a scope that does not depart from the gist of the present invention.

What is claimed is:

1. A logic circuit that executes a prescribed arithmetic operation and comprises:
    a decoder that converts one or more binary input data into a first plurality of bit data of a constant hamming weight regardless of a hamming weight of said input data;
    an interconnect network that is connected to said decoder, changes a bit pattern of said first plurality of bit data and generates a second plurality of bit data, by receiving said first plurality of bit data converted by said decoder, and substituting a bit position of received said first plurality of bit data for the purpose of said prescribed arithmetic operation; and
    an encoder connected to said interconnect network and converts said second plurality of bit data generated in said interconnect network into one or more binary output data.

2. The logic circuit according to claim 1, wherein said first plurality of bit data is a bit data in which said hamming weight is one or more;
    said prescribed arithmetic operation is bit inversion processing; and
    on a plurality of input terminals that is input with each of said first plurality of bit data, by forming an interconnect pattern between said plurality of input terminals and a plurality of output terminals, substitution of a bit position of said first plurality of bit data on said interconnect network is executed in such a manner that an alignment order of said first plurality of bit data comes to be reversed on said plurality of output terminals that output said second plurality of bit data.

3. The logic circuit according to claim 1, wherein said first plurality of bit data is a bit data in which said hamming weight is one or more;
    said prescribed arithmetic operation is exclusive disjunction processing; and
    said interconnect network comprises a plurality of selector circuits that change a state in which two signals, which are input to two input terminals in response to a control input that is input to a control input terminal, appear on two output terminals, substitution of a bit position of said first plurality of bit data is executed on said interconnect network by inputting output, of said plurality of selector circuits that have been input with said first plurality of bit data, into each control input terminal of said plurality of selector circuits, with an input data separate from said input data as said control input.

4. The logic circuit according to claim 1, wherein said first plurality of bit data is a bit data in which said hamming weight is one or more;
    said prescribed arithmetic operation is exclusive disjunction processing; and
    said decoder converts two input data into a first decode data and a second decode data, respectively, said interconnect network comprises a plurality of connection elements that change between states of connection and disconnection between two terminals each in response to a control input that is input to each control input terminal, and substitution of a bit position of said first plurality of bit data is executed in said interconnect network by inputting said first decode data to a terminal of one end of said plurality of connection elements, connecting a plurality of output terminals that each output said generated second bit data to a terminal of another end of said plurality of connection elements, and inputting said second decode data into each control input terminal of said plurality of connection elements as said control input.

5. The logic circuit according to claim 1, wherein said first plurality of bit data is a bit data in which said hamming weight is one or more;
    said prescribed arithmetic operation is addition processing without a carry; and
    decoder converts each of two input data into a first decode data and a second decode data, respectively, said interconnect network comprises a plurality of connection elements that change between states of connection and disconnection between two terminals each corresponding to a control input that is input to each control input terminal, substitution of a bit portion of said first plurality of bit data is executed in said interconnect network by inputting said first decode data to a terminal of one end of said plurality of connection elements, connecting a plurality of output terminals that each output said generated second bit data to a terminal of another end of said plurality of connection elements, and inputting said second decode data into each control input terminal of said plurality of connection elements as said control input.

6. The logic circuit according to claim 1, wherein said first plurality of bit data is a bit data in which said hamming weight is one or more;
    said prescribed arithmetic operation is addition processing with a carry; and
    said interconnect network comprises a plurality of selector circuits that output, to an output terminal, any one of two signals input to two input terminals in response to a control input that is input to a control input terminal, substitution of a bit position of said first plurality of bit data is executed in said interconnect network by inputting an input data separate from said input data to each control input terminal of said plurality of selector circuits as said control input, and changing output of said plurality of selector circuits input with said plurality of first bit data.

7. The logic circuit according to claim 1, wherein said first plurality of bit data is a bit data in which said hamming weight is one or more;
    said prescribed arithmetic operation is addition processing with a carry; and
    said decoder converts each of two input data into a first decode data and a second decode data, respectively, said interconnect network comprises a plurality of connection elements that change between states of connection and disconnection between two terminals each in response to a control input that is input to each control input terminal, substitution of a bit position of said first plurality of bit data is executed in said interconnect network by inputting said first decode data to a terminal of one end of said plurality of connection elements, connecting a plurality of output terminals that each output said generated second bit data to a terminal of another end of said plurality of connection elements, and inputting said second decode data into each control input terminal of said plurality of connection elements as said control input.

8. The logic circuit according to claim 1, wherein said first plurality of bit data is a bit data in which said hamming weight is one or more;
said prescribed arithmetic operation is addition processing with a carry; and
said interconnect network comprises a plurality of selector circuits that output, to an output terminal, any one of two signals input to two input terminals in response to a control input that is input to a control input terminal, substitution of a bit position of said first plurality of bit data is executed in said interconnect network according to inputting an input data separate from said input data and a carry input data to each control input terminal of said plurality of selector circuits as said control input, and changing output of said plurality of selector circuits input with said plurality of first bit data.

9. The logic circuit according to claim 1, wherein said first plurality of bit data is a bit data in which said hamming weight is one or more;
said prescribed arithmetic operation is addition processing with a carry; and
wherein said decoder converts two input data into a first decode data and a second decode data, respectively, said interconnect network comprises a plurality of connection elements that change between states of connection and disconnection between two terminals each in response to a control input that is input to a first control input terminal, and a plurality of selector circuits that output, to an output terminal, any one of two signals input to two input terminals in response to a control input that is input to a second control input terminal, substitution of said first plurality of bit data is executed in said interconnect network by inputting said first decode data and a carry input data to said plurality of selector circuits to generate a carry processing data and inputting said carry processing data to a terminal of one end of said plurality of connection elements, connecting a plurality of output terminals that each output said generated second bit data to a terminal of another end of said plurality of connection elements, and inputting said second decode data into each control input terminal of said plurality of connection elements as said control input.

10. The logic circuit according to claim 1, wherein said first plurality of bit data is a bit data in which said hamming weight is one or more;
said prescribed arithmetic operation is cycle shift processing; and
said interconnect network comprises a plurality of selector circuits that output, to an output terminal, any one of two signals input to two output terminals in response to a control input that is input to a control input terminal, substitution of a bit position of said first plurality of bit data is executed in said interconnect network by inputting a shift quantity data separate from said input data to each control input terminal of said plurality of selector circuits as said control input, and changing output of said plurality of selector circuits input with said plurality of first bit data.

11. The logic circuit according to claim 1, wherein said first plurality of bit data is a bit data in which said hamming weight is one or more;
said prescribed arithmetic operation is AND processing; and
said interconnect network comprises a plurality of data dependant switching circuits that decide two output signals to output to two output terminals based on a control input signal that is input to each of the control input terminals, and two input signals input to two input terminals, substitution of a bit position of said first plurality of bit data is executed in said interconnect network by inputting an input data separate from said input data to each control input terminal of said plurality of data dependant switching circuits as said control input signal, and changing output of said plurality of data dependant switching circuits input with said first plurality of bit data.

12. The logic circuit according to claim 1, wherein said first plurality of bit data is a bit data in which said hamming weight is one or more;
said prescribed arithmetic operation is AND processing; and
said decoder converts two input data into a first decode data and a second decode data, respectively, said interconnect network comprises a plurality of connection elements that change between states of connection and disconnection between two terminals each in response to a control input that is input to each control input terminal, substitution of bit position of said first plurality of bit data is executed in said interconnect network according to: inputting said first decode data to a terminal of one end of said plurality of connection elements, connecting a plurality of output terminals that each output said generated second bit data to a terminal of another end of said plurality of connection elements, and inputting said second decode data into each control input terminal of said plurality of connection elements as said control input.

13. The logic circuit according to claim 1, wherein said first plurality of bit data is a bit data in which said hamming weight is one or more;
said prescribed arithmetic operation is one of lower-order bit addition processing and higher-order bit addition processing; and
said interconnect network comprises a plurality of selector circuits that change a state in which two signals, which are input to two input terminals in response to a control input that is input to a control input terminal, appear on two output terminals, respectively, substitution of the bit position of said first plurality of bit data is executed in said interconnect network by inputting an input data separate from said input data to each control input terminal of said plurality of selector circuits as said control input, and changing output of said plurality of selector circuits input with said plurality of first bit data.

14. The logic circuit according to claim 1, wherein said first plurality of bit data is a bit data in which said hamming weight is one or more;
said prescribed arithmetic operation is one of lower-order bit erasure processing and higher-order bit erasure processing; and
said interconnect network comprises a plurality of OR circuits, and substitution of a bit position of said first plurality of bit data is executed in said interconnect network by inputting said first plurality of bit data to input terminals of said plurality of OR circuits, respectively.

15. The logic circuit according to claim 1, wherein said first plurality of bit data is a bit data in which said hamming weight is one or more;
said prescribed arithmetic operation is bit connection processing, and
said decoder converts two input data into a first decode data and a second decode data, respectively, said interconnect network comprises a plurality of AND circuits, substitution of the bit position of said first plurality of bit data is executed in said interconnect network by inputting said first decode data of and said second decode data to input terminals of said plurality of AND circuits, respectively.

16. The logic circuit according to claim 1, wherein said first plurality of bit data is a bit data in which said hamming weight is one or more;
said prescribed arithmetic operation is bit partition processing; and
said interconnect network comprises a plurality of OR circuits, and substitution of the bit position of said first plurality of bit data is executed in said interconnect network by inputting said first plurality of bit data to input terminals of said plurality of OR circuits, respectively.

17. The logic circuit according to claim 1, wherein said first plurality of bit data is a bit data in which said hamming weight is one or more;
said prescribed arithmetic operation is bit substitution processing; and
said decoder converts two input data into a first decode data and a second decode data, respectively, said interconnect network comprises a plurality of selector circuits that change a state in which two signals, which are input to two input terminals in response to a control input that is input to a control input terminal, appear on two output terminals, substitution of a bit position of said first plurality of bit data is executed in said interconnect network by inputting said first decode data and said second decode data to an input terminal of said plurality of selector circuits, and inputting data generated from said first decode data and said second decode data into each control input terminal of said plurality of selector circuits as said control input.

18. The logic circuit according to claim 1, wherein said first plurality of bit data is a bit data in which said hamming weight is one or more;
said prescribed arithmetic operation is bit substitution processing; and
said decoder converts two input data into a first decode data and a second decode data, respectively, said interconnect network comprises a plurality of selector circuits that change a state in which two signals, which are input to two input terminals according to a control input that is input to a control input terminal, appear on two output terminals, substitution of a bit position of said first plurality of bit data is executed on said interconnect network by inputting said first decode data and said second decode data into input terminals of said plurality of selector circuits and control input terminals of said plurality of selector circuits.

19. A logic circuit that executes a prescribed arithmetic operation and comprises:
a plurality of decoders that convert one or more binary input data into a first plurality of bit data of a constant hamming weight regardless of a hamming weight of said input data;
a plurality of interconnect networks that are connected to said plurality of decoders, substitutes a bit position of said first plurality of bit data for the purpose of said prescribed arithmetic operation and generate a second plurality of bit data, by receiving said first plurality of bit data converted by said connected decoder, and changing connection of a plurality of interconnect corresponding to each of received said first plurality of bit data; and a plurality of encoders that are connected to said plurality of interconnect networks, and convert said second plurality of bit data generated in said interconnect network into one or more binary output data.

20. A processor comprising a plurality of logic circuits that execute a prescribed arithmetic operation, said logic circuits comprising:
a plurality of decoders that convert one or more binary input data into a first plurality of bit data of a constant hamming weight regardless of a hamming weight of said input data;
a plurality of interconnect networks that are connected to said plurality of decoders, substitutes a bit position of said first plurality of bit data for the purpose of said prescribed arithmetic operation and generate a second plurality of bit data, by receiving said first plurality of bit data converted by said connected decoder, and changing connection of a plurality of interconnect corresponding to each of received said first plurality of bit data; and
a plurality of encoders that are connected to said plurality of interconnect networks, and convert said second plurality of bit data generated in said interconnect network into one or more binary output data.

* * * * *